United States Patent
Hagihara

(10) Patent No.: US 11,843,891 B2
(45) Date of Patent: Dec. 12, 2023

(54) AD CONVERSION DEVICE, IMAGING DEVICE, ENDOSCOPE SYSTEM, AND AD CONVERSION METHOD

(71) Applicant: OLYMPUS CORPORATION, Hachioji (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 478 days.

(21) Appl. No.: 17/189,697

(22) Filed: Mar. 2, 2021

(65) Prior Publication Data

US 2021/0211600 A1    Jul. 8, 2021

Related U.S. Application Data

(63) Continuation of application No. PCT/JP2018/046092, filed on Dec. 14, 2018.

(51) Int. Cl.
| | | |
|---|---|---|
| *H04N 25/772* | (2023.01) | |
| *H01L 27/146* | (2006.01) | |
| *H04N 25/75* | (2023.01) | |

(52) U.S. Cl.
CPC ..... *H04N 25/772* (2023.01); *H01L 27/14643* (2013.01); *H04N 25/75* (2023.01)

(58) Field of Classification Search
None
See application file for complete search history.

(56) References Cited

U.S. PATENT DOCUMENTS

2008/0239106 A1 * 10/2008 Sano ............... H04N 25/75
                                                        348/E5.079
2017/0244424 A1    8/2017 Liu

FOREIGN PATENT DOCUMENTS

| JP | 2013-150255 A | 8/2013 |
|---|---|---|
| JP | 2013-183290 A | 9/2013 |
| JP | 2014-120868 A | 6/2014 |
| JP | 2017-046318 A | 3/2017 |

(Continued)

OTHER PUBLICATIONS

Liu et al., "A 12 bit 100 MS/s SAR-Assisted Digital-Slope ADC" IEEE Journal of Solid-State Circuits, 2016, vol. 51, No. 12, pp. 2941-2950, cited in Specification and ISR (10 pages).

(Continued)

*Primary Examiner* — Mark T Monk
(74) *Attorney, Agent, or Firm* — WHDA, LLP

(57) ABSTRACT

An AD conversion device includes a comparison circuit, an upper-level DA conversion circuit, a level shift circuit, a lower-level DA conversion circuit, and a correction device. The comparison circuit includes a first terminal and a second terminal. The comparison circuit is configured to compare a first voltage level of a signal input to the first terminal with a second voltage level of a signal input to the second terminal. The upper-level DA conversion circuit includes a plurality of capacitance elements electrically connected to the second terminal. Capacitive values of the plurality of capacitance elements are weighted by binary numbers. The level shift circuit includes one or more capacitance elements electrically connected to the second terminal. The lower-level DA conversion circuit includes a plurality of capacitance elements electrically connected to the second terminal.

16 Claims, 18 Drawing Sheets

(56) References Cited

FOREIGN PATENT DOCUMENTS

WO  2017/169446 A1  10/2017
WO  2017/183117 A1  10/2017

OTHER PUBLICATIONS

International Search Report dated Mar. 19, 2019, issued in counterpart International Application No. PCT/JP2018/046092, w/English translation (2 pages).
Office Action dated Nov. 2, 2021, issued in counterpart JP Application No. 2020-559666, with English Translation. (14 pages).

* cited by examiner

AD CONVERSION DEVICE, IMAGING DEVICE, ENDOSCOPE SYSTEM, AND AD CONVERSION METHOD

The present application is a continuation application based on International Patent Application No. PCT/JP2018/046092 filed on Dec. 14, 2018, the content of which is incorporated herein by reference.

BACKGROUND OF THE INVENTION

Field of the Invention

The present invention relates to an analog-to-digital (AD) conversion device, an imaging device, an endoscope system, and an AD conversion method.

Description of Related Art

Physical-quantity detection semiconductor devices having sensors sensitive to externally input electromagnetic waves (light, radiation, etc.) are used in various fields. A physical quantity is converted into an electrical signal by a sensor. For example, a sensor in an imaging device is a pixel. Generally, electrical signals of a reference level and a signal level are read from the sensor. For example, the reference level in the imaging device is a reset level. Particularly, in the field of video devices, a charge-coupled device (CCD) type or metal-oxide-semiconductor (MOS) type imaging device for detecting light as a physical quantity is used. Light is an example of electromagnetic waves. A MOS type imaging device includes a (C)MOS type imaging device including pixels constituting an active pixel sensor (APS). A pixel constituting the APS amplifies a pixel signal in accordance with signal charge generated by a photoelectric conversion unit and outputs the amplified pixel signal.

In an endoscope system using an imaging device, it is important to reduce the size of the imaging device in order to reduce the size of a scope. Therefore, a CCD type imaging device has been generally used. However, since the output of the CCD type imaging device is analog, the length of the scope becomes long, so degradation of image quality due to superimposition of noise has been problematic. In recent years, in order to solve this problem, a digital-output CMOS type imaging device in which an AD conversion circuit is built has been used.

For example, in following Non-Patent literature 1, an AD conversion circuit that performs AD conversion by using two types of AD conversion methods is disclosed. The upper-level digital data are generated through successive approximation type AD conversion. The lower-level digital data are generated through AD conversion using a digital ramp signal.

Non-Patent literature 1: Chun-Cheng Liu, Mu-Chen Huang, Yu-Hsuan Tu, "A 12 bit 100 MS/s SAR-Assisted Digital-Slope ADC," IEEE Journal of Solid-State Circuits, pp. 2941-2950, Vol. 51, No. 12, December 2016.

SUMMARY OF THE INVENTION

According to a first aspect of the present invention, an AD conversion device is configured to generate digital data on the basis of a difference between a voltage level of a first signal and a voltage level of a second signal. The AD conversion device includes a comparison circuit, an upper-level DA conversion circuit, a level shift circuit, a lower-level DA conversion circuit, and a correction device. The comparison circuit includes a first terminal and a second terminal. The comparison circuit is configured to compare a first voltage level of a signal input to the first terminal with a second voltage level of a signal input to the second terminal. The upper-level DA conversion circuit includes a plurality of capacitance elements electrically connected to the second terminal. Capacitive values of the plurality of capacitance elements are weighted by binary numbers. The level shift circuit includes one or more capacitance elements electrically connected to the second terminal. The lower-level DA conversion circuit includes a plurality of capacitance elements electrically connected to the second terminal. The comparison circuit is configured to perform a successive approximation operation after the first signal is input to the first terminal and the second signal is held in the plurality of capacitance elements of the upper-level DA conversion circuit. The level shift circuit is configured to perform first level shift by shifting a voltage level of the second signal held in the plurality of capacitance elements of the upper-level DA conversion circuit to a first level after the successive approximation operation is performed. After the first level shift is performed, a signal having a voltage level that is based on a digital ramp signal is held in the plurality of capacitance elements of the upper-level DA conversion circuit and the plurality of capacitance elements of the lower-level DA conversion circuit. The comparison circuit is configured to perform a first comparison operation by comparing the first voltage level with the second voltage level. The level shift circuit is configured to perform second level shift by shifting a voltage level of a third signal held in the plurality of capacitance elements of the upper-level DA conversion circuit to a second level after the third signal is input to the first terminal and is held in the plurality of capacitance elements of the upper-level DA conversion circuit. After the second level shift is performed, a signal having a voltage level that is based on the digital ramp signal is held in the plurality of capacitance elements of the upper-level DA conversion circuit and the plurality of capacitance elements of the lower-level DA conversion circuit. The comparison circuit is configured to perform a second comparison operation by comparing the first voltage level with the second voltage level. The level shift circuit is configured to perform third level shift by shifting a voltage level of a signal held in the plurality of capacitance elements of the upper-level DA conversion circuit to a third level different from the second level after the second comparison operation is performed. After the third level shift is performed, a signal having a voltage level that is based on the digital ramp signal is held in the plurality of capacitance elements of the upper-level DA conversion circuit and the plurality of capacitance elements of the lower-level DA conversion circuit. The comparison circuit is configured to perform a third comparison operation by comparing the first voltage level with the second voltage level. The correction device is configured to correct first digital data generated through the first comparison operation on the basis of second digital data generated through the second comparison operation and third digital data generated through the third comparison operation.

According to a second aspect of the present invention, in the first aspect, the one or more capacitance elements of the level shift circuit may include a first capacitance element and a second capacitance element. The level shift circuit may be configured to perform the second level shift by changing a voltage level of the first capacitance element.

The level shift circuit may be configured to perform the third level shift by changing a voltage level of the second capacitance element.

According to a third aspect of the present invention, in the second aspect, upper-level data included in the digital data may be generated when the successive approximation operation is performed. The upper-level data may include data of multiple bits. Lower-level data included in the digital data may be generated when the first comparison operation is performed. The lower-level data may include data of multiple bits. A capacitance value of the second capacitance element may be almost the same as a capacitance value of the third capacitance element included in the plurality of capacitance elements of the upper-level DA conversion circuit. The third capacitance element may be used for generating data of the lowest-level bit of the upper-level data.

According to a fourth aspect of the present invention, in the second aspect, upper-level data included in the digital data may be generated when the successive approximation operation is performed. The upper-level data may include data of multiple bits. Lower-level data included in the digital data may be generated when the first comparison operation is performed. The lower-level data may include data of multiple bits. The second capacitance element may be a third capacitance element included in the plurality of capacitance elements of the upper-level DA conversion circuit. The third capacitance element may be used for generating data of the lowest-level bit of the upper-level data.

According to a fifth aspect of the present invention, in the second aspect, upper-level data included in the digital data may be generated when the successive approximation operation is performed. The upper-level data may include data of multiple bits. Lower-level data included in the digital data may be generated when the first comparison operation is performed. The lower-level data may include data of multiple bits. A capacitance value of the first capacitance element may be almost the same as a capacitance value of a fourth capacitance element included in the plurality of capacitance elements of the upper-level DA conversion circuit.

According to a sixth aspect of the present invention, in the second aspect, upper-level data included in the digital data may be generated when the successive approximation operation is performed. The upper-level data may include data of multiple bits. Lower-level data included in the digital data may be generated when the first comparison operation is performed. The lower-level data may include data of multiple bits. The first capacitance element may be a fourth capacitance element included in the plurality of capacitance elements of the upper-level DA conversion circuit.

According to a seventh aspect of the present invention, in any one of the first to sixth aspects, the second level may be the minimum value of a range in which the first level varies. The third level may be the maximum value of the range.

According to an eighth aspect of the present invention, in any one of the first to sixth aspects, the second level may be the maximum value of a range in which the first level varies. The third level may be the minimum value of the range.

According to a ninth aspect of the present invention, in any one of the first to eighth aspects, the level shift circuit may be configured to perform the second level shift and the third level shift without the successive approximation operation being performed after the third signal is input to the first terminal and is held in the plurality of capacitance elements of the upper-level DA conversion circuit.

According to a tenth aspect of the present invention, in any one of the first to ninth aspects, the correction device may be configured to correct the first digital data on the basis of a position of the first digital data in a range specified by the second digital data and the third digital data.

According to an eleventh aspect of the present invention, an imaging device includes the AD conversion device, an imaging unit, and a column circuit. The imaging unit includes a plurality of pixels disposed in a matrix shape. Each pixel included in the plurality of pixels is configured to output a first pixel signal having a reset level and a second pixel signal having a signal level. The column circuit is disposed so as to correspond to one or more columns in an array of the plurality of pixels and is electrically connected to the imaging unit. The column circuit is configured to generate the first signal that is based on the first pixel signal and generate the second signal that is based on the second pixel signal.

According to a twelfth aspect of the present invention, in the eleventh aspect, an imaging device includes the AD conversion device, an imaging unit, a column circuit, and a signal generation circuit. The imaging unit includes a plurality of pixels disposed in a matrix shape. Each pixel included in the plurality of pixels is configured to output a first pixel signal having a reset level and a second pixel signal having a signal level. The column circuit is disposed so as to correspond to one or more columns in an array of the plurality of pixels and is electrically connected to the imaging unit. The column circuit is configured to generate the second signal that is based on a difference between the reset level and the signal level. The signal generation circuit is configured to generate the first signal having a predetermined voltage level.

According to a thirteenth aspect of the present invention, in the eleventh or twelfth aspect, the level shift circuit may be configured to perform the second level shift in a blanking period that is different from a period in which the first pixel signal is output from the imaging unit and is different from a period in which the second pixel signal is output front the imaging unit. The comparison circuit may be configured to perform the second comparison operation in the blanking period. The level shift circuit may be configured to perform the third level shift in the blanking period. The comparison circuit may be configured to perform the third comparison operation in the blanking period.

According to a fourteenth aspect of the present invention, in any one of the eleventh to thirteenth aspects, an endoscope system includes the imaging device.

According to a fifteenth aspect of the present invention, an AD conversion method includes a first step, a second step, a third step, a fourth step, a fifth step, a sixth step, a seventh step, and an eighth step executed by an AD conversion device. The AD conversion device is configured to generate digital data on the basis of a difference between a voltage level of a first signal and a voltage level of a second signal. The AD conversion device includes a comparison circuit, an upper-level DA conversion circuit, a level shift circuit, a lower-level DA conversion circuit, and a correction device. The comparison circuit that includes a first terminal and a second terminal. The comparison circuit is configured to compare a first voltage level of a signal input to the first terminal with a second voltage level of a signal input to the second terminal. The upper-level DA conversion circuit includes a plurality of capacitance elements electrically connected to the second terminal. Capacitive values of the plurality of capacitance elements are weighted by binary numbers. The level shift circuit includes one or more capacitance elements electrically connected to the second terminal. The lower-level DA conversion circuit includes a plurality of capacitance elements electrically connected to the second terminal. The comparison circuit performs a successive approximation operation in the first step after the first signal is input to the first terminal and the second signal is held in the plurality of capacitance elements of the upper-level DA conversion circuit. The level shift circuit performs first level shift by shifting a voltage level of the second signal held in the plurality of capacitance elements of the upper-level DA conversion circuit to a first level in the second step after the successive approximation operation is performed. After the first level shift is performed, a signal having a voltage level that is based on a digital ramp signal is held in the plurality of capacitance elements of the upper-level DA conversion circuit and the plurality of capacitance elements of the lower-level DA conversion circuit. The comparison circuit performs a first comparison operation by comparing the first voltage level with the second voltage level in the third step. The level shift circuit performs second level shift by shifting a voltage level of a third signal held in the plurality of capacitance elements of the upper-level DA conversion circuit to a second level in the fourth step after the third signal is input to the first terminal and is held in the plurality of capacitance elements of the upper-level DA conversion circuit. After the second level shift is performed, a signal having a voltage level that is based on the digital ramp signal is held in the plurality of capacitance elements of the upper-level DA conversion circuit and the plurality of capacitance elements of the lower-level DA conversion circuit. The comparison circuit performs a second comparison operation by comparing the first voltage level with the second voltage level in the fifth step. The level shift circuit performs third level shift by shifting a voltage level of a signal held in the plurality of capacitance elements of the upper-level DA conversion circuit to a third level different from the second level in the sixth step after the second comparison operation is performed. After the third level shift is performed, a signal having a voltage level that is based on the digital ramp signal is held in the plurality of capacitance elements of the upper-level DA conversion circuit and the plurality of capacitance elements of the lower-level DA conversion circuit. The comparison circuit performs a third comparison operation by comparing the first voltage level with the second voltage level in the seventh step. The correction device corrects first digital data generated through the first comparison operation in the eighth step on the basis of second digital data generated through the second comparison operation and third digital data generated through the third comparison operation.

DETAILED DESCRIPTION OF THE INVENTION

Hereinafter, embodiments of the present invention will be described with reference to the drawings.

First Embodiment

Figure 1:
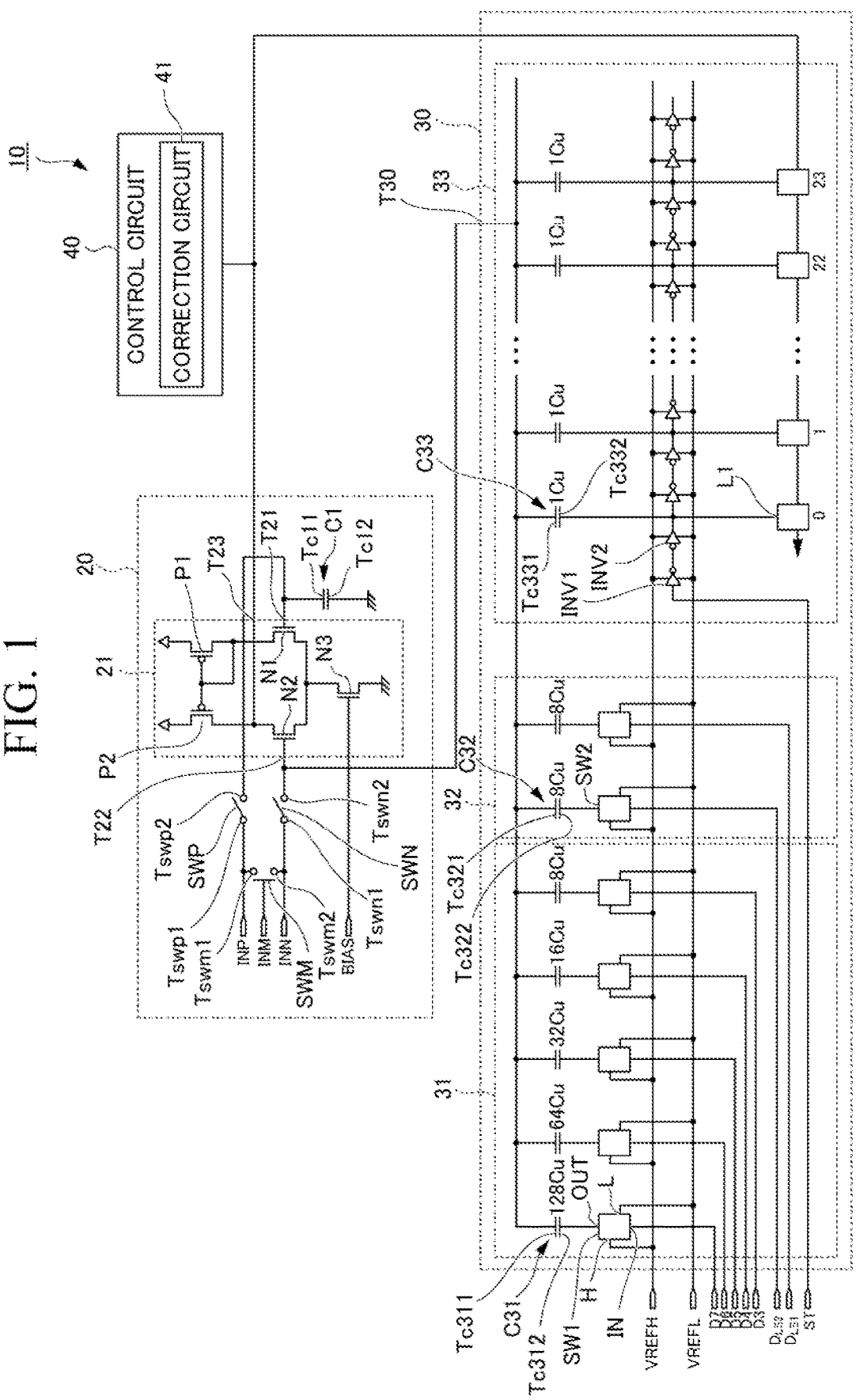
FIG. 1 is a circuit diagram showing a configuration of an AD conversion device according to a first embodiment of the present invention.

FIG. 1 shows a configuration of an AD conversion circuit 10 (AD conversion device) according to a first embodiment of the present invention. The AD conversion circuit 10 shown in FIG. 1 includes a comparison unit 20, a digital-to-analog (DA) conversion unit 30, and a control circuit 40. The comparison unit 20 includes a comparison circuit 21. The DA conversion unit 30 includes an upper-level DA conversion circuit 31, a level shift circuit 32, and a lower-level DA conversion circuit 33. The control circuit 40 includes a correction circuit 41 as a correction device that corrects first digital data described later.

A schematic configuration of the AD conversion circuit 10 will be described. The AD conversion circuit 10 generates digital data on the basis of the difference between a voltage level of a first signal INP and a voltage level of a second signal INN. The comparison circuit 21 includes a first terminal T21 and a second terminal 122. The comparison circuit 21 compares a first voltage level of a signal input to the first terminal T21 with a second voltage level of a signal input to the second terminal T22. The upper-level DA conversion circuit 31 includes a plurality of capacitance elements C31 electrically connected to the second terminal T22. The capacitive values of the plurality of capacitance elements C31 are weighted by binary numbers. The level shift circuit 32 includes one or more capacitance elements C32 electrically connected to the second terminal T22. The lower-level DA conversion circuit 33 includes a plurality of capacitance elements C33 electrically connected to the second terminal T22.

After the first signal INP is input to the first terminal T21 and the second signal INN is held in the plurality of capacitance elements C31 of the upper-level DA conversion circuit 31, the comparison circuit 21 performs a successive approximation operation. After the successive approximation operation is performed, the level shift circuit 32 performs first level shift by shifting the voltage level of the signal held in the plurality of capacitance elements C31 of the upper-level DA conversion circuit 31 to a first level. After the first level shift is performed, a signal having a voltage level that is based on a digital ramp signal is held in the plurality of capacitance elements C31 of the upper-level DA conversion circuit 31 and the plurality of capacitance elements C33 of the lower-level DA conversion circuit 33. After the first level shift is performed, the comparison circuit 21 performs a first comparison operation by comparing the first voltage level with the second voltage level.

After a third signal (first signal INP) is input to the first terminal T21 and is held in the plurality of capacitance elements C31 of the upper-level DA conversion circuit 31, the level shift circuit 32 performs second level shift by shifting the voltage level of the signal held in the plurality of capacitance elements C31 of the upper-level DA conversion circuit 31 to a second level. After the second level shift is performed, a signal having a voltage level that is based on the digital ramp signal is held in the plurality of capacitance elements C31 of the upper-level DA conversion circuit 31 and the plurality of capacitance elements C33 of the lower-level DA conversion circuit 33. After the second level shift is performed, the comparison circuit 21 performs a second comparison operation by comparing the first voltage level with the second voltage level. After the second comparison operation is performed, the level shift circuit 32 performs third level shift by shifting the voltage level of the signal held in the plurality of capacitance elements C31 of the upper-level DA conversion circuit 31 to a third level different from the second level. After the third level shift is performed, a signal having a voltage level that is based on the digital ramp signal is held in the plurality of capacitance elements C31 of the upper-level DA conversion circuit 31 and the plurality of capacitance elements C33 of the lower-level DA conversion circuit 33. After the third level shift is performed, the comparison circuit 21 performs a third comparison operation by comparing the first voltage level with the second voltage level. The correction circuit 41 corrects first digital data on the basis of second digital data and third digital data. The first digital data are generated through the first comparison operation. The second digital data are generated through the second comparison operation. The third digital data are generated through the third comparison operation.

AD conversion includes first AD conversion and second AD conversion. The AD conversion circuit 10 performs the first AD conversion in order to generate upper-level data included in the digital data. The first AD conversion includes a successive approximation operation. The AD conversion circuit 10 performs the second AD conversion in order to generate lower-level data included in the digital data. The lower-level data are one of the first digital data, the second digital data, and the third digital data. The second AD conversion includes any one of the first comparison operation, the second comparison operation, and the third comparison operation.

A detailed configuration of the AD conversion circuit 10 will be described. The comparison unit 20 shown in FIG. 1 includes the comparison circuit 21, a capacitance element C1, a switch SWP, a switch SWN, and a switch SWM.

The switch SWP includes a first terminal Tswp1 and a second terminal Tswp2. The first signal INP is input to the first terminal Tswp1. The second terminal Tswp2 is connected to the comparison circuit 21 and the capacitance element C1. The state of the switch SWP becomes anyone of an ON state and an OFF state. When the state of the switch SWP is the ON state, the first terminal Tswp1 and the second terminal Tswp2 are electrically connected to each other. At this time, the first signal INP is input to the capacitance element C1. When the state of the switch SWP is the OFF state, the first terminal Tswp1 and the second terminal Tswp2 are electrically insulated from each other. When the state of the switch SWP is the ON state, the switch SWP samples the voltage of the first signal INP. When the state of the switch SWP changes from the ON state to the OFF state, the voltage sampled by the switch SWP is held in the capacitance element C1.

The switch SWN includes a first terminal Tswn1 and a second terminal Tswn2. The second signal INN or the first signal INP is input to the first terminal Tswn1. The second terminal Tswn2 is connected to the comparison circuit 21 and the DA conversion unit 30. The state of the switch SWN becomes any one of an ON state and an OFF state. When the state of the switch SWN is the ON state, the first terminal Tswn1 and the second terminal Tswn2 are electrically connected to each other. At this time, the second signal INN or the first signal INP is input to the comparison circuit 21 and the DA conversion unit 30. When the state of the switch SWN is the OFF state, the first terminal Tswn1 and the second terminal Tswn2 are electrically insulated from each other. When the state of the switch SWN is the ON state, the switch SWN samples the voltage of the second signal INN or the voltage of the first signal INP. When the state of the switch SWN changes from the ON state to the OFF state, the voltage sampled by the switch SWN is held in a capacitance element of the DA conversion unit 30.

The switch SWM includes a first terminal Tswm1 and a second terminal Tswm2. The first terminal Tswm1 is connected to the first terminal Tswp1 of the switch SWP. The second terminal Tswm2 is connected to the first terminal Tswn1 of the switch SWN. The state of the switch SWM becomes any one of an ON state and an OFF state. When the state of the switch SWM is the ON state, the first terminal Tswm1 and the second terminal Tswm2 are electrically connected to each other. When the state of the switch SWM is the OFF state, the first terminal Tswm1 and the second terminal Tswm2 are electrically insulated from each other. When the state of each of the switch SWP, the switch SWN, and the switch SWM is the ON state, the voltage level of a signal input to the first terminal T21 of the comparison circuit 21 and the voltage level of a signal input to the second terminal T22 of the comparison circuit 21 are the same. For example, the first signal INP is input to the first terminal T21 of the comparison circuit 21 and the second terminal T22 of the comparison circuit 21. The state of the switch SWM is controlled on the basis of a signal INM.

The capacitance element C1 includes a first terminal Tc11 and a second terminal Tc12. The first terminal Tc11 is connected to the second terminal Tswp2 of the switch SWP and the comparison circuit 21. The second terminal Tc12 is connected to the ground. The voltage sampled by the switch SWP is input to the first terminal Tc11. The capacitance element C1 holds the voltage sampled by the switch SW P.

The comparison circuit 21 is constituted as a differential amplifier. The comparison circuit 21 includes a transistor N1, a transistor N2, a transistor N3, a transistor P1, and a transistor P2. The transistor N1, the transistor N2, and the transistor N3 are NMOS transistors. The transistor P1 and the transistor P2 are PMOS transistors. Each transistor shown in FIG. 1 includes a gate terminal, a source terminal, and a drain terminal. The comparison circuit 21 includes the first terminal T21, the second terminal T22, and a third terminal T23.

A power source voltage is input to the source terminal of each of the transistor P1 and the transistor P2. The gate terminal of the transistor P1 and the gate terminal of the transistor P2 are connected to each other.

The drain terminal of the transistor N1 is connected to the drain terminal of the transistor P1 and the gate terminal of the transistor P1. The gate terminal of the transistor N1 is the first terminal T21 of the comparison circuit 21. The gate terminal of the transistor N1 is connected to the second terminal Tswp2 of the switch SWP and the first terminal Tc11 of the capacitance element C1.

The drain terminal of the transistor N2 is connected to the drain terminal of the transistor P2 and the third terminal T23 of the comparison circuit 21. The gate terminal of the transistor N2 is the second terminal T22 of the comparison circuit 21. The gate terminal of the transistor N2 is connected to the second terminal Tswn2 of the switch SWN and the DA conversion unit 30.

The drain terminal of the transistor N3 is connected to the source terminal of the transistor N1 and the source terminal of the transistor N2. The source terminal of the transistor N3 is connected to the ground. A bias voltage BIAS for controlling a current value is input to the gate terminal of the transistor N3. The comparison circuit 21 is a time-sequential type comparator.

The comparison circuit 21 compares the voltage level of the first terminal T21 with the voltage level of the second terminal 122. The comparison circuit 21 outputs a signal that is based on the comparison result from the third terminal 123. When the voltage level of the first terminal T21 is greater than the voltage level of the second terminal T22, the comparison circuit 21 outputs a signal having one of a high level (H level) and a low level (L level). For example, the comparison circuit 21 outputs a signal having the high level. When the voltage level of the first terminal T21 is less than the voltage level of the second terminal T22, the comparison circuit 21 outputs a signal having the other of the high level and the low level from the third terminal T23. For example, the comparison circuit 21 outputs a signal having the low level.

The configuration of the comparison circuit 21 is not limited to that shown in FIG. 1. To simplify descriptions, the comparison circuit 21 shown in FIG. 1 is a single-end type comparator. The comparison circuit 21 may be a fully-differential type comparator.

The upper-level DA conversion circuit 31 includes the plurality of capacitance elements C31 and a plurality of switches SW1. In FIG. 1, the reference numeral of one capacitance element C31 and the reference numeral of one switch SW1 are representatively shown.

The capacitance element C31 includes a first terminal Tc311 and a second terminal Tc312. The first terminal Tc3/1 is atop plate and the second terminal Tc312 is a bottom plate. The first terminal Tc311 is connected to an output terminal T30 of the DA conversion unit 30. The second terminal Tc312 is connected to the switch SW1. The voltage sampled by the switch SWN is input to the first terminal Tc311. The capacitance element C31 holds the voltage sampled by the switch SWN. After the comparison circuit 21 performs the successive approximation operation for the first AD conversion, the capacitance element C31 holds the voltage of a residual signal.

In the example shown in FIG. 1, the upper-level DA conversion circuit 31 includes five capacitance elements C31. Each of the capacitance elements C31 has a capacitance value weighted by binary numbers. For example, the capacitance values of the five capacitance elements C31 are 128 Cu, 64 Cu, 32 Cu, 16 Cu, and 8 Cu. The capacitance value Cu indicates a unit capacitance value.

In the example shown in FIG. 1, the upper-level DA conversion circuit 31 includes five switches SW1. The switch SW1 includes an input terminal IN, an input terminal H, an input terminal L and an output terminal OUT. Any one of signals D7 to D3 is input to the input terminal IN of the switch SW1. The signals D7 to D3 correspond to the upper-level data of the digital data that are the AD conversion result. The voltage level of each of the signals D7 to D3 becomes any one of the high level and the low level. A reference voltage VREFH is input to the input terminal H of the switch SW1. A reference voltage VREFL is input to the input terminal L of the switch SW1. The reference voltage VREFH is higher than the reference voltage VREFL. The output terminal OUT of the switch SW1 is connected to the second terminal Tc312 of the capacitance element C31.

The state of the switch SW1 becomes any one of a first state and a second state. The state of the switch SW1 is controlled on the basis of the signal input to the input terminal IN. When the voltage level of the signal input to the input terminal IN is the high level, the state of the switch SW1 is the first state. When the voltage level of the signal input to the input terminal IN is the low level, the state of the switch SW1 is the second state. When the state of the switch SW1 is the first state, the switch SW1 outputs, from the output terminal OUT, the reference voltage VREFH input to the input terminal H. When the state of the switch SW1 is the second state, the switch SW1 outputs, from the output terminal OUT, the reference voltage VREFL input to the input terminal L.

The reference voltage VREFH or the reference voltage VREFL output from the switch SW1 is input to the second terminal Tc312 of the capacitance element C31. Before the comparison circuit 21 starts the successive approximation operation for the first AD conversion, the voltage level of the second terminal Tc312 of the capacitance element C31 is the reference voltage VREFL. When the voltage level of the second terminal Tc312 of the capacitance element C31 changes from the reference voltage VREFL to the reference voltage VREFH, the voltage level of the first terminal Tc311 of the capacitance element C31 increases.

When the voltage level of the second terminal Tc312 of the capacitance element C31 having the capacitance value 128 Cu changes from the reference voltage VREFL to the reference voltage VREFH, the voltage level of the first terminal Tc311 of the capacitance element C31 increases by "(VREFH−VREFL)×(128 Cu)/(total capacitance value)." In other words, the voltage level of the output terminal T30 of the DA conversion unit 30 increases by 128 Vcu. The voltage level Vcu is a unit voltage level. The voltage level Vcu is "(VREFH−VREFL)×Cu/(total capacitance value)." The total capacitance value is the sum of the capacitance values of a plurality of capacitance elements included in the DA conversion unit 30. When the voltage level of the second terminal Tc312 of the capacitance element C31 having the capacitance value 64 Cu changes from the reference voltage VREFL to the reference voltage VREFH, the voltage level of the first terminal Tc311 of the capacitance element C31 increases by "(VREFH−VREFL)×(64 Cu)/(total capacitance value)." In other words, the voltage level of the output terminal T30 of the DA conversion unit 30 increases by 64 Vcu. When the voltage level of the second terminal Tc312 of the capacitance element C31 having the capacitance value 32 Cu changes from the reference voltage VREFL to the reference voltage VREFH, the voltage level of the first terminal Tc311 of the capacitance element C31 increases by "(VREFH−VREFL)×(32 Cu)/(total capacitance value)." In other words, the voltage level of the output terminal T30 of the DA conversion unit 30 increases by 32 Vcu.

When the voltage level of the second terminal Tc312 of the capacitance element C31 having the capacitance value 16 Cu changes from the reference voltage VREFL to the reference voltage VREFH, the voltage level of the first terminal Tc311 of the capacitance element C31 increases by "(VREFH−VREFL)×(16 Cu)/(total capacitance value)." In other words, the voltage level of the output terminal T30 of the DA conversion unit 30 increases by 16 Vcu. When the voltage level of the second terminal Tc312 of the capacitance element C31 having the capacitance value 8 Cu changes from the reference voltage VREFL to the reference voltage VREFH, the voltage level of the first terminal Tc311 of the capacitance element C31 increases by "(VREFH−VREFL)×(8 Cu)/(total capacitance value)." in other words, the voltage level of the output terminal T30 of the DA conversion unit 30 increases by 8 Vcu.

The level shift circuit 32 includes one or more capacitance elements C32 and one or more switches SW2. In FIG. 1, the reference numeral of one capacitance element C32 and the reference numeral of one switch SW2 are representatively shown.

The capacitance element C32 includes a first terminal Tc321 and a second terminal Tc322. The first terminal Tc321 is a top plate and the second terminal Tc322 is a bottom plate. The first terminal Tc321 is connected to the output terminal T30 of the DA conversion unit 30. The second terminal Tc322 is connected to the switch SW2. After the comparison circuit 21 performs the successive approximation operation for the first AD conversion, the capacitance element C32 holds the voltage of a residual signal. When the first signal INP is input to the first terminal T21 of the comparison circuit 21 and the second terminal T22 of the comparison circuit 21, the first signal INP is input to the first terminal Tc321 and the capacitance element C32 holds the voltage of the first signal INP.

In the example shown in FIG. 1, the level shift circuit 32 includes two capacitance elements C32. For example, the capacitance value of the capacitance elements C32 is 8 Cu.

In the example shown in FIG. 1, the level shift circuit 32 includes two switches SW2. The configuration of the switch SW2 is similar to that of the switch SW1. Any one of a signal Di and a signal $D_{LS2}$ is input to the input terminal IN of the switch SW2. The voltage level of each of the signal $D_{LS1}$ and the signal $D_{LS2}$ becomes any one of the high level and the low level. The reference voltage VREFH is input to the input terminal H of the switch SW2. The reference voltage VREFL is input to the input terminal L of the switch SW2. The output terminal OUT of the switch SW2 is connected to the second terminal Tc322 of the capacitance element C32.

The state of the switch SW2 becomes any one of a first state and a second state. The state of the switch SW2 is controlled on the basis of the signal input to the input terminal IN. When the voltage level of the signal input to the input terminal IN is the high level, the state of the switch SW2 is the first state. When the voltage level of the signal input to the input terminal IN is the low level, the state of the switch SW2 is the second state. When the state of the switch SW2 is the first state, the switch SW2 outputs, from the output terminal OUT, the reference voltage VREFH input to the input terminal H. When the state of the switch SW2 is the second state, the switch SW2 outputs, from the output terminal OUT, the reference voltage VREFL input to the input terminal L.

The reference voltage VREFH or the reference voltage VREFL output front the switch SW2 is input to the second terminal Tc322 of the capacitance element C32. Before the level shift circuit 32 starts level shift, the voltage level of the second terminal Tc322 of the capacitance element C32 is the reference voltage VREFL. When the voltage level of the second terminal Tc322 of the capacitance element C32 changes from the reference voltage VREFL to the reference voltage VREFH, the voltage level of the first terminal Tc321 of the capacitance element C32 increases.

After the comparison circuit 21 performs the successive approximation operation for the first AD conversion, the level shift circuit 32 performs the first level shift. When the voltage level of the second terminals Tc322 of two capacitance elements C32 changes from the reference voltage VREFL to the reference voltage VREFH in the first level shift, the voltage level of the first terminals Tc321 of the two capacitance elements C32 increases by "(VREFH−VREFL)×(16 Cu)/(total capacitance value)." in other words, the voltage level of the output terminal T30 of the DA conversion unit 30 increases by 16 Vcu. The voltage level Vcu is a unit voltage level. The voltage level Vcu is "(VREFH−VREFL)×Cu/(total capacitance value)." The total capacitance value is the sum of the capacitance values of the plurality of capacitance elements included in the DA conversion unit 30.

After the first level shift is performed, the voltage level of the output terminal T30 of the DA conversion unit 30 is greater than the voltage level of the first signal INP. In other words, the voltage level of the second terminal T22 of the comparison circuit 21 is greater than the voltage level of the first terminal T21 of the comparison circuit 21. There is a possibility that noise is superimposed on each of the first signal INP held in the capacitance element C1 and the signal held in the plurality of capacitance elements of the DA conversion unit 30. By reducing the noise level, the voltage level of the output terminal T30 of the DA conversion unit 30 is greater than the voltage level of the first signal INP after the first level shift is performed.

After the first level shift is performed, the lower-level DA conversion circuit 33 generates a digital ramp signal. While the digital ramp signal is generated, the voltage level of the output terminal T30 of the DA conversion unit 30 gradually decreases. At this time, the comparison circuit 21 performs the first comparison operation. When the voltage level of the first terminal T21 of the comparison circuit 21 becomes approximately the same as the voltage level of the second terminal T22 of the comparison circuit 21, the voltage level of the signal output from the third terminal 123 of the comparison circuit 21 changes from the low level to the high level. By performing the first level shift, it is guaranteed that the comparison circuit 21 reliably performs the first comparison operation.

After the first signal INP is input to the first terminal T21 of the comparison circuit 21 and the second terminal T22 of the comparison circuit 21, the level shift circuit 32 performs the second level shift. When the voltage level of the second terminal Tc322 of one of the two capacitance elements C32 changes from the reference voltage VREFL to the reference voltage VREFH in the second level shift, the voltage level of the output terminal T30 of the DA conversion unit 30 increases by 8 Vcu. After the second level shift is performed, the lower-level DA conversion circuit 33 generates a digital ramp signal. The comparison circuit 21 performs the second comparison operation.

After the comparison circuit 21 performs the second comparison operation, the level shift circuit 32 performs the third level shift. When the voltage level of the second terminal Tc322 of the other of the two capacitance elements C32 changes from the reference voltage VREFL to the reference voltage VREFH in the third level shift, the voltage level of the output terminal T30 of the DA conversion unit 30 increases by 8 Vcu. After the third level shift is performed, the lower-level DA conversion circuit 33 generates a digital ramp signal. The comparison circuit 21 performs the third comparison operation.

The lower-level DA conversion circuit 33 includes the plurality of capacitance elements C33, a plurality of delay elements INV1, a plurality of delay elements INV2, and a plurality of latch circuits L. In FIG. 1, the reference numeral of one capacitance element C31, the reference numeral of one delay element INV1, the reference numeral of one delay element INV2, and the reference numeral of one latch circuit L1 are representatively shown.

The capacitance element C33 includes a first terminal Tc331 and a second terminal Tc332. The first terminal Tc331 is a top plate and the second terminal Tc332 is a bottom plate. The first terminal Tc331 is connected to the output terminal T30 of the DA conversion unit 30. The second terminal Tc332 is connected to the delay element INV1, the delay element INV2, and the latch circuit L1. The voltage sampled by the switch SWN is input to the first terminal Tc33. After the level shift circuit 32 performs the level shift, the capacitance element C33 holds the shifted voltage.

For example, the lower-level DA conversion circuit 33 includes more than sixteen capacitance elements C33. In the example shown in FIG. 1, the lower-level DA conversion circuit 33 includes twenty-four capacitance elements C33. For example, the capacitance value of the capacitance element C33 is 1 Cu. The capacitance values of the plurality of capacitance elements C33 are the same. The capacitance values of the plurality of capacitance elements C33 may be different from each other. The difference between the capacitance values of two capacitance elements C33 may be very small. For example, the absolute value of the difference may be less than 5% of the capacitance value of any one of the two capacitance elements C33. Alternatively, the absolute value of the difference may be less than 10% of the capacitance value of any one of the two capacitance elements C33.

The delay element INV1 and the delay element INV2 are inverters. Each of the delay element INV1 and the delay element INV2 includes an input terminal, an output terminal, and two voltage input terminals. The reference voltage VREFH is input to one of the two voltage input terminals and the reference voltage VREFL is input to the other of the two voltage input terminals. When the voltage level of the signal input to the input terminal is the high level or the reference voltage VREFH, the delay element INV1 and the delay element INV2 output the reference voltage VREFL from the output terminals. When the voltage level of the signal input to the input terminal is the low level or the reference voltage VREFL, the delay element INV1 and the delay element INV2 output the reference voltage VREFH from the output terminals.

The lower-level DA conversion circuit 33 includes a plurality of groups. Each group includes one delay element INV1 and one delay element INV2. A signal ST is input to the input terminal of the delay element INV1 included in the first group. The voltage level of the signal ST becomes any one of the high level and the low level.

The input terminal of the delay element INV2 included in the m-th group is connected to the output terminal of the delay element INV1 included in the n-th group. The number m is any one of one to twenty-five. The input terminal of the delay element INV1 included in the n-th group is connected to the output terminal of the delay element INV2 included in the (n−1)-th group. The number n is anyone of two to twenty-five. The delay element INV1 and the delay element INV2 are alternately connected to each other. The second terminal Tc332 of the capacitance element C33 is connected to the input terminal of the delay element INV1 included in the n-th group and the output terminal of the delay element INV2 included in the (n−1)-th group.

The plurality of delay elements INV1 and the plurality of delay elements INV2 form a ramp-signal generation circuit. When the voltage level of the signal ST is the high level, the delay element INV2 included in each group outputs a signal having the reference voltage VREFH. After the voltage level of the signal ST changes from the high level to the low level, the delay element INV2 included in the first group outputs a signal having the reference voltage VREFL. After the signal having the reference voltage VREFL is input to the delay element INV1 included in the second group, the delay element INV2 included in the second group outputs a signal having the reference voltage VREFL. The delay elements INV2 included in the third to twenty-fifth groups sequentially output a signal having the reference voltage VREFL.

The reference voltage VREFH or the reference voltage VREFL output from the delay element INV2 is input to the second terminal Tc332 of the capacitance element C33. Before the level shift circuit 32 completes the level shift, the voltage level of the second terminal Tc332 of the capacitance element C33 is the reference voltage VREFH.

After the level shift circuit 32 performs the level shift, the lower-level DA conversion circuit 33 starts generation of the digital ramp signal. After the voltage level of the signal ST changes from the high level to the low level, the plurality of delay elements INV2 sequentially output a signal having the reference voltage VREFL. The voltage level of the second terminal Tc332 of each of the plurality of capacitance elements C33 sequentially changes from the reference voltage VREFH to the reference voltage VREFL. When the voltage level of the second terminal Tc332 of the capacitance element C33 changes from the reference voltage VREFH to the reference voltage VREFL, the voltage level of the first terminal Tc331 of the capacitance element C33 decreases by "(VREFH−VREFL)×(1 Cu)/(total capacitance value)." In other words, the voltage level of the output terminal T30 of the DA conversion unit 30 decreases by 1 Vcu. The voltage level Vcu is a unit voltage level. The voltage level Vcu is "(VREFH−VREFL)×Cu/(total capacitance value)." The total capacitance value is the sum of the capacitance values of the plurality of capacitance elements included in the DA conversion unit 30.

Each time the voltage level of the second terminal Tc332 of the capacitance element C33 changes from the reference voltage VREFH to the reference voltage VREFL, the voltage level of the output terminal T30 of the DA conversion unit 30 decreases by 1 Vcu. The voltage level of the output terminal T30 of the DA conversion unit 30 decreases in a step shape as time passes. In this way, the digital ramp signal of which the voltage level decreases in a step shape is generated.

The latch circuit L1 includes a first input terminal and a second input terminal. The first input terminal of the latch circuit L1 is connected to the second terminal Tc332 of the capacitance element C33. The second input terminal of the latch circuit L1 is connected to the third terminal T23 of the comparison circuit 21. The signal output from the third terminal T23 of the comparison circuit 21 is input to each of the latch circuits L. When the voltage level of the signal input from the comparison circuit 21 to the latch circuits L1 changes front the low level to the high level, each of the latch circuits L1 holds a digital value corresponding to the voltage level of the second terminal Tc332 of each of the capacitance elements C33. The digital value held in the latch circuit L1 corresponds to the lower-level data of the digital data that are the AD conversion result.

The DA conversion unit 30 includes the output terminal T30. The output terminal T30 is electrically connected to the second terminal T22 of the comparison circuit 21. The first terminals of the capacitance elements included in each of the upper-level DA conversion circuit 31, the level shift circuit 32, and the lower-level DA conversion circuit 33 are electrically connected to each other and are electrically connected to the output terminal T30. The DA conversion unit 30 outputs the voltage of the capacitance elements included in each of the upper-level DA conversion circuit 31, the level shift circuit 32, and the lower-level DA conversion circuit 33 from the output terminal T30 to the second terminal T22 of the comparison circuit 21. The DA conversion unit 30 converts the signals D7 to D3, the signal $D_{LS1}$, and the signal $D_{LS2}$ into an analog voltage and outputs the analog voltage from the output terminal T30. The signals D7 to D3, the signal $D_{LS1}$, and the signal $D_{LS2}$ are digital signals. The DA conversion unit 30 outputs the digital ramp signal generated by the lower-level DA conversion circuit 33 from the output terminal 130.

The configuration of the DA conversion unit 30 is not limited to that shown in FIG. 1.

The control circuit 40 is connected to the third terminal T23 of the comparison circuit 21. The control circuit 40 controls the upper-level DA conversion circuit 31 by controlling the signals D7 to D3 on the basis of the signal indicating the comparison result. The control circuit 40 controls the level shift circuit 32 by controlling the signal $D_{LS1}$ and the signal $D_{LS2}$. After the level shift circuit 32 completes the level shift, the control circuit 40 controls the lower-level DA conversion circuit 33 by controlling the signal ST.

The digital value held in each of the plurality of latch circuits L1 of the lower-level DA conversion circuit 33 is output to the control circuit 40. The correction circuit 41 corrects the lower-level data including the digital value held in each of the plurality of latch circuits L1. In the example shown in FIG. 1, the control circuit 40 includes the correction circuit 41. The correction circuit 41 may be a circuit independent of the control circuit 40. The correction circuit 41 may be disposed outside the AD conversion circuit 10.

In addition, the correction device may be constituted by at least one of a processor and a logic circuit instead of the correction circuit 41 constituted by a circuit inside the control circuit 40. For example, the processor is at least one of a central processing unit (CPU), a digital signal processor (DSP), and a graphics-processing unit (GPU). For example, the logic circuit is at least one of an application-specific integrated circuit (ASIC) and a field-programmable gate array (FPGA). The correction device may include one or a plurality of processor. The correction device may include one or a plurality of logic circuits.

The correction device may read a program and execute the read program. The program includes commands defining the operations of the correction device. In other words, the functions of the correction device may be realized by software. The program, for example, may be provided by using a "computer-readable recording medium" such as a flash memory. The program may be transmitted from a computer storing the program to the AD conversion circuit 10 through a transmission medium or by using carrier waves in a transmission medium. The "transmission medium" transmitting a program is a medium that has a function of transmitting information. The medium that has the function of transmitting information includes a network (communication network) such as the Internet and a communication circuit line (communication line) such as a telephone circuit line. The program described above may realize at least some of the functions described above. Furthermore, the program described above may be a differential file (differential program). The combination of a program that has already been recorded in a computer and a differential program may realize the functions described above.

Figure 2:
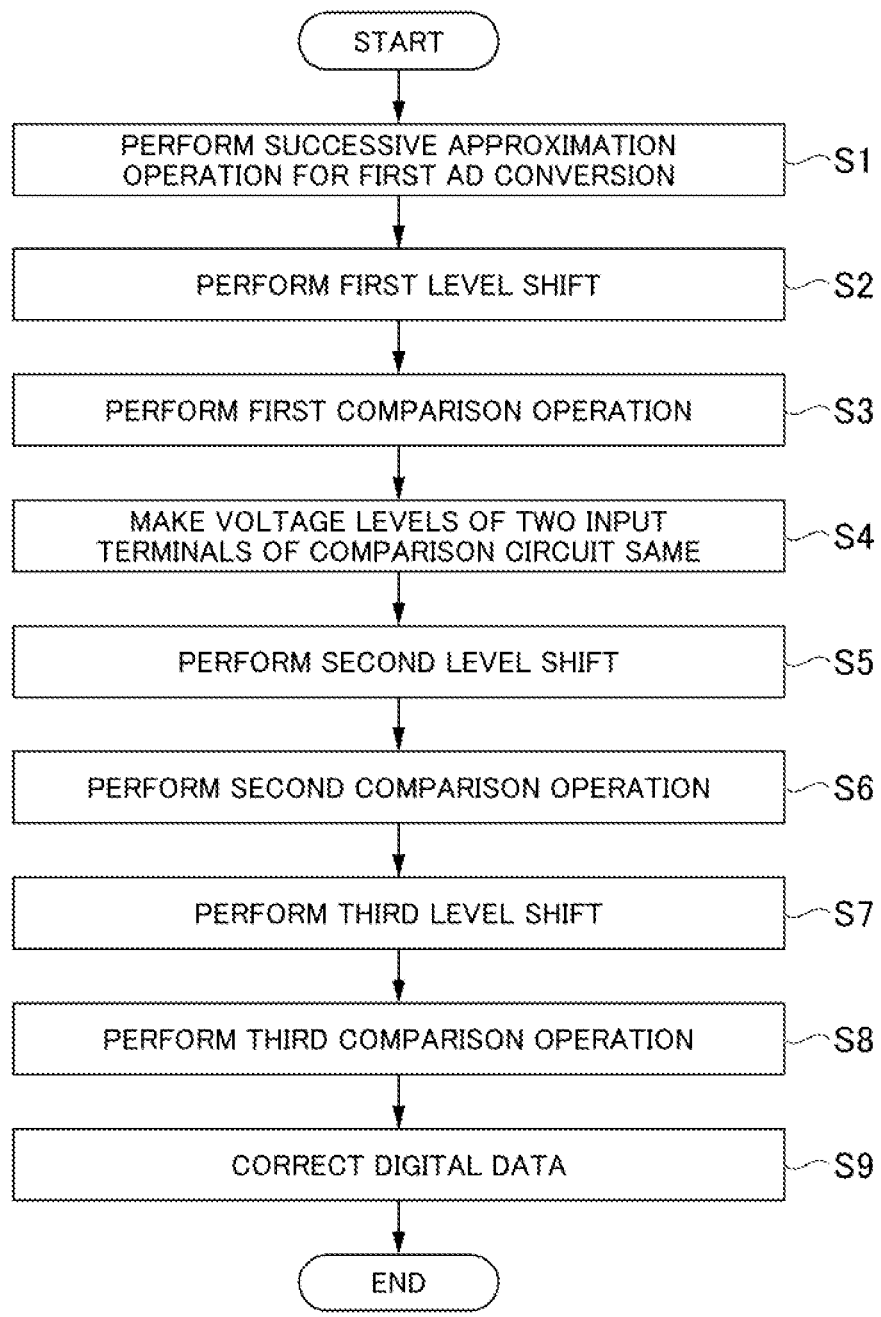
FIG. 2 is a flow chart showing a procedure of an operation of the AD conversion device according to the first embodiment of the present invention.

An operation of the AD conversion circuit 10 will be described. FIG. 2 shows a procedure of the operation of the AD conversion circuit 10. In the description of FIG. 2, FIGS. 3 to 5 are referred to appropriately.

To simplify descriptions, the case in which the voltage level of the first signal INP is greater than or equal to the voltage level of the second signal INN will be described. Before the AD conversion circuit 10 starts the AD conversion, the state of the AD conversion circuit 10 is as follows. The voltage level of each of the signals D7 to D3, the signal $D_{LS1}$, and the signal $D_{LS2}$ is the low level. The voltage level of the signal ST is the high level. In the upper-level DA conversion circuit 31, the voltage level of the second terminal Tc312 of each of the five capacitance elements C31 is the reference voltage VREFL. In the level shift circuit 32, the voltage level of the second terminal Tc322 of each of the two capacitance elements C32 is the reference voltage VREFL. In the lower-level DA conversion circuit 33, the voltage level of the second terminal Tc332 of each of the twenty-four capacitance elements C33 is the reference voltage VREFH. The state of each of the switch SWP the switch SWN, and the switch SWM is the OFF state.

After the state of the switch SWP becomes the ON state and the first signal INP is held in the capacitance element C1, the state of the switch SWP becomes the OFF state. After the state of the switch SWN becomes the ON state and the second signal INN is held in the plurality of capacitance elements of the DA conversion unit 30, the state of the switch SWN becomes the OFF state.

At this time, the first signal INP is input to the first terminal T21 of the comparison circuit 21 and the second signal INN is input to the second terminal T22 of the comparison circuit 21. The comparison circuit 21 performs the successive approximation operation for the first AD conversion (Step S1).

In the first AD conversion, the upper-level data included in the digital data indicating the difference between the first signal INP and the second signal INN are generated. In the successive approximation operation, the voltage level of the plurality of capacitance elements C31 included in the upper-level DA conversion circuit 31 changes and a digital value of the upper-level data is decided on for each bit on the basis of binary search.

Figure 3:
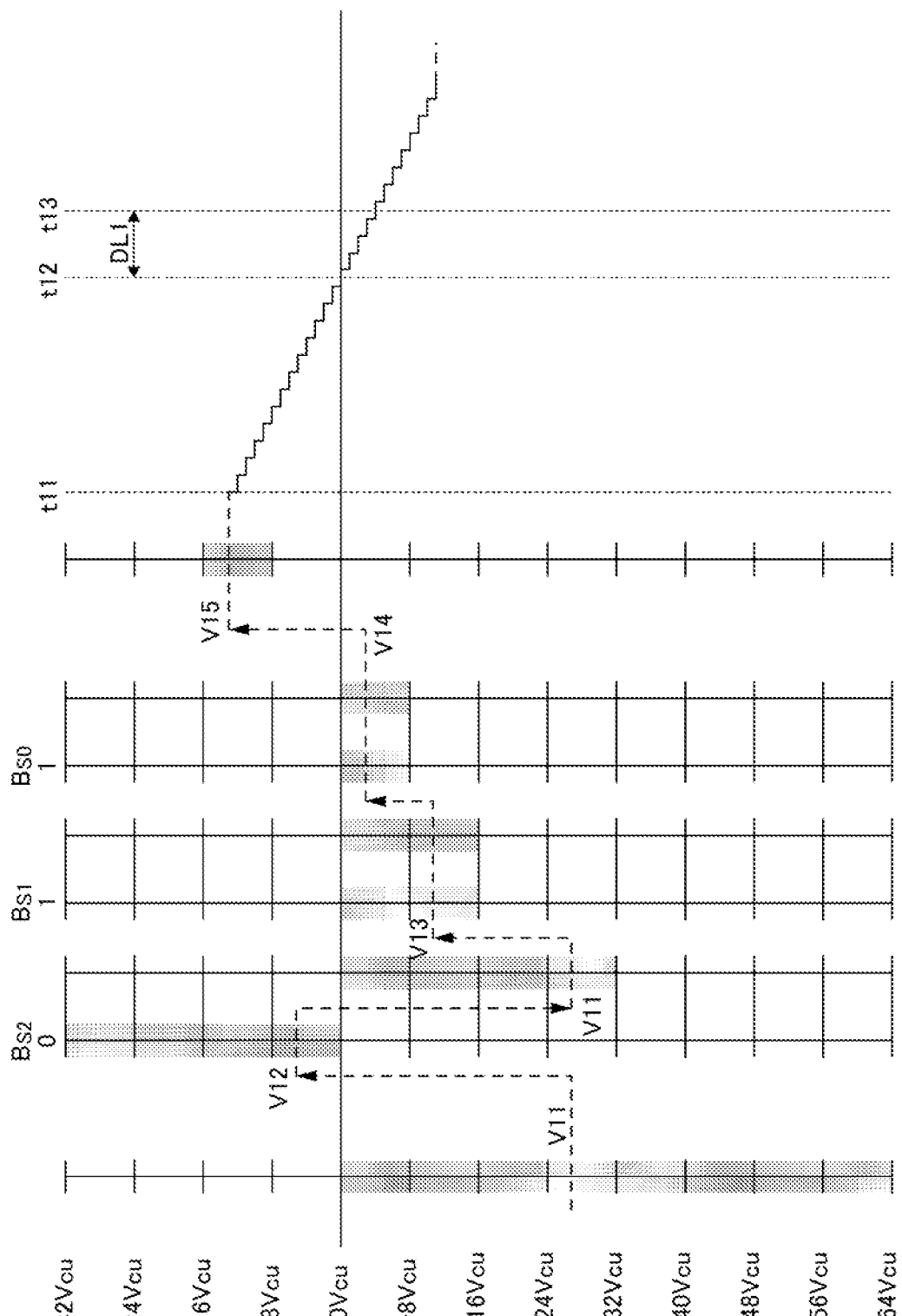
FIG. 3 is a timing chart showing an operation of the AD conversion device according to the first embodiment of the present invention.

The successive approximation operation will be described with reference to FIG. 3. FIG. 3 shows the change of the difference between the voltage level of the first terminal T21 of the comparison circuit 21 and the voltage level of the second terminal T22 of the comparison circuit 21. To simplify descriptions, three of the five capacitance elements C31 of the upper-level DA conversion circuit 31, on the lower-level side, are used and the upper-level data include digital values of three bits. The capacitance values of the three capacitance elements C31 are 32 Cu, 16 Cu, and 8 Cu.

In FIG. 3, the vertical direction indicates the difference (Vt2−Vt1) between the voltage level (Vt1) of the first terminal T21 and the voltage level (Vt2) of the second terminal T22. When the voltage level of the first signal INP is Vp and the voltage level of the second signal INN is Vn, there is a relationship indicated as "Vp≥Vn."

For example, when the first signal INP is input to the first terminal T21 and the second signal INN is input to the second terminal T22, the maximum value of the range in which the voltage level of the difference varies is 0 Vcu and the minimum value of the range in which the voltage level of the difference varies is −64 Vcu. When the voltage level of the first terminal T21 is greater than the voltage level of the second terminal T22, the voltage level of the difference has a negative value. When the voltage level of the first terminal T21 is less than the voltage level of the second terminal T22, the voltage level of the difference has a positive value.

When the second signal INN is held in the plurality of capacitance elements C31 of the upper-level DA conversion circuit 31, the voltage level of the second signal INN is output from the output terminal T30 of the DA conversion unit 30. The difference between the voltage level (Vp) of the first terminal T21 and the voltage level (Vn) of the second terminal T22 is V11. For example, the level V11 is −27 Vcu.

The control circuit 40 changes the voltage level of the signal D5 from the low level to the high level. At this time, in the upper-level DA conversion circuit 31, the voltage level of the first terminal Tc311 of the capacitance element C31 having the capacitance value of 32 Cu increases by 32 Vcu. In other words, the voltage level of the output terminal T30 of the DA conversion unit 30 and the voltage level of the difference increase by 32 Vcu. The voltage level of the difference becomes V12. The level V12 is 5 Vcu.

The comparison circuit 21 compares the voltage level of the first terminal T21 with the voltage level of the second terminal T22. The voltage level of the first terminal T21 is less than the voltage level of the second terminal T22. The comparison circuit 21 outputs a signal indicating the comparison result. The control circuit 40 decides on the value of the uppermost-level bit ($B_{S2}$) of the upper-level data as 0 on the basis of the signal. The control circuit 40 restores the voltage level of the signal D5 to the low level. At this time, in the upper-level DA conversion circuit 31, the voltage level of the first terminal Tc311 of the capacitance element C31 having the capacitance value of 32 Cu decreases by 32 Vcu. In other words, the voltage level of the output terminal T30 of the DA conversion unit 30 and the voltage level of the difference decrease by 32 Vcu. The voltage level of the difference becomes V11.

The control circuit 40 changes the voltage level of the signal D4 from the low level to the high level. At this time, in the upper-level DA conversion circuit 31, the voltage level of the first terminal Tc311 of the capacitance element C31 having the capacitance value of 16 Cu increases by 16 Vcu. In other words, the voltage level of the output terminal T30 of the DA conversion unit 30 and the voltage level of the difference increase by 16 Vcu. The voltage level of the difference becomes V13. The level V13 is −11 Vcu.

The comparison circuit 21 compares the voltage level of the first terminal T21 with the voltage level of the second terminal T22. The voltage level of the first terminal T21 is greater than the voltage level of the second terminal T22. The comparison circuit 21 outputs a signal indicating the comparison result. The control circuit 40 decides on the value of the second bit ($B_{S1}$) of the upper-level data as 1 on the basis of the signal.

The control circuit 40 changes the voltage level of the signal D3 from the low level to the high level. At this time, in the upper-level DA conversion circuit 31, the voltage level of the first terminal Tc311 of the capacitance element C31 having the capacitance value of 8 Cu increases by 8 Vcu. In other words, the voltage level of the output terminal T30 of the DA conversion unit 30 and the voltage level of the difference increase by 8 Vcu. The voltage level of the difference becomes V14. The level V14 is −3 Vcu.

The comparison circuit 21 compares the voltage level of the first terminal T21 with the voltage level of the second terminal T22. The voltage level of the first terminal T21 is greater than the voltage level of the second terminal T22. The comparison circuit 21 outputs a signal indicating the comparison result. The control circuit 40 decides on the value of the third bit ($B_{S0}$) of the upper-level data as 1 on the basis of the signal. The third bit of the upper-level data is the lowest-level bit of the upper-level data. The control circuit 40 holds the generated upper-level data.

After Step S1, the level shift circuit 32 performs the first level shift by shifting the voltage level of the signal held in the plurality of capacitance elements C31 of the upper-level DA conversion circuit 31 to a first level (Step S2).

Specifically, the control circuit 40 changes the voltage level of each of the signal $D_{LS1}$ and the signal $D_{LS2}$ from the low level to the high level. At this time, in the level shift circuit 32, the voltage level of the first terminal Tc321 of each of the two capacitance elements C32 having the capacitance value of 8 Cu increases by 16 Vcu. In other words, the voltage level of the output terminal T30 of the DA conversion unit 30 and the voltage level of the difference increase by 16 Vcu. The voltage level of the difference becomes V15 shown in FIG. 3. The level V15 is 13 Vcu.

After Step S2, the signal having the voltage level that is based on the digital ramp signal for the second AD conversion is held in the plurality of capacitance elements C31 of the upper-level DA conversion circuit 31 and the plurality of capacitance elements C33 of the lower-level DA conversion circuit 33. The comparison circuit 21 performs the first comparison operation by comparing the voltage level of the first terminal T21 with the voltage level of the second terminal T22 (Step S3).

In the second AD conversion, the lower-level data included in the digital data indicating the difference between the first signal INP and the second signal INN are generated. When the first AD conversion is completed, the residual signal is held in the plurality of capacitance elements C31 of the upper-level DA conversion circuit 31. In the second AD conversion, the lower-level data are generated on the basis of the difference between the first signal INP and the residual signal.

Specifically, the control circuit 40 changes the voltage level of the signal ST from the high level to the low level. The plurality of delay elements INV2 of the lower-level DA conversion circuit 33 sequentially output the signal having the reference voltage VREFL. The voltage level of the first terminal Tc331 of each of the plurality of capacitance elements C33 decreases by "(VREFH−VREFL)×(1 Cu)/(total capacitance value)." In other words, the voltage level of the output terminal T30 of the DA conversion unit 30 decreases in a step shape by 1 Vcu. The voltage level Vcu is a unit voltage level. The voltage level Vcu is "(VREFH−VREFL)×Cu/(total capacitance value)." The total capacitance value is the sum of the capacitance values of the plurality of capacitance elements included in the DA conversion unit 30. The difference between the voltage level of the first terminal T21 and the voltage level of the second terminal T22 decreases in a step shape by 1 Vcu from V15 shown in FIG. 3. This operation is started from a timing t11 shown in FIG. 3.

The comparison circuit 21 compares the voltage level of the first terminal T21 with the voltage level of the second terminal T22 and outputs a signal indicating the comparison result. When the first comparison operation is started, the voltage level of the first terminal T21 is less than the voltage level of the second terminal T22. At this time, the comparison circuit 21 outputs a signal having the low level. In a timing t12, the voltage level of the first terminal T21 and the voltage level of the second terminal T22 become almost the same. At this time, the comparison circuit 21 outputs a signal having the high level.

The signal indicating the comparison result is input to the plurality of latch circuits L1 of the lower-level DA conversion circuit 33. When the voltage level of the signal indicating the comparison result changes, each of the latch circuits L1 holds a digital value corresponding to the voltage level of the second terminal Tc332 of each of the capacitance elements C33. Since the latency occurs on the basis of the circuit delay or the like, each of the latch circuits L1 holds the digital value at a timing t13 after the timing t12. The digital value held in each of the latch circuits L corresponds to the lower-level data. The lower-level data includes an error that is based on a delay DL1 from the timing t12 to the timing t13. Each of the latch circuits L1 outputs the digital value to the control circuit 40. The control circuit 40 holds first lower-level data (first digital data) including the digital value of each of the latch circuits L1.

After Step S3, in Steps S4 to S8, a digital value for correcting the first lower-level data is generated. Details of each of Steps S4 to S8 will be described.

After Step S3, the control circuit 40 changes the voltage level of each of the signals D7 to D3, the signal $D_{LS1}$, and the signal $D_{LS2}$ to the low level and changes the voltage level of the signal ST to the high level. After the state of the switch SWM becomes the ON state and the first signal INP is held in the plurality of capacitance elements of the DA conversion unit 30, the state of the switch SWM becomes the OFF state. At this time, the first signal INP is input to each of the first terminal T21 of the comparison circuit 21 and the second terminal 122 of the comparison circuit 21. Therefore, the voltage level of the first terminal T21 and the voltage level of the second terminal T22 become the same (Step S4).

In the above-described example, the first signal INP is input to each of the first terminal T21 and the second terminal T22 as a third signal. The third signal is not limited to the first signal INP. Two signals having the same voltage level need to be input to the respective first terminal T21 and second terminal T22 in Step S4.

After Step S4, the level shift circuit 32 performs the second level shift by shifting the voltage level of the signal held in the plurality of capacitance elements C31 of the upper-level DA conversion circuit 31 to a second level (Step S5). For example, the second level is different from the first level. The second level may be the same as the first level.

Specifically, the control circuit 40 changes the voltage level of the signal D), from the low level to the high level. At this time, in the level shift circuit 32, the voltage level of the first terminal Tc321 of the capacitance element C32 having the capacitance value of 8 Cu increases by 8 Vcu. In other words, the voltage level of the output terminal T30 of the DA conversion unit 30 and the voltage level of the difference increase by 8 Vcu.

Figure 4:
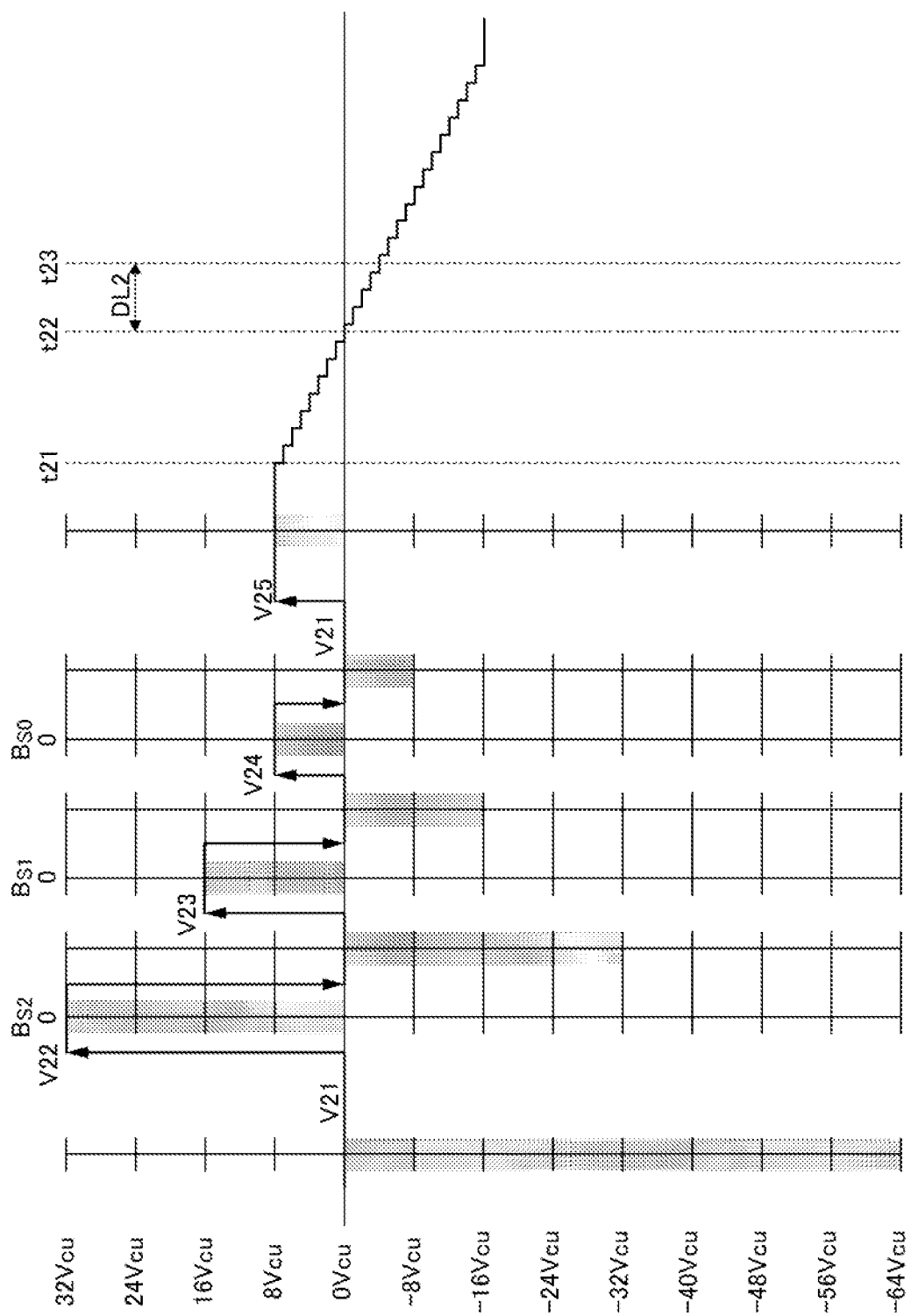
FIG. 4 is a timing chart showing an operation of the AD conversion device according to the first embodiment of the present invention.

The first AD conversion including the successive approximation operation does not need to be performed between Step S4 and Step S5. The reason for that will be described with reference to FIG. 4. FIG. 4 shows the change of the difference between the voltage level of the first terminal T21 of the comparison circuit 21 and the voltage level of the second terminal 122 of the comparison circuit 21. In FIG. 4, the vertical direction indicates the difference between the voltage level of the first terminal T21 and the voltage level of the second terminal T22 as with FIG. 3.

When the first signal INP is input to each of the first terminal T21 and the second terminal T22, the difference between the voltage level of the first terminal T21 and the voltage level of the second terminal T22 is V21. The level V21 is 0 Vcu.

In FIG. 4, the change of the voltage level of the difference is shown when it is assumed that the first AD conversion including the successive approximation operation is performed. The change of the difference when it is assumed that the first AD conversion is virtually performed will be described.

The control circuit 40 changes the voltage level of the signal D5 from the low level to the high level. At this time, in the upper-level DA conversion circuit 31, the voltage level of the first terminal Tc311 of the capacitance element C31 having the capacitance value 32 Cu increases by 32 Vcu. In other words, the voltage level of the output terminal T30 of the DA conversion unit 30 and the voltage level of the difference increase by 32 Vcu. The voltage level of the difference becomes V22. The level V22 is 32 Vcu.

The comparison circuit 21 compares the voltage level of the first terminal T21 with the voltage level of the second terminal T22. The voltage level of the first terminal T21 is less than the voltage level of the second terminal T22. The comparison circuit 21 outputs a signal indicating the comparison result. The control circuit 40 decides on the value of the uppermost-level bit ($B_{S2}$) of the upper-level data as 0 on the basis of the signal. The control circuit 40 restores the voltage level of the signal D5 to the low level. At this time, in the upper-level DA conversion circuit 31, the voltage level of the first terminal Tc311 of the capacitance element C31 having the capacitance value of 32 Cu decreases by 32 Vcu. In other words, the voltage level of the output terminal T30 of the DA conversion unit 30 and the voltage level of the difference decrease by 32 Vcu. The voltage level of the difference becomes V21.

The control circuit 40 changes the voltage level of the signal D4 from the low level to the high level. At this time, in the upper-level DA conversion circuit 31, the voltage level of the first terminal Tc311 of the capacitance element C31 having the capacitance value of 16 Cu increases by 16 Vcu. In other words, the voltage level of the output terminal T30 of the DA conversion unit 30 and the voltage level of the difference increase by 16 Vcu. The voltage level of the difference becomes V23. The level V23 is 16 Vcu.

The comparison circuit 21 compares the voltage level of the first terminal T21 with the voltage level of the second terminal T22. The voltage level of the first terminal T21 is less than the voltage level of the second terminal T22. The comparison circuit 21 outputs a signal indicating the comparison result. The control circuit 40 decides on the value of the second bit ($B_{S1}$) of the upper-level data as 0 on the basis of the signal. The control circuit 40 restores the voltage level of the signal D3 to the low level. At this time, in the upper-level DA conversion circuit 31, the voltage level of the first terminal Tc311 of the capacitance element C31 having the capacitance value of 16 Cu decreases by 16 Vcu. In other words, the voltage level of the output terminal T30 of the DA conversion unit 30 and the voltage level of the difference decrease by 16 Vcu. The voltage level of the difference becomes V21.

The control circuit 40 changes the voltage level of the signal D3 from the low level to the high level. At this time, in the upper-level DA conversion circuit 31, the voltage level of the first terminal Tc311 of the capacitance element C31 having the capacitance value of 8 Cu increases by 8 Vcu. In other words, the voltage level of the output terminal T30 of the DA conversion unit 30 and the voltage level of the difference increase by 8 Vcu. The voltage level of the difference becomes V24. The level V24 is 8 Vcu.

The comparison circuit 21 compares the voltage level of the first terminal T21 with the voltage level of the second terminal T22. The voltage level of the first terminal T21 is less than the voltage level of the second terminal T22. The comparison circuit 21 outputs a signal indicating the comparison result. The control circuit 40 decides on the value of the third bit ($B_{S0}$) of the upper-level data as 0 on the basis of the signal. The third bit of the upper-level data is the lowest-level bit of the upper-level data. The control circuit 40 restores the voltage level of the signal D3 to the low level. At this time, in the upper-level DA conversion circuit 31, the voltage level of the first terminal Tc311 of the capacitance element C31 having the capacitance value of 8 Cu decreases by 8 Vcu. In other words, the voltage level of the output terminal T30 of the DA conversion unit 30 and the voltage level of the difference decrease by 8 Vcu. The voltage level of the difference becomes V21. This voltage level is the same as the voltage level of the difference before the first AD conversion is performed.

There is a possibility that noise is superimposed on each of the first signal INP held in the capacitance element C1 and the first signal INP held in the plurality of capacitance elements C31 of the upper-level DA conversion circuit 31. The voltage level of the difference may change from V21 on the basis of the noise. Even when the voltage level of the difference changes, the amount of the change becomes small by reducing the noise level. Therefore, the voltage level of the difference does not change regardless of execution of the first AD conversion. Since the voltage level of the difference does not change, the first AD conversion does not need to be performed.

When the second level shift in Step S5 is performed, the voltage level of the difference becomes V25 shown in FIG. 4. The level V25 is 8 Vcu.

After Step S5, the signal having the voltage level that is based on the digital ramp signal for the second AD conversion is held in the plurality of capacitance elements C31 of the upper-level DA conversion circuit 31 and the plurality of capacitance elements C33 of the lower-level DA conversion circuit 33. The comparison circuit 21 performs the second comparison operation by comparing the voltage level of the first terminal T21 with the voltage level of the second terminal T22 (Step S6).

The second comparison operation is similar to the first comparison operation in Step S3. Therefore, the second comparison operation will not be described in detail. The voltage level of the difference starts to decrease in a step shape from a timing t21 shown in FIG. 4.

When the second comparison operation is started, the voltage level of the first terminal T21 is less than the voltage level of the second terminal T22. At this time, the comparison circuit 21 outputs a signal having the low level. In a timing t22, the voltage level of the first terminal T21 and the voltage level of the second terminal T22 become almost the same. At this time, the comparison circuit 21 outputs a signal having the high level.

The signal indicating the comparison result is input to the plurality of latch circuits L1 of the lower-level DA conversion circuit 33. When the voltage level of the signal indicating the comparison result changes, each of the latch circuits L1 holds a digital value corresponding to the voltage level of the second terminal Tc332 of each of the capacitance elements C33. Since the latency occurs on the basis of the circuit delay or the like, each of the latch circuits L1 holds the digital value at a timing t23 after the timing t22. The digital value held in each of the latch circuits L1 corresponds to the lower-level data. The lower-level data includes an error that is based on a delay DL2 from the timing t22 to the timing t23. Each of the latch circuits L1 outputs the digital value to the control circuit 40. The control circuit 40 holds second lower-level data (second digital data) including the digital value of each of the latch circuits L1.

After Step S6, the control circuit 40 changes the voltage level of the signal ST to the low level. The voltage level of the output terminal T30 of the DA conversion unit 30 and the voltage level of the difference become the voltage before the second comparison operation is performed. The voltage level of the difference becomes V25. Thereafter, the level shift circuit 32 performs the third level shift by shifting the voltage level of the signal held in the plurality of capacitance elements C31 of the upper-level DA conversion circuit 31 to a third level different front the second level (Step S7).

Specifically, the control circuit 40 changes the voltage level of the signal $D_{LS2}$ from the low level to the high level. At this time, in the level shift circuit 32, the voltage level of the first terminal Tc321 of the capacitance element C32 having the capacitance value of 8 Cu increases by 8 Vcu. In other words, the voltage level of the output terminal T30 of the DA conversion unit 30 and the voltage level of the difference increase by 8 Vcu.

The first AD conversion including the successive approximation operation does not need to be performed between Step S6 and Step S7.

Figure 5:
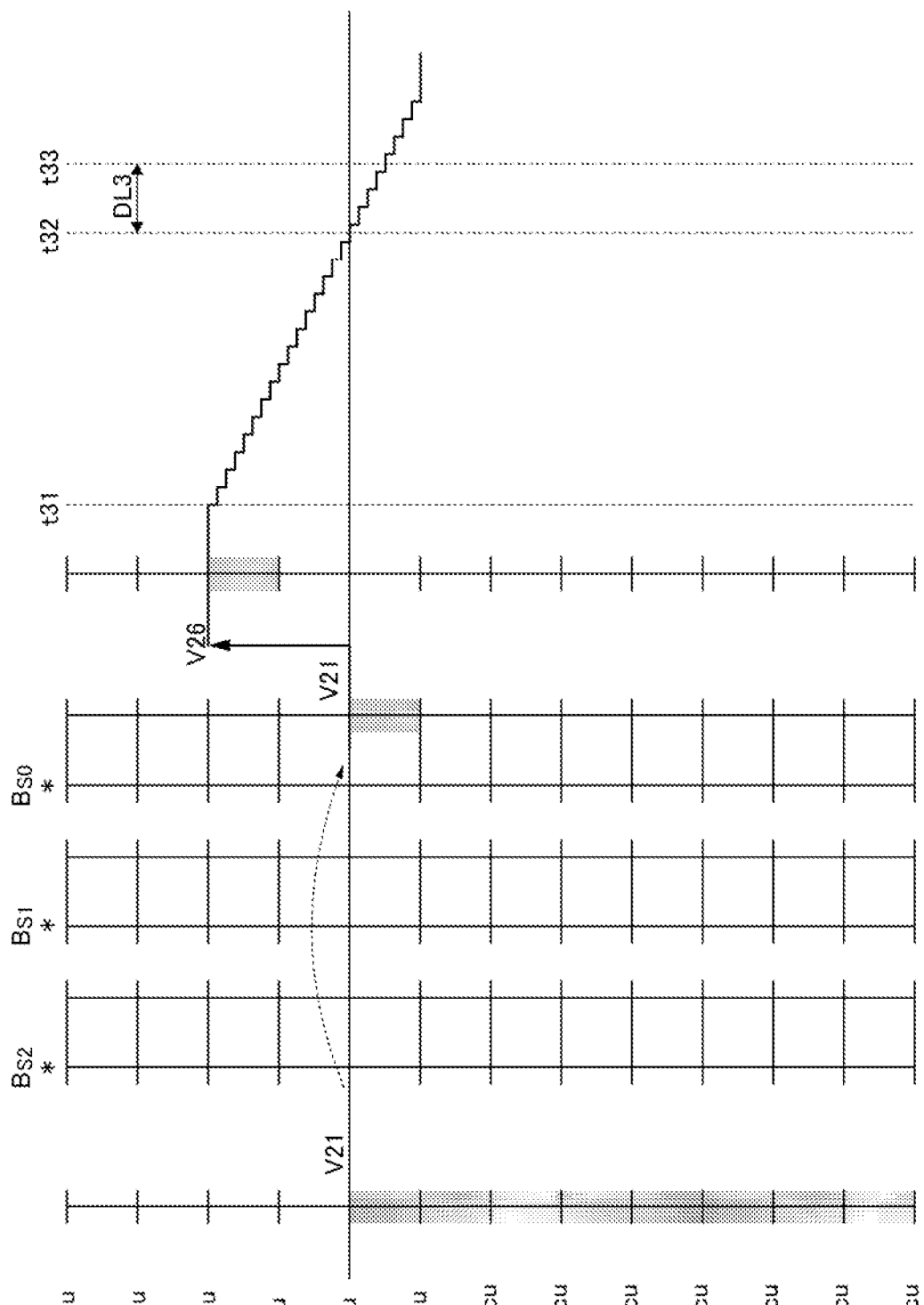
FIG. 5 is a timing chart showing an operation of the AD conversion device according to the first embodiment of the present invention.

FIG. 5 shows the change of the difference between the voltage level of the first terminal T21 of the comparison circuit 21 and the voltage level of the second terminal T22 of the comparison circuit 21. In FIG. 5, the vertical direction indicates the difference between the voltage level of the first terminal T21 and the voltage level of the second terminal T22 as with FIG. 3.

When the first signal INP is input to each of the first terminal T21 and the second terminal T22, the difference between the voltage level of the first terminal T21 and the voltage level of the second terminal T22 is V21. The level V21 is 0 Vcu. Since the first AD conversion is unnecessary, the change of the level related to the first AD conversion is not shown in FIG. 5. When the second level shift in Step S5 and the third level shift in Step S7 are performed, the voltage level of the difference becomes V26. The level V26 is 16 Vcu.

After Step S7, the signal having the voltage level that is based on the digital ramp signal for the second AD conversion is held in the plurality of capacitance elements C31 of the upper-level DA conversion circuit 31 and the plurality of capacitance elements C33 of the lower-level DA conversion circuit 33. The comparison circuit 21 performs the third comparison operation by comparing the voltage level of the first terminal T21 with the voltage level of the second terminal T22 (Step S8).

The third comparison operation is similar to the first comparison operation in Step S3. Therefore, the third comparison operation will not be described in detail. The voltage level of the difference starts to decrease in a step shape from a timing t31 shown in FIG. 5.

When the third comparison operation is started, the voltage level of the first terminal T21 is less than the voltage level of the second terminal T22. At this time, the comparison circuit 21 outputs a signal having the low level. In a timing t32, the voltage level of the first terminal T21 and the voltage level of the second terminal T22 become almost the same. At this time, the comparison circuit 21 outputs a signal having the high level.

The signal indicating the comparison result is input to the plurality of latch circuits L1 of the lower-level DA conversion circuit 33. When the voltage level of the signal indicating the comparison result changes, each of the latch circuits L1 holds a digital value corresponding to the voltage level of the second terminal Tc332 of each of the capacitance elements C33. Since the latency occurs on the basis of the circuit delay or the like, each of the latch circuits L1 holds the digital value at a timing t33 after the timing t32. The digital value held in each of the latch circuits L1 corresponds to the lower-level data. The lower-level data includes an error that is based on a delay DL3 from the timing t32 to the timing t33. Each of the latch circuits L1 outputs the digital value to the control circuit 40. The control circuit 40 holds third lower-level data (third digital data) including the digital value of each of the latch circuits L1.

In the above-described example, the third signal (first signal INP) is input to the first terminal T21 of the comparison circuit 21 and is held in the plurality of capacitance elements C31 of the upper-level DA conversion circuit 31. Thereafter, the level shift circuit 32 performs the second level shift and the third level shift without the successive approximation operation being performed.

The plurality of capacitance elements C32 of the level shift circuit 32 include a first capacitance element and a second capacitance element. In the above-described example, the capacitance value of each of the first capacitance element and the second capacitance element is 8 Cu. The level shift circuit 32 performs the first level shift by changing the voltage level of the first capacitance element and the voltage level of the second capacitance element in Step S2. The level shift circuit 32 performs the second level shift by changing the voltage level of the first capacitance element in Step S5. The level shift circuit 32 performs the third level shift by changing the voltage level of the second capacitance element in Step S7.

When the successive approximation operation is performed in Step S1, the upper-level data included in the digital data are generated. The upper-level data include data of multiple bits. When the first comparison operation is performed in Step S3, the lower-level data included in the digital data are generated. The lower-level data include data of multiple bits. In the above-described example, the capacitance value of the second capacitance element is almost the same as the capacitance value of the third capacitance element included in the plurality of capacitance elements C31 of the upper-level DA conversion circuit 31. The third capacitance element is used for generating data of the lowest-level bit of the upper-level data. In the above-described example, the third capacitance element is the capacitance element C31 having the capacitance value of 8 Cu.

The capacitance value of the second capacitance element and the capacitance value of the third capacitance element may be different from each other. The difference between the capacitance value of the second capacitance element and the capacitance value of the third capacitance element may be very small. For example, the absolute value of the difference may be less than 5% of the capacitance value of the second capacitance element or the third capacitance element. Alternatively, the absolute value of the difference may be less than 10% of the capacitance value of the second capacitance element or the third capacitance element.

In the above-described example, the capacitance value of the first capacitance element is almost the same as the capacitance value of the fourth capacitance element included in the plurality of capacitance elements C31 of the upper-level DA conversion circuit 31. The fourth capacitance element is used for generating data of the lowest-level bit of the upper-level data. In the above-described example, the fourth capacitance element is the capacitance element C31 having the capacitance value of 8 Cu.

The capacitance value of the first capacitance element and the capacitance value of the fourth capacitance element may be different from each other. The difference between the capacitance value of the first capacitance element and the capacitance value of the fourth capacitance element may be very small. For example, the absolute value of the difference may be less than 5% of the capacitance value of the first capacitance element or the fourth capacitance element. Alternatively, the absolute value of the difference may be less than 10% of the capacitance value of the first capacitance element or the fourth capacitance element.

After Step S8, the correction circuit 41 corrects the first lower-level data on the basis of the second lower-level data and the third lower-level data (Step S9).

The procedure of the operation of the AD conversion circuit 10 is not limited to the example shown in FIG. 2. For example, the processing in Steps S4 to S8 may be executed before the processing in Steps S1 to S3 is executed. The processing in Steps S4 to S8 may be executed immediately after the AD conversion circuit 10 is activated. The processing in Steps S4 to S8 may be executed on a regular basis in accordance with a change in environment. For example, a change in environment is a change in time or a change in temperature. The processing in Steps S4 to S8 is executed at a timing close to the timing at which the processing in Steps S1 to S3 is executed.

In a case in which the AD conversion circuit 10 is included in an imaging device, the processing in Steps S4 to S8 may be executed in a blanking period (vertical blanking period). For example, the level shift circuit 32 performs the second level shift in the blanking period. The blanking period is different from the period in which a first pixel signal is output from an imaging unit and is different from the period in which a second pixel signal is output from the imaging unit. The first pixel signal has a reset level. The second pixel signal has a signal level. The comparison circuit 21 performs the second comparison operation in the blanking period. The level shift circuit 32 performs the third level shift in the blanking period. The comparison circuit 21 performs the third comparison operation in the blanking period.

The influence of the latency will be described. After the first comparison operation is started, the voltage level of the difference starts to decrease in a step shape from the timing t11 shown in FIG. 3. At the timing t12, the comparison circuit 21 outputs a signal of the high level. When it is assumed that there is no latency, each of the latch circuits L1 holds a digital value at the timing t12. From the timing t11 to the timing t12, in thirteen delay elements INV2, the voltage level of the output signal changes from the reference voltage VREFH to the reference voltage VREFL. In other words, the voltage level of the second terminals Tc332 of thirteen capacitance elements C33 included in the lower-level DA conversion circuit 33 changes. On the basis of the change, the voltage level of the output terminal T30 of the DA conversion unit 30 and the voltage level of the difference decrease by 13 Vcu.

The latency exists even in circuits operating at high speed. Therefore, each of the latch circuits L1, in fact, holds the digital value at the timing t13. From the timing t11 to the timing t13, in seventeen delay elements INV2 the voltage level of the output signal changes from the reference voltage VREFH to the reference voltage VREFL. In other words, the voltage level of the second terminals Tc332 of seventeen capacitance elements C33 included in the lower-level DA conversion circuit 33 changes. On the basis of the change, the voltage level of the output terminal T30 of the DA conversion unit 30 and the voltage level of the difference decrease by 17 Vcu.

Due to the influence of the latency, each of the latch circuits L1 holds the digital value at the timing t13 instead of the timing t12. Accordingly, the latency corresponding to the delay DL1 in four delay elements INV1 and four delay elements INV2 exists.

After the second comparison operation is started, the voltage level of the difference starts to decrease in a step shape from the timing t21 shown in FIG. 4. At the timing t22, the comparison circuit 21 outputs a signal of the high level. When it is assumed that there is no latency, each of the latch circuits L1 holds a digital value at the timing t22. From the timing t21 to the timing t22, in eight delay elements INV2, the voltage level of the output signal changes from the reference voltage VREFH to the reference voltage VREFL. In other words, the voltage level of the second terminals Tc332 of eight capacitance elements C33 included in the lower-level DA conversion circuit 33 changes. On the basis of the change, the voltage level of the output terminal T30 of the DA conversion unit 30 and the voltage level of the difference decrease by 8 Vcu.

Each of the latch circuits L, in fact, holds the digital value at the timing t23. From the timing t21 to the timing t23, in twelve delay elements INV2, the voltage level of the output signal changes from the reference voltage VREFH to the reference voltage VREFL. In other words, the voltage level of the second terminals Tc332 of twelve capacitance elements C33 included in the lower-level DA conversion circuit 33 changes. On the basis of the change, the voltage level of the output terminal T30 of the DA conversion unit 30 and the voltage level of the difference decrease by 12 Vcu.

Due to the influence of the latency, each of the latch circuits L1 holds the digital value at the timing t23 instead of the timing t22. Accordingly, the latency corresponding to the delay DL2 in four delay elements INV1 and four delay elements INV2 exists. When the timing at which the first comparison operation is performed and the timing at which the second comparison operation is performed are close to each other, the delay DL1 and the delay DL2 are almost the same.

After the third comparison operation is started, the voltage level of the difference starts to decrease in a step shape from the timing t31 shown in FIG. 5. At the timing t32, the comparison circuit 21 outputs a signal of the high level. When it is assumed that there is no latency, each of the latch circuits L1 holds a digital value at the timing t32. From the timing t31 to the timing t32, in sixteen delay elements INV2, the voltage level of the output signal changes from the reference voltage VREFH to the reference voltage VREFL. In other words, the voltage level of the second terminals Tc332 of sixteen capacitance elements C33 included in the lower-level DA conversion circuit 33 changes. On the basis of the change, the voltage level of the output terminal T30 of the DA conversion unit 30 and the voltage level of the difference decrease by 16 Vcu.

Each of the latch circuits L1, in fact, holds the digital value at the timing t33. From the timing t3l to the timing t33, in twenty delay elements INV2, the voltage level of the output signal changes from the reference voltage VREFH to the reference voltage VREFL. In other words, the voltage level of the second terminals Tc332 of twenty capacitance elements C33 included in the lower-level DA conversion circuit 33 changes. On the basis of the change, the voltage level of the output terminal T30 of the DA conversion unit 30 and the voltage level of the difference decrease by 20 Vcu.

Due to the influence of the latency, each of the latch circuits L1 holds the digital value at the tinting 33 instead of the timing t32. Accordingly, the latency corresponding to the delay DL3 in four delay elements INV1 and four delay elements INV2 exists. When the timing at which the first comparison operation is performed and the timing at which the third comparison operation is performed are close to each other, the delay DL1 and the delay DL3 are almost the same.

In the above-described example, the digital value of 12 is obtained through the second AD conversion including the second comparison operation. In the above-described example, the digital value of 20 is obtained through the second AD conversion including the third comparison operation.

Figure 6:
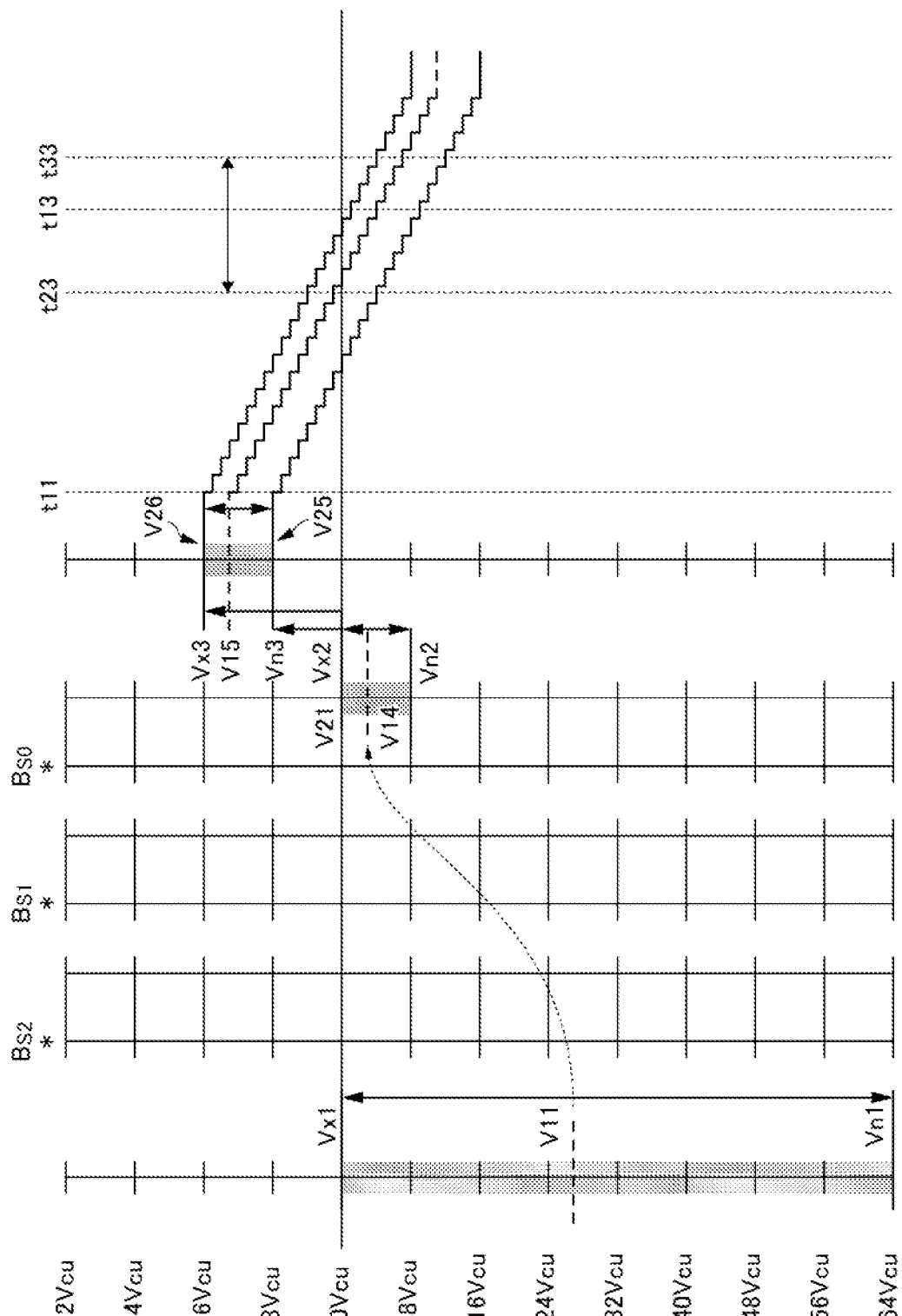
FIG. 6 is a timing chart showing an operation of the AD conversion device according to the first embodiment of the present invention.

Details of the processing in Step S9 will be described. FIG. 6 shows the state integrating the change of levels shown in FIGS. 3 to 5. When the second signal INN is held in the plurality of capacitance elements C3 of the upper-level DA conversion circuit 31, the difference between the voltage level of the first terminal T21 of the comparison circuit 21 and the voltage level of the second terminal T22 of the comparison circuit 21 is V11. For example, the maximum value of the range in which the voltage level of the difference varies is Vx1 and the minimum value of the range in which the voltage level of the difference varies is Vn1. The level Vx1 is 0 Vcu and the level Vn1 is −64 Vcu.

When the first AD conversion that is based on the level V11 is completed, the voltage level of the difference is V14. When it is assumed that the first AD conversion that is based on the level Vx1 is completed, the voltage level of the difference is Vx2. The level Vx2 is 0 Vcu. When it is assumed that the first AD conversion that is based on the level Vn1 is completed, the voltage level of the difference is Vn2. The level Vn2 is −8 Vcu. When the first AD conversion is completed, the voltage level of the difference is greater than or equal to Vn2 and less than or equal to Vx2.

When the first level shift that is based on the level V14 is performed, the voltage level of the difference becomes V15. When it is assumed that the first level shift that is based on the level Vx2 is performed, the voltage level of the difference becomes Vx3. The level Vx3 is 16 Vcu. When it is assumed that the first level shift that is based on the level Vn2 is performed, the voltage level of the difference becomes Vn3. The level Vn3 is 8 Vcu. When the first level shift is performed, the voltage level of the difference is greater than or equal to Vn3 and less than or equal to Vx3.

The level Vn3 is obtained when the first A) conversion, which is based on the level Vn1, and the first level shift, which is based on the level Vn2, are performed. The level Vn3 is the same as the level V25 obtained when the second level shift is performed. In fact, the first AD conversion, which is based on the level Vn1, and the first level shift, which is based on the level Vn2, are not performed. When the first signal INP is input to each of the first terminal T21 and the second terminal T22, the difference between the voltage level of the first terminal T21 and the voltage level of the second terminal 122 is V21. The level V21 is 0 Vcu. The AD conversion circuit 10 can obtain the level V25 corresponding to the level Vn3 by performing the second level shift that is based on the level V21.

The level Vx3 is obtained when the first AD conversion, which is based on the level Vx1, and the first level shift, which is based on the level Vx2, are performed. The level Vx3 is the same as the level V26 obtained when the second level shift and the third level shift are performed. In fact, the first AD conversion, which is based on the level Vx1, and the first level shift, which is based on the level Vx2, are not performed. The AD conversion circuit 10 can obtain the level V26 corresponding to the level Vx3 by performing the second level shift, which is based on the level V21, and the third level shift.

The level shift circuit 32 shifts the voltage level of the signal held in the plurality of capacitance elements C31 of the upper-level DA conversion circuit 31 to the first level in Step S2. In the above-described example, when the first level shift is performed, the voltage level of the difference is shifted from the level V14 to the level V15. The level shift circuit 32 shifts the voltage level of the signal held in the plurality of capacitance elements C31 of the upper-level DA conversion circuit 31 to the second level in Step S5. The second level is the minimum value of the range in which the first level varies. In the above-described example, when the second level shift is performed, the voltage level of the difference is shifted from the level V21 to the level Vn3. The range in which the voltage level of the difference varies is from the level Vn3 to the level Vx3. The level Vn3 is the minimum value of the range and the level Vx3 is the maximum value of the range. The level shift circuit 32 shifts the voltage level of the signal held in the plurality of capacitance elements C31 of the upper-level DA conversion circuit 31 to the third level in Step S7. The third level is the maximum value of the range in which the first level varies. In the above-described example, when the second level shift and the third level shift are performed, the voltage level of the difference is shifted from the level V21 to the level Vx3.

When the voltage level of the difference is V15, the first comparison operation is started. The voltage level of the difference starts to decrease in a step shape from the timing t11. Each of the latch circuits L1 holds a digital value at the timing t13. When the voltage level of the difference is V25 (Vn3), the second comparison operation is started. The voltage level of the difference starts to decrease in a step shape from the timing t11. The timing t11 is the same as the timing t21 shown in FIG. 4. Each of the latch circuits L1 holds a digital value at the timing t23. When the voltage level of the difference is V26 (Vx3) the third comparison operation is started. The voltage level of the difference starts to decrease in a step shape from the timing t11. The timing t11 is the same as the timing t31 shown in FIG. 5. Each of the latch circuits L holds a digital value at the timing t33.

In the example shown in FIG. 4 and FIG. 6, the digital value of 12 is obtained through the second AD conversion including the second comparison operation. This digital value is the same as the lower-level data of the digital data corresponding to the level Vn1. In the example shown in FIG. 5 and FIG. 6, the digital value of 20 is obtained through the second AD conversion including the third comparison operation. This digital value is the same as the lower-level data of the digital data corresponding to the level Vx1.

When the level V11 is an arbitrary level greater than or equal to the level Vn1 and less than or equal to the level Vx1, the digital value obtained through the second AD conversion including the first comparison operation is any one of 12 to 20. In other words, the digital value is any one of nine values. The correction circuit 41 corrects the digital value to a value of four bits by converting the digital value into any one of 0 to 8.

When it is assumed that the capacitance value of each of the plurality of capacitance elements C33 included in the lower-level DA conversion circuit 33 is 0.8 Cu, the following digital value is obtained through the second AD conversion.

When the capacitance value of the capacitance element C33 is 1 Cu, the voltage level of the digital ramp signal changes by 1 Vcu for each step. When the capacitance value of the capacitance element C33 is 0.8 Cu, the voltage level of the digital ramp signal changes by 0.8 Vcu for each step. In other words, the amount of change for each step is (4/5) times as great as the amount when the capacitance value of the capacitance element C33 is 1 Cu. The digital value obtained through the second AD conversion becomes (4/5) times as great as the digital value when the capacitance value of the capacitance element C33 is 1 Cu. The latency becomes (4/5) times as great as the latency when the capacitance value of the capacitance element C33 is 1 Cu.

When the capacitance value of the capacitance element C33 is 1 Cu, the digital value of 12 is obtained through the second AD conversion including the second comparison operation in the above-described example. When the capacitance value of the capacitance element C33 is 0.8 Cu, the digital value of 15 is obtained through the second AD conversion including the second comparison operation. When the capacitance value of the capacitance element C33 is 1 Cu, the latency corresponds to the delay in four delay elements INV1 and four delay elements INV2 in the above-described example. When the capacitance value of the capacitance element C33 is 0.8 Cu, the latency corresponds to the delay in five delay elements INV1 and five delay elements INV2.

When the capacitance value of the capacitance element C33 is 1 Cu, the digital value of 20 is obtained through the second AD conversion including the third comparison operation in the above-described example. When the capacitance value of the capacitance element C33 is 0.8 Cu, the digital value of 25 is obtained through the second AD conversion including the third comparison operation. When the capacitance value of the capacitance element C33 is 1 Cu, the latency corresponds to the delay in four delay elements INV1 and four delay elements INV2 in the above-described example. When the capacitance value of the capacitance element C33 is 0.8 Cu, the latency corresponds to the delay in five delay elements INV1 and five delay elements IN V2.

When the level V11 is an arbitrary level greater than or equal to the level Vn1 and less than or equal to the level Vx1, the digital value obtained through the second A) conversion including the first comparison operation is any one of 15 to 25. In other words, the digital value is any one of eleven values. The correction circuit 41 corrects the digital value to a value of four bits by converting the digital value into any one of 0 into 8.

An example of specific correction will be described. To simplify descriptions, it is assumed that the voltage level V14 of the difference when the first AD conversion is completed is −4 Vcu. This level V14 is the middle level of the range of the voltage level of the difference assumed when the minimum-level bit of the upper-level data is decided on in the first AD conversion. The range is from −8 Vcu to 0 Vcu.

The case in which the capacitance value of the capacitance element C33 is 1 Cu will be described. The voltage level of the difference increases by 16 Vcu through the first level shift. The voltage level of the difference becomes 12 Vcu through the first level shift. After the first comparison operation is started, the voltage level of the difference decreases in a step shape.

When it is assumed that there is no latency, each of the latch circuits L1 holds a digital value at a timing at which the voltage level of the second terminals Tc332 of twelve capacitance elements C33 included in the lower-level DA conversion circuit 33 changes. When it is assumed that the latency corresponds to the delay in four delay elements INV1 and four delay elements INV2, each of the latch circuits L1 holds a digital value at a timing at which the voltage level of the second terminals Tc332 of sixteen capacitance elements C33 included in the lower-level DA conversion circuit 33 changes. In this case, the digital value of 16 is obtained through the second A) conversion including the first comparison operation.

The correction circuit 41 corrects the first digital data on the basis of the position of the first digital data in the range specified by the second digital data and the third digital data. The first digital data are generated through the first comparison operation. The second digital data are generated through the second comparison operation. The third digital data are generated through the third comparison operation. In the above-described example, the first digital data are the same as the second digital data or are greater than the second digital data. The first digital data are the same as the third digital data or are less than the third digital data.

The correction circuit 41 corrects the first digital data on the basis of the relationship between a first range and a second range. The first range is specified by the second digital data and the third digital data. One of the second digital data and the third digital data are the minimum value of the first range and the other of the second digital data and the third digital data are the maximum value of the first range. The correction circuit 41 corrects the first digital data such that the first digital data fall within the second range. The relative position of the corrected first digital data in the second range is almost the same as the relative position of the first digital data in the first range.

For example, the correction circuit 41 holds a table for correction. The correction circuit 41 corrects a digital value by converting the digital value into a digital correction value on the basis of the table. The correction circuit 41 holds a plurality of tables. When the capacitance value of the capacitance element C33 is 1 Cu, the digital value obtained through the second AD conversion including the first comparison operation is any one of 12 to 20 as described above. The case in which the digital correction value corresponding to the digital value of 16 is obtained will be described.

In the first table, the digital value of 12 corresponds to the digital correction value of 0. In the first table, the digital value of 13 corresponds to the digital correction value of 1. In the first table, the digital value of 14 corresponds to the digital correction value of 2. In the first table, the digital value of 15 corresponds to the digital correction value of 3. In the first table, the digital value of 16 corresponds to the digital correction value of 4. In the first table, the digital value of 17 corresponds to the digital correction value of 5. In the first table, the digital value of 18 corresponds to the digital correction value of 6. In the first table, the digital value of 19 corresponds to the digital correction value of 7. In the first table, the digital value of 20 corresponds to the digital correction value of 8. The correction circuit 41 converts the digital value of 16 obtained through the second AD conversion into the digital correction value of 4.

The correction circuit 41 converts the digital value into a value within a predetermined range by correcting a digital value. In the above-described example, the predetermined range is specified by the digital correction value of 0 and the digital correction value of 8. The digital correction value of 0 is the minimum value of the predetermined range and the digital correction value of 8 is the maximum value of the predetermined range. The minimum value of the predetermined range corresponds to the second lower-level data (second digital data) generated through the second comparison operation. The maximum value of the predetermined range corresponds to the third lower-level data (third digital data) generated through the third comparison operation. The corrected digital value is always converted into any one of the values within the predetermined range regardless of the latency. Therefore, the AD conversion circuit 10 can improve the accuracy of the lower-level data.

The AD conversion circuit 10 outputs the generated digital data. The digital data include the upper-level data and the lower-level data. The upper-level data include a digital value generated through the successive approximation operation. The lower-level data include a digital value corrected by the correction circuit 41.

The case in which the capacitance value of the capacitance element C33 is 0.8 Cu will be described. The voltage level V14 of the difference when the first AD conversion is completed is −4 Vcu. The voltage level of the difference increases by 16 Vcu through the first level shift. The voltage level of the difference becomes 12 Vcu through the first level shift. After the first comparison operation is started, the voltage level of the difference decreases in a step shape.

As described above, when the capacitance value of the capacitance element C33 is 0.8 Cu, the voltage level of the digital ramp signal changes by 0.8 Vcu for each step. The digital value obtained through the second AD conversion becomes (5/4) times as great as the digital value when the capacitance value of the capacitance element C33 is 1 Cu. The latency becomes (5/4) times as great as the latency when the capacitance value of the capacitance element C33 is 1 Cu.

When it is assumed that there is no latency, each of the latch circuits L1 holds a digital value at a timing at which the voltage level of the second terminals Tc332 of fifteen capacitance elements C33 included in the lower-level DA conversion circuit 33 changes. The latency corresponds to the delay in five delay elements INV1 and five delay elements INV2. Since the latency exists, each of the latch circuits L1 holds a digital value at a timing at which the voltage level of the second terminals Tc332 of twenty capacitance elements C33 included in the lower-level DA conversion circuit 33 changes. In this case, the digital value of 20 is obtained through the second AD conversion including the first comparison operation.

When the capacitance value of the capacitance element C33 is 0.8 Cu, the digital value obtained through the second AD conversion including the first comparison operation is any one of 15 to 25 as described above. The case in which the digital correction value corresponding to the digital value of 20 is obtained will be described.

In the second table, the digital value of 15 corresponds to the digital correction value of 0. In the second table, the digital value of 16 and the digital value of 17 correspond to the digital correction value of 1. In the second table, the digital value of 18 corresponds to the digital correction value of 2. In the second table, the digital value of 19 corresponds to the digital correction value of 3. In the second table, the digital value of 20 corresponds to the digital correction value of 4. In the second table, the digital value of 21 corresponds to the digital correction value of 5. In the second table, the digital value of 22 corresponds to the digital correction value of 6. In the second table, the digital value of 23 and the digital value of 24 correspond to the digital correction value of 7. In the second table, the digital value of 25 corresponds to the digital correction value of 8. The correction circuit 41 converts the digital value of 20 obtained through the second AD conversion into the digital correction value of 4.

In both of the case in which the capacitance value of the capacitance element C33 is 1 Cu and the case in which the capacitance value of the capacitance element C33 is 0.8 Cu, the digital correction value is 4. The correction circuit 41 obtains almost the same digital correction value regardless of the difference between the capacitance values of the plurality of capacitance elements C33 included in the lower-level DA conversion circuit 33. As long as the accuracy of the capacitance value is secured among the plurality of capacitance elements C31 included in the upper-level DA conversion circuit 31, absolute accuracy is not necessary very much for the capacitance values of the plurality of capacitance elements C33 included in the lower-level DA conversion circuit 33. In other words, even when the capacitance value of each of the plurality of capacitance elements C33 included in the lower-level DA conversion circuit 33 is small, the AD conversion circuit 10 can perform the AD conversion with high accuracy.

Accordingly, the capacitance values of the plurality of capacitance elements C33 included in the lower-level DA conversion circuit 33 are not limited to 1 Cu. The capacitance values may be less than 1 Cu. For example, the capacitance values may be 0.8 Cu. The capacitance values may be greater than 1 Cu. For example, the capacitance values may be 1.2 Cu.

The correction circuit 41 corrects the first digital data by using a table corresponding to each of a plurality of ranges. Each of the plurality of ranges is specified by the second digital data and the third digital data. In the above-described example, the correction circuit 41 holds a plurality of tables including the first table and the second table. The correction circuit 41 selects one table corresponding to the range specified by the second digital data and the third digital data.

For example, the digital value of 12 is obtained as the second digital data and the digital value of 20 is obtained as the third digital data. In this case, the correction circuit 41 selects the above-described first table. Alternatively, the digital value of 15 is obtained as the second digital data and the digital value of 25 is obtained as the third digital data. In this case, the correction circuit 41 selects the above-described second table.

At least one of the plurality of capacitance elements C32 included in the level shift circuit 32 may be included in the upper-level DA conversion circuit 31. In other words, the upper-level DA conversion circuit 31 and the level shift circuit 32 may share at least one capacitance element. For example, the second capacitance element used for the third level shift may be the third capacitance element included in the plurality of capacitance elements C31 of the upper-level DA conversion circuit 31. In other words, the third capacitance element may be used for the third level shift. The third capacitance element is used for generating data of the lowest-level bit of the upper-level data. In the above-described example, the third capacitance element is the capacitance element C31 having the capacitance value of 8 Cu. The first AD conversion does not need to be performed before the third level shift is performed. Therefore, it is possible to use, for the third level shift, the third capacitance element used for the first AD conversion.

The first capacitance element used for the second level shift may be the fourth capacitance element included in the plurality of capacitance elements C31 of the upper-level DA conversion circuit 31. In other words, the fourth capacitance element may be used for the second level shift. The fourth capacitance element is used for generating data of the lowest-level bit of the upper-level data. In the above-described example, the fourth capacitance element is the capacitance element C31 having the capacitance value of 8 Cu. The first AD conversion does not need to be performed before the second level shift is performed. Therefore, it is possible to use, for the second level shift, the fourth capacitance element used for the first AD conversion.

In the above-described example, the capacitance values of the two capacitance elements C32 included in the level shift circuit 32 are the same. The capacitance values of the two capacitance elements C32 included in the level shift circuit 32 may be different from each other. For example, the capacitance value of the first capacitance element used for the second level shift may be 4 Cu.

Since the capacitance element C32 having the capacitance value of 4 Cu and the capacitance element C32 having the capacitance value of 8 Cu are used for the first level shift, the level Vn2 and the level Vx2 shown in FIG. 6 increase by 12 Vcu through the first level shift. In such a case, the level Vn3 becomes 4 Vcu and the level Vx3 becomes 12 Vcu. Since the capacitance element C32 having the capacitance value of 4 Cu is used for the second level shift, the level V21 shown in FIG. 6 increases by 4 Vcu through the second level shift. In such a case, the level V25 becomes 4 Vcu and is the same as the level Vn3. Since the capacitance element C32 having the capacitance value of 8 Cu is used for the third level shift, the level V21 shown in FIG. 6 increases by 12 Vcu through the second level shift and the third level shift. In such a case, the level V26 becomes 12 Vcu and is the same as the level Vx3. The capacitance value of the first capacitance element may be 12 Cu or the like.

The AD conversion method according to each aspect of the present invention includes first to eighth steps executed in the AD conversion circuit 10. The first signal INP is input to the first terminal T21 of the comparison circuit 21 and the second signal INN is held in the plurality of capacitance elements C31 of the upper-level DA conversion circuit 31. Thereafter, the comparison circuit 21 performs the successive approximation operation in the first step (Step S1). After the successive approximation operation is performed, the level shift circuit 32 performs the first level shift by shifting the voltage level of the signal held in the plurality of capacitance elements C31 of the upper-level DA conversion circuit 31 to the first level in the second step (Step S2). After the first level shift is performed, a signal having a voltage level that is based on the digital ramp signal is held in the plurality of capacitance elements C31 of the upper-level DA conversion circuit 31 and the plurality of capacitance elements C33 of the lower-level DA conversion circuit 33. After the first level shift is performed, the comparison circuit 21 performs the first comparison operation by comparing the first voltage level of the signal input to the first terminal T21 with the second voltage level of the signal input to the second terminal T22 in the third step (Step S3).

The third signal (first signal INP) is input to the first terminal T21 and is held in the plurality of capacitance elements C31 of the upper-level DA conversion circuit 31. Thereafter, the level shift circuit 32 performs the second level shift by shifting the voltage level of the signal held in the plurality of capacitance elements C31 of the upper-level DA conversion circuit 31 to the second level in the fourth step (Step S5). After the second level shift is performed, a signal having a voltage level that is based on the digital ramp signal is held in the plurality of capacitance elements C31 of the upper-level DA conversion circuit 31 and the plurality of capacitance elements C33 of the lower-level DA conversion circuit 33. After the second level shift is performed, the comparison circuit 21 performs the second comparison operation by comparing the first voltage level with the second voltage level in the fifth step (Step S6).

After the second comparison operation is performed, the level shift circuit 32 performs the third level shift by shifting the voltage level of the signal held in the plurality of capacitance elements C31 of the upper-level DA conversion circuit 31 to the third level different from the second level in the sixth step (Step S7). After the third level shift is performed, a signal having a voltage level that is based on the digital ramp signal is held in the plurality of capacitance elements C31 of the upper-level DA conversion circuit 31 and the plurality of capacitance elements C33 of the lower-level DA conversion circuit 33. After the third level shift is performed, the comparison circuit 21 performs the third comparison operation by comparing the first voltage level with the second voltage level in the seventh step (Step S8). The correction circuit 41 corrects the first digital data on the basis of the second digital data and the third digital data in the eighth step (Step S9).

In the above-described example, the voltage level of the first signal INP is greater than or equal to the voltage level of the second signal INN, but the voltage level of the first signal INP may be less than or equal to the voltage level of the second signal INN. In this case, the reference voltage VREFL is input to the input terminal H of the switch SW1 and the reference voltage VREFH is input to the input terminal L of the switch SW1. The reference voltage VREFL is input to the input terminal H of the switch SW2 and the reference voltage VREFH is input to the input terminal L of the switch SW2. The voltage level of the signal ST changes from the low level to the high level. The voltage level of the digital ramp signal changes in a step shape.

In the first embodiment, the correction circuit 41 corrects the first digital data on the basis of the second digital data and the third digital data. Therefore, the AD conversion circuit 10 can improve the accuracy of the digital data.

For example, the speed at which the digital ramp signal decreases is different between the case in which the capacitance value of the capacitance element C33 is 1 Cu and the case in which the capacitance value of the capacitance element C33 is 0.8 Cu. The difference in speed (inclination) of the change of the digital ramp signal causes the individual difference in performance of the AD conversion circuit 10. Since the correction circuit 41 corrects the first digital data, the influence of the variation of the inclination of the digital ramp signal can be suppressed.

If the temperature changes, the delay time in the delay element INV1 and the delay time in the delay element INV2 change. In a case in which the delay time changes, the inclination of the digital ramp signal changes. However, the influence of the variation of the inclination of the digital ramp signal can be suppressed as described above.

The plurality of capacitance elements C32 of the level shift circuit 32 include the first capacitance element and the second capacitance element. The capacitance value of the second capacitance element used for the third level shift is almost the same as the capacitance value of the third capacitance element included in the plurality of capacitance elements C31 of the upper-level DA conversion circuit 31. The third capacitance element is used for generating data of the lowest-level bit of the upper-level data. The level shift circuit 32 can easily perform the third level shift by using the second capacitance element.

The capacitance value of the first capacitance element used for the second level shift is almost the same as the capacitance value of the fourth capacitance element included in the plurality of capacitance elements C31 of the upper-level DA conversion circuit 31. The fourth capacitance element is used for generating data of the lowest-level bit of the upper-level data. The level shift circuit 32 can easily perform the second level shift by using the first capacitance element.

When the level shift circuit 32 performs the first level shift, the voltage level of the signal held in the plurality of capacitance elements C31 of the upper-level DA conversion circuit 31 is shifted to the first level. When the level shift circuit 32 performs the second level shift, the voltage level of the signal held in the plurality of capacitance elements C31 of the upper-level DA conversion circuit 31 is shifted to the second level. The second level is the minimum value of the range in which the first level varies. When the level shift circuit 32 performs the third level shift, the voltage level of the signal held in the plurality of capacitance elements C31 of the upper-level DA conversion circuit 31 is shifted to the third level. The third level is the maximum value of the range in which the first level varies. The minimum value of the range and the maximum value of the range are set in advance. In other words, the range is set in advance. The correction circuit 41 can correct the first digital data on the basis of the relationship between the digital data of the range in which the first level varies and the first digital data. Therefore, the AD conversion circuit 10 can improve the accuracy of the digital data.

The level shift circuit 32 performs the second level shift and the third level shift without the first AD conversion being performed. Therefore, the length of time required to obtain the second digital data for correction and the third digital data for correction can be shortened.

Second Embodiment

Figure 7:
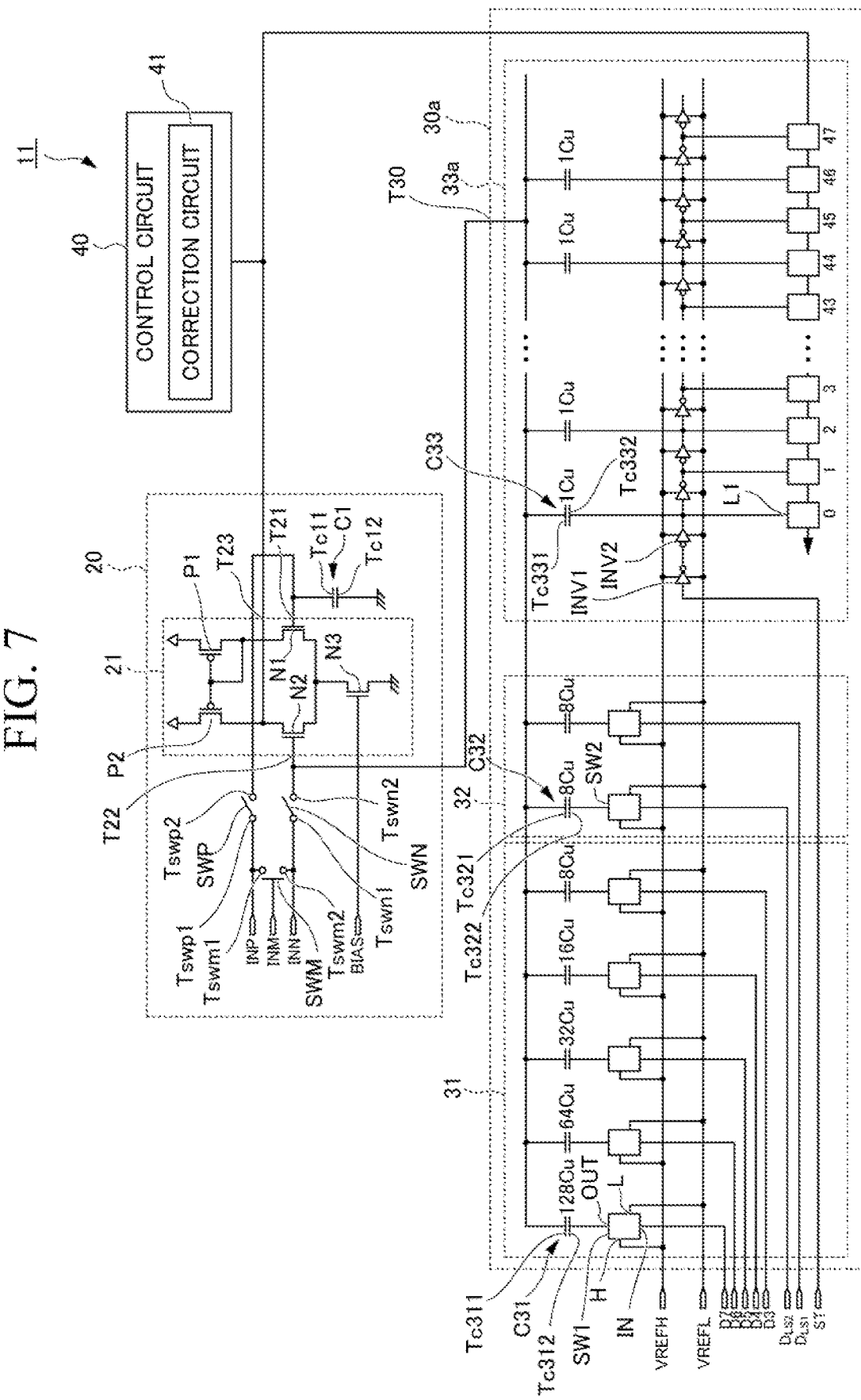
FIG. 7 is a circuit diagram showing a configuration of an AD conversion device according to a second embodiment of the present invention.

FIG. 7 shows a configuration of an AD conversion circuit 11 according to a second embodiment of the present invention. The same configuration as that shown in FIG. 1 will not be described.

The DA conversion unit 30 shown in FIG. 1 is changed to a DA conversion unit 30a. In the DA conversion unit 30a shown in FIG. 7, the lower-level DA conversion circuit 33 shown in FIG. 1 is changed to a lower-level DA conversion circuit 33a. The number of the latch circuits L1 included in the lower-level DA conversion circuit 33a shown in FIG. 7 is different from the number of the latch circuits L1 included in the lower-level DA conversion circuit 33 shown in FIG. 1. The lower-level DA conversion circuit 33 shown in FIG. 1 includes twenty-four latch circuits L1. The lower-level DA conversion circuit 33a shown in FIG. 7 includes forty-eight latch circuits L1.

In the lower-level DA conversion circuit 33a, the first input terminals of twenty-four latch circuits L1 are connected to the second terminals Tc332 of the capacitance elements C33. In the lower-level DA conversion circuit 33a, the first input terminals of the other twenty-four latch circuits L1 are connected to the output terminals of the delay elements INV1 and the input terminals of the delay elements INV2.

In the second embodiment, since the number of the latch circuits L1 doubles, the number of bits of the lower-level data increases by one bit. Therefore, the resolution of AD conversion can increase by one bit without significantly changing the circuit scale.

Third Embodiment

Figure 8:
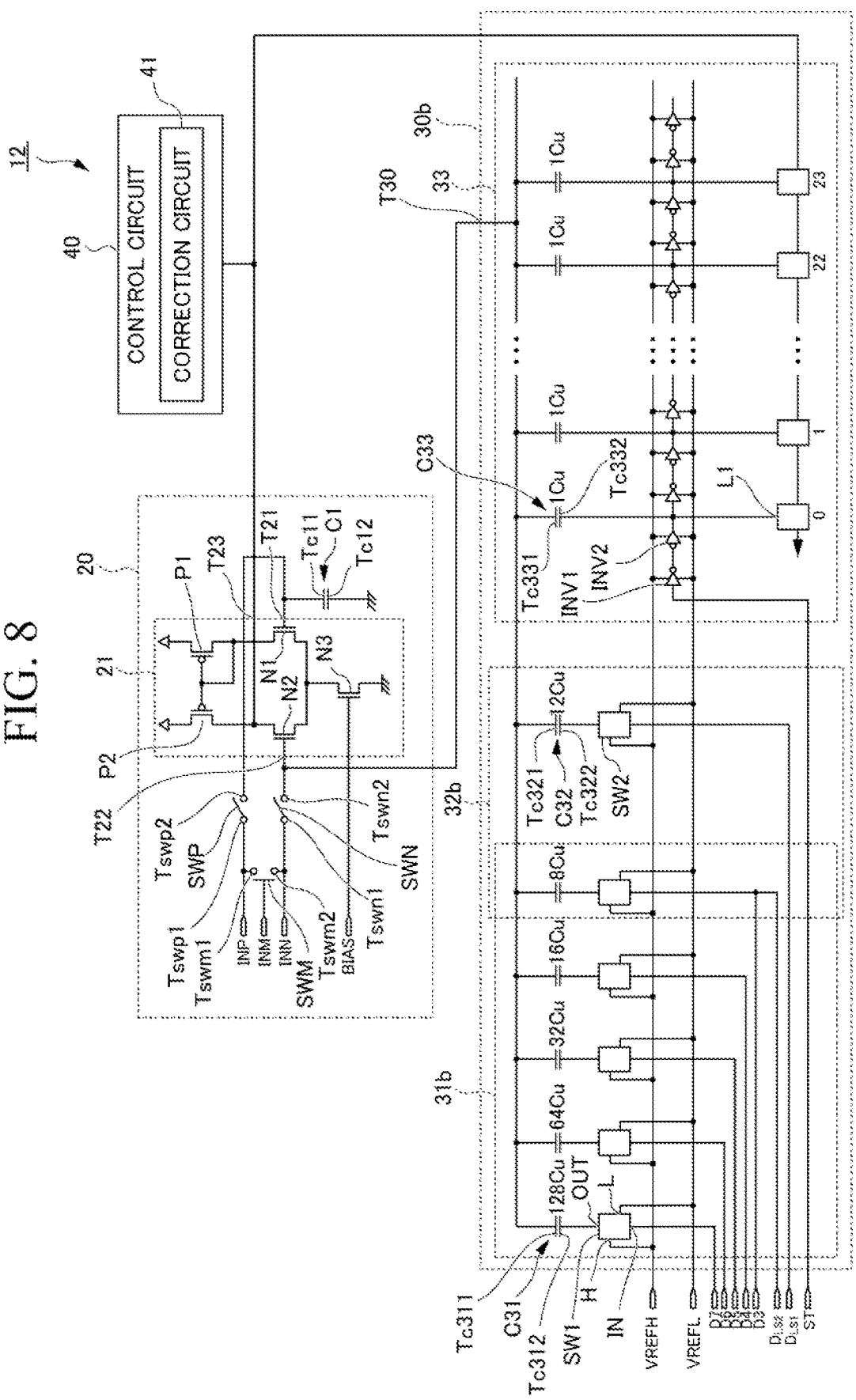
FIG. 8 is a circuit diagram showing a configuration of an A) conversion device according to a third embodiment of the present invention.

FIG. 8 shows a configuration of an AD conversion circuit 12 according to a third embodiment of the present invention. The same configuration as that shown in FIG. 1 will not be described.

The DA conversion unit 30 shown in FIG. 1 is changed to a DA conversion unit 30b. In the DA conversion unit 30b shown in FIG. 8, the upper-level DA conversion circuit 31 shown in FIG. 1 is changed to an upper-level DA conversion circuit 31b. In the DA conversion unit 30b shown in FIG. 8, the level shift circuit 32 shown in FIG. 1 is changed to a level shift circuit 32b.

In the upper-level DA conversion circuit 31b, the signal D3 and the signal $D_{LS2}$ are input to the input terminal IN of one switch SW1. The output terminal OUT of the switch SW1 is connected to the second terminal Tc312 of the capacitance element C31 having the capacitance value of 8 Cu.

The level shift circuit 32b includes one capacitance element C32, one capacitance element C31, one switch SW2, and one switch SW1. The capacitance value of the capacitance element C32 is 12 Cu. The signal $D_{LS1}$ is input to the input terminal IN of the switch SW2. The upper-level DA conversion circuit 31b and the level shift circuit 32b share the capacitance element C31 having the capacitance value of 8 Cu and the switch SW1 connected to the capacitance element C31. The capacitance element C32 is used for the first level shift and the second level shift. The capacitance element C31 having the capacitance value of 8 Cu is used for the third level shift.

Before the first level shift is performed, the voltage level of each of the signal $D_{LS1}$ and the signal $D_{LS2}$ is the low level. The control circuit 40 changes the voltage level of the signal $D_{LS1}$ from the low level to the high level in the first level shift. At this time, in the level shift circuit 32b, the voltage level of the first terminal Tc321 of the capacitance element C32 having the capacitance value of 12 Cu increases by 12 Vcu. In other words, the voltage level of the output terminal T30 of the DA conversion unit 30b and the voltage level of the difference increase by 12 Vcu.

Before the second level shift is performed, the control circuit 40 changes the voltage level of each of the signals D7 to D3 and the signal $D_{LS1}$ to the low level. In addition, the control circuit 40 changes the voltage level of each of the signal $D_{LS2}$ and the signal ST to the high level. After the state of the switch SW M becomes the ON state and the first signal INP is held in the plurality of capacitance elements of the DA conversion unit 30b, the state of the switch SWM becomes the OFF state. At this time, the first signal INP is input to each of the first terminal 121 of the comparison circuit 21 and the second terminal T22 of the comparison circuit 21.

The control circuit 40 changes the voltage level of the signal $D_{LS1}$ from the low level to the high level in the second level shift. At this time, in the level shift circuit 32b, the voltage level of the first terminal Tc321 of the capacitance element C32 having the capacitance value of 12 Cu increases by 12 Vcu. In other words, the voltage level of the output terminal T30 of the DA conversion unit 30b and the voltage level of the difference increase by 12 Vcu.

The control circuit 40 changes the voltage level of the signal D from the high level to the low level in the third level shift. At this time, in the level shift circuit 32b, the voltage level of the first terminal Tc311 of the capacitance element C31 having the capacitance value of 8 Cu decreases by 8 Vcu. In other words, the voltage level of the output terminal T30 of the DA conversion unit 30b and the voltage level of the difference decrease by 8 Vcu.

Figure 9:
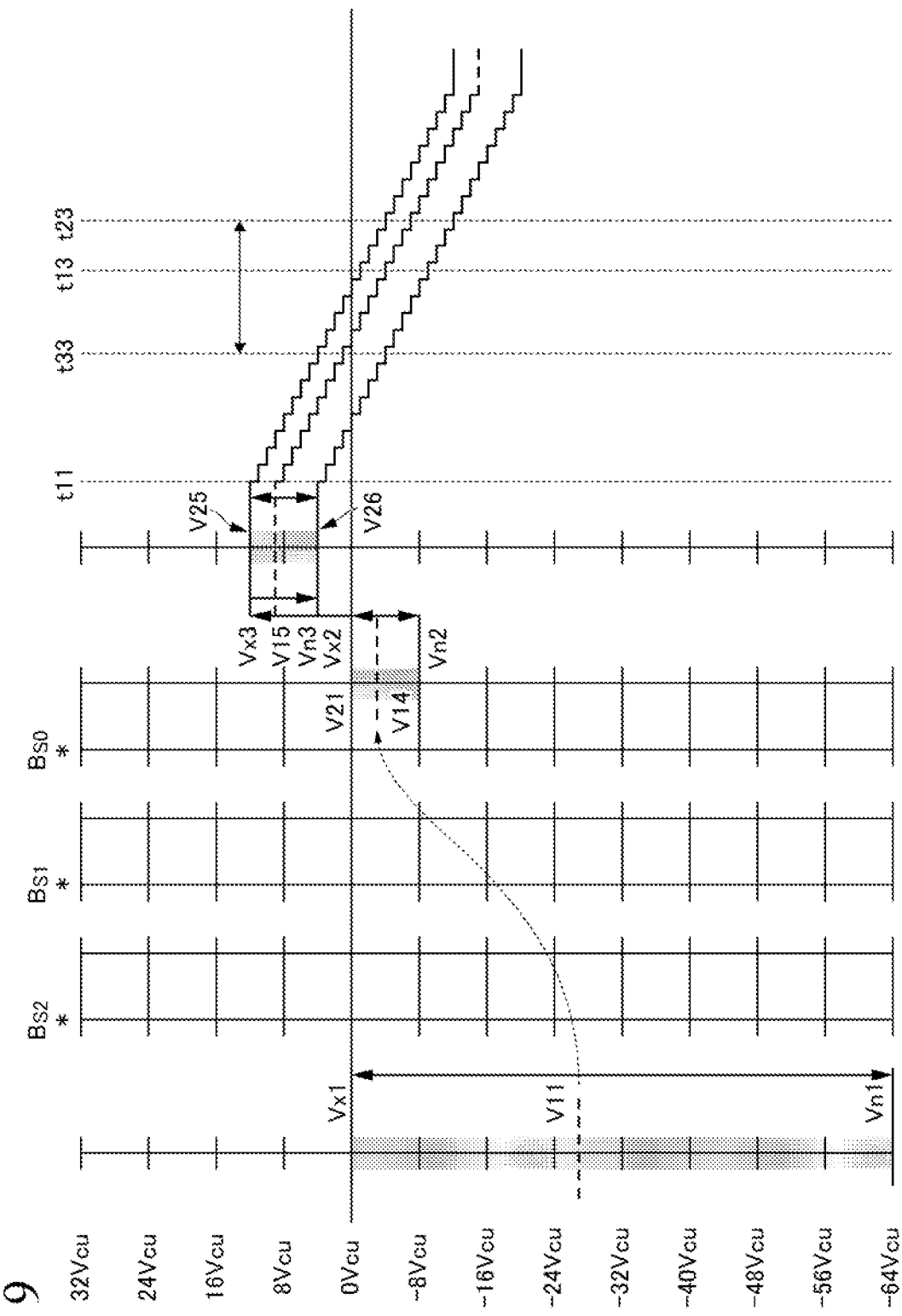
FIG. 9 is a timing chart showing an operation of the AD conversion device according to the third embodiment of the present invention.

FIG. 9 shows the change of the difference between the voltage level of the first terminal T21 of the comparison circuit 21 and the voltage level of the second terminal T22 of the comparison circuit 21. In FIG. 9, the vertical direction indicates the difference between the voltage level of the first terminal T21 and the voltage level of the second terminal T22 as with FIG. 3. When the second signal INN is held in the plurality of capacitance elements C31 of the upper-level DA conversion circuit 31b, the voltage level of the difference is V11. The maximum value of the range in which the voltage level of the difference varies is Vx1 and the minimum value of the range in which the voltage level of the difference varies is Vn1. For example, the level Vx1 is 0 Vcu and the level Vn1 is −64 Vcu.

When the first AD conversion that is based on the level V11 is completed, the voltage level of the difference is V14. The level V14 is −3 Vcu. When it is assumed that the first AD conversion that is based on the level Vx1 is completed, the voltage level of the difference is Vx2. The level Vx2 is 0 Vcu. When it is assumed that the first AD conversion that is based on the level Vn1 is completed, the voltage level of the difference is Vn2. The level Vn2 is −8 Vcu. When the first AD conversion is completed, the voltage level of the difference is greater than or equal to Vn2 and less than or equal to Vx2.

When the first level shift that is based on the level V14 is performed, the voltage level of the difference becomes V15. Since the capacitance element C32 having the capacitance value of 12 Cu is used for the first level shift, the voltage level of the difference increases by 12 Vcu through the first level shift. The level V15 is 9 Vcu. When it is assumed that the first level shift that is based on the level Vx2 is performed, the voltage level of the difference becomes Vx3. The level Vx3 is 12 Vcu. When it is assumed that the first level shift that is based on the level Vn2 is performed, the voltage level of the difference becomes Vn3. The level Vn3 is 4 Vcu. When the first level shift is performed, the voltage level of the difference is greater than or equal to Vn3 and less than or equal to Vx3.

When the first signal INP is input to each of the first terminal T21 and the second terminal T22, the difference between the voltage level of the first terminal T21 and the voltage level of the second terminal 122 is V21. The level V21 is 0 Vcu. When the second level shift that is based on the level V21 is performed, the voltage level of the difference becomes V25. Since the capacitance element C32 having the capacitance value of 12 Cu is used for the second level shift, the voltage level of the difference increases by 12 Vcu through the second level shift. The level V25 is 12 Vcu. When the second level shift, which is based on the level V21, and the third level shift are performed, the voltage level of the difference becomes V26. Since the capacitance element C32 having the capacitance value of 12 Cu is used for the second level shift, the voltage level of the difference increases by 12 Vcu through the second level shift. Since the capacitance element C31 having the capacitance value of 8 Cu is used for the third level shift, the voltage level of the difference decreases by 8 Vcu through the third level shift. The level V26 is 4 Vcu.

The level Vn3 is obtained when the first AD conversion, which is based on the level Vn1, and the first level shift, which is based on the level Vn2, are performed. The level Vn3 is the same as the level V26 obtained when the second level shift and the third level shift are performed. In fact, the first AD conversion, which is based on the level Vn1, and the first level shift, which is based on the level Vn2, are not performed. The AD conversion circuit 12 can obtain the level V26 corresponding to the level Vn3 by performing the second level shift, which is based on the level V21, and the third level shift.

The level Vx3 is obtained when the first AD conversion, which is based on the level Vx1, and the first level shift, which is based on the level Vx2, are performed. The level Vx3 is the same as the level V25 obtained when the second level shift is performed. In fact, the first AD conversion, which is based on the level Vx1, and the first level shift, which is based on the level Vx2, are not performed. The AD conversion circuit 12 can obtain the level V25 corresponding to the level Vx3 by performing the second level shift that is based on the level V21.

The level shift circuit 32b shifts the voltage level of the signal held in the plurality of capacitance elements C31 of the upper-level DA conversion circuit 31b to the first level in Step S2. In the above-described example, when the first level shift is performed, the voltage level of the difference is shifted from the level V14 to the level V15. The level shift circuit 32b shifts the voltage level of the signal held in the plurality of capacitance elements C31 of the upper-level DA conversion circuit 31b to the second level in Step S5. The second level is the maximum value of the range in which the first level varies. In the above-described example, when the second level shift is performed, the voltage level of the difference is shifted from the level V21 to the level Vx3. The range in which the voltage level of the difference varies is from the level Vn3 to the level Vx3. The level Vn3 is the minimum value of the range and the level Vx3 is the maximum value of the range. The level shift circuit 32b shifts the voltage level of the signal held in the plurality of capacitance elements C31 of the upper-level DA conversion circuit 31b to the third level in Step S7. The third level is the minimum value of the range in which the first level varies. In the above-described example, when the second level shift and the third level shift are performed, the voltage level of the difference is shifted from the level V21 to the level Vn3.

When the voltage level of the difference is V15, the first comparison operation is started. The voltage level of the difference starts to decrease in a step shape from a timing t11. Each of the latch circuits L1 holds a digital value at a timing t13. When the voltage level of the difference is V25 (Vx3), the second comparison operation is started. The voltage level of the difference starts to decrease in a step shape from the timing il1. Each of the latch circuits L1 holds a digital value at a timing t23. When the voltage level of the difference is V26 (Vn3), the third comparison operation is started. The voltage level of the difference starts to decrease in a step shape from the timing t11. Each of the latch circuits L holds a digital value at a timing t33.

When it is assumed that there is no latency, each of the latch circuits L1 holds a digital value at a timing at which the voltage level of the second terminals Tc332 of nine capacitance elements C33 included in the lower-level DA conversion circuit 33 changes in the first comparison operation. The latency exists even in circuits operating at high speed. Therefore, each of the latch circuits L1, in fact, holds the digital value when the voltage level of the second terminals Tc332 of thirteen capacitance elements C33 included in the lower-level DA conversion circuit 33 changes. Accordingly, the latency corresponding to the delay in four delay elements INV1 and four delay elements INV2 exists.

When it is assumed that there is no latency, each of the latch circuits L1 holds a digital value at a timing at which the voltage level of the second terminals Tc332 of twelve capacitance elements C33 included in the lower-level DA conversion circuit 33 changes in the second comparison operation. In fact, the latency corresponding to the delay in four delay elements INV1 and four delay elements INV2 exists. Therefore, each of the latch circuits L1 holds the digital value when the voltage level of the second terminals Tc332 of sixteen capacitance elements C33 included in the lower-level DA conversion circuit 33 changes.

When it is assumed that there is no latency, each of the latch circuits L1 holds a digital value at a timing at which the voltage level of the second terminals Tc332 of four capacitance elements C33 included in the lower-level DA conversion circuit 33 changes in the third comparison operation. In fact, the latency corresponding to the delay in four delay elements INV1 and four delay elements INV2 exists. Therefore, each of the latch circuits L1 holds the digital value when the voltage level of the second terminals Tc332 of eight capacitance elements C33 included in the lower-level DA conversion circuit 33 changes.

In the above-described example, the digital value of 16 is obtained through the second AD conversion including the second comparison operation. In the above-described example, the digital value of 8 is obtained through the second AD conversion including the third comparison operation.

When the level V11 is an arbitrary level greater than or equal to the level Vn1 and less than or equal to the level Vx1, the digital value obtained through the second AD conversion including the first comparison operation is any one of 8 to 16. In other words, the digital value is any one of nine values. The correction circuit 41 corrects the digital value to a value of four bits by converting the digital value into any one of 0 to 8. The correction method in the third embodiment is similar to that in the first embodiment.

The correction circuit 41 converts the digital value into a value within a predetermined range by correcting a digital value. In the above-described example, the predetermined range is specified by the digital correction value of 0 and the digital correction value of 8. The digital correction value of 0 is the minimum value of the predetermined range and the digital correction value of 8 is the maximum value of the predetermined range. The minimum value of the predetermined range corresponds to the third lower-level data (third digital data) generated through the third comparison operation. The maximum value of the predetermined range corresponds to the second lower-level data (second digital data) generated through the second comparison operation. The corrected digital value is always converted into any one of the values within the predetermined range regardless of the latency. Therefore, the AD conversion circuit 12 can improve the accuracy of the lower-level data.

The plurality of capacitance elements of the level shift circuit 32b include a first capacitance element and a second capacitance element. In the above-described example, the first capacitance element is the capacitance element C32. The second capacitance element is the capacitance element C31 having the capacitance value of 8 Cu. The level shift circuit 32 performs the first level shift by changing the voltage level of the first capacitance element in Step S2. The level shift circuit 32 performs the second level shift by changing the voltage level of the first capacitance element in Step S5. The level shift circuit 32 performs the third level shift by changing the voltage level of the second capacitance element in Step S7.

When the successive approximation operation is performed in Step S1, the upper-level data included in the digital data are generated. The upper-level data include data of multiple bits. When the first comparison operation is performed in Step S3, the lower-level data included in the digital data are generated. The lower-level data include data of multiple bits. In the above-described example, the second capacitance element is the third capacitance element included in the plurality of capacitance elements C3 of the upper-level DA conversion circuit 31b. The third capacitance element is used for generating data of the lowest-level bit of the upper-level data. In the above-described example, the third capacitance element is the capacitance element C31 having the capacitance value of 8 Cu. The first AD conversion does not need to be performed before the third level shift is performed. Therefore, it is possible to use, for the third level shift, the third capacitance element used for the first AD conversion.

The capacitance value of the first capacitance element used for the second level shift may be 16 Cu. Since the capacitance element C32 having the capacitance value of 16 Cu is used for the first level shift, the level Vn2 and the level Vx2 shown in FIG. 9 increase by 16 Vcu through the first level shift. In such a case, the level Vn3 becomes 8 Vcu and the level Vx3 becomes 16 Vcu. Since the capacitance element C32 having the capacitance value of 16 Cu is used for the second level shift, the level V21 shown in FIG. 9 increases by 16 Vcu through the second level shift. In such a case, the level V25 becomes 16 Vcu and is the same as the level Vx3. Since the capacitance value of 8 Cu is used for the third level shift, the level V21 shown in FIG. 9 increases by 16 Vcu through the second level shift and decreases by 8 Vcu through the third level shift. In such a case, the level V26 becomes 8 Vcu and is the same as the level Vn3. The capacitance value of the first capacitance element may be 20 Cu or the like.

When the capacitance value of the first capacitance element used for the second level shift is 16 Cu, the capacitance value of the first capacitance element is almost the same as the capacitance value of the fourth capacitance element included in the plurality of capacitance elements C31 of the upper-level DA conversion circuit 31b. The fourth capacitance element is used for generating data of the second-lowest-level bit of the upper-level data. In the above-described example, the fourth capacitance element is the capacitance element C31 having the capacitance value of 16 Cu.

When the capacitance value of the first capacitance element is 16 Cu, the capacitance value of the first capacitance element and the capacitance value of the fourth capacitance element may be different from each other. The difference between the capacitance value of the first capacitance element and the capacitance value of the fourth capacitance element may be very small. For example, the absolute value of the difference may be less than 5% of the capacitance value of the first capacitance element or the fourth capacitance element. Alternatively, the absolute value of the difference may be less than 10% of the capacitance value of the first capacitance element or the capacitance value of the fourth capacitance element.

When the capacitance value of the first capacitance element is 16 Cu, the first capacitance element may be the fourth capacitance element. In other words, the fourth capacitance element may be used for the second level shift. The first AD conversion does not need to be performed before the second level shift is performed. Therefore, it is possible to use, for the second level shift, the fourth capacitance element used for the first AD conversion.

In the third embodiment, the correction circuit 41 corrects the first digital data as with the first embodiment. Therefore, the AD conversion circuit 12 can improve the accuracy of the digital data and can suppress the influence of the variation of the inclination of the digital ramp signal.

The second capacitance element used for the third level shift is the third capacitance element included in the plurality of capacitance elements C31 of the upper-level DA conversion circuit 31b. The level shift circuit 32b can easily perform the third level shift by using the third capacitance element as the second capacitance element. Since the upper-level DA conversion circuit 31b and the level shift circuit 32b share the capacitance element, the circuit scale is reduced.

The first capacitance element used for the second level shift may be the fourth capacitance element included in the plurality of capacitance elements C31 of the upper-level DA conversion circuit 31b. The level shift circuit 32b can easily perform the second level shift by using the fourth capacitance element as the first capacitance element. Since the upper-level DA conversion circuit 31b and the level shift circuit 32b share the capacitance element, the circuit scale is reduced.

When the level shift circuit 32b performs the first level shift, the voltage level of the signal held in the plurality of capacitance elements C31 of the upper-level DA conversion circuit 31b is shifted to the first level. When the level shift circuit 32b performs the second level shift, the voltage level of the signal held in the plurality of capacitance elements C31 of the upper-level DA conversion circuit 31b is shifted to the second level. The second level is the maximum value of the range in which the first level varies. When the level shift circuit 32b performs the third level shift, the voltage level of the signal held in the plurality of capacitance elements C31 of the upper-level DA conversion circuit 31b is shifted to the third level. The third level is the minimum value of the range in which the first level varies. The minimum value of the range and the maximum value of the range are set in advance. In other words, the range is set in advance. The correction circuit 41 can correct the first digital data on the basis of the relationship between the digital data of the range in which the first level varies and the first digital data. Therefore, the AD conversion circuit 12 can improve the accuracy of the digital data.

Fourth Embodiment

Figure 10:
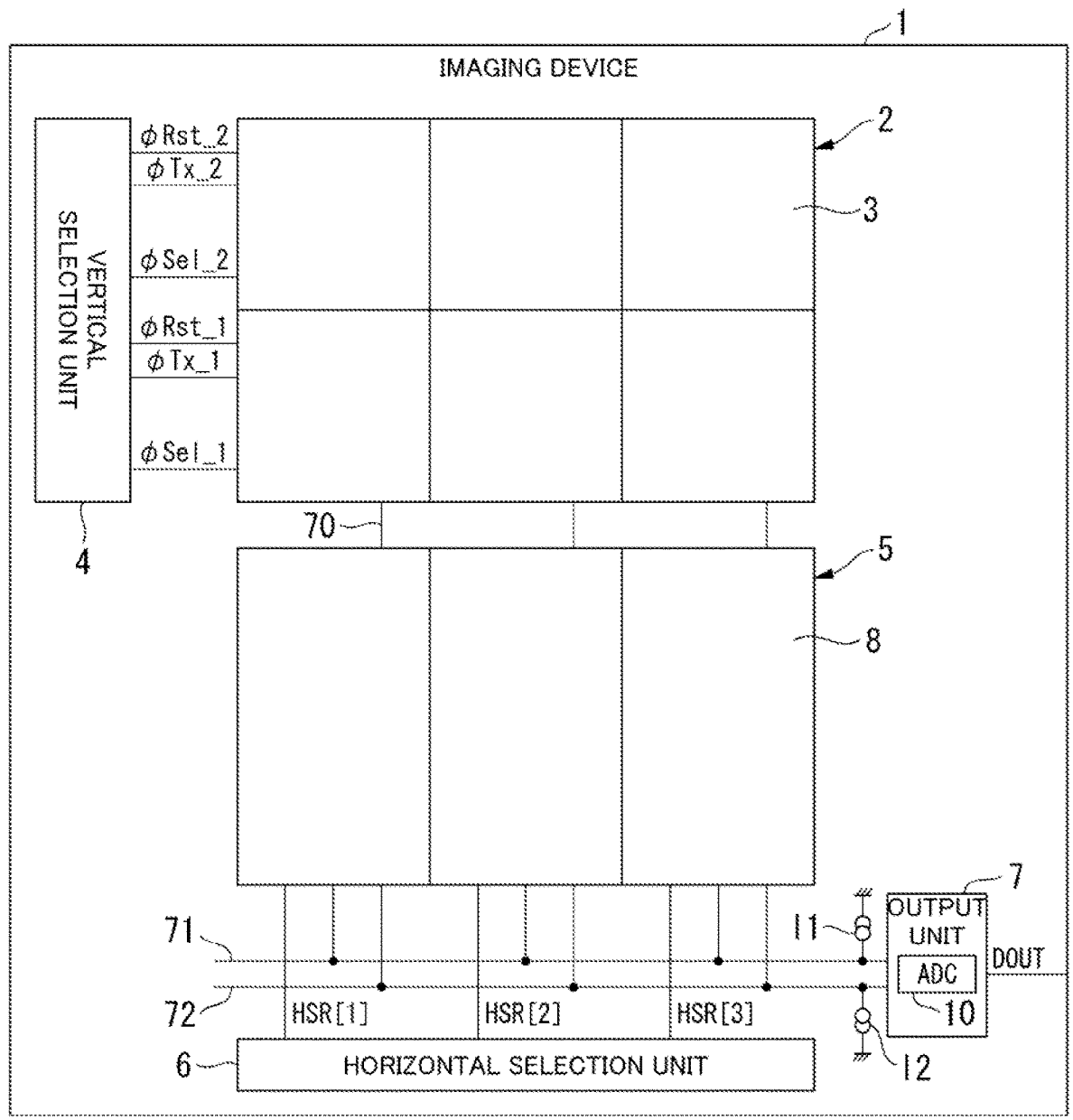
FIG. 10 is a block diagram showing a configuration of an imaging device according to a fourth embodiment of the present invention.

FIG. 10 shows a configuration of an imaging device 1 according to a fourth embodiment of the present invention. The imaging device 1 shown in FIG. 10 includes an imaging unit 2, a vertical selection unit 4, a column circuit unit 5, a horizontal selection unit 6, and an output unit 7. For example, the imaging unit 2, the vertical selection unit 4, the column circuit unit 5, the horizontal selection unit 6, and the output unit 7 are disposed in the same substrate. When a chip in which the imaging device 1 is disposed includes a plurality of substrates, the imaging unit 2, the vertical selection unit 4, the column circuit unit 5, the horizontal selection unit 6, and the output unit 7 may be distributed to the plurality of substrates.

The imaging unit 2 includes a plurality of pixels 3 disposed in a matrix shape. The plurality of pixels 3 constitute an array having m rows and n columns. The number m and the number n are integers of two or more. The number of rows and the number of columns do not need to be the same. In FIG. 10, an example in which the number of rows is two and the number of columns is three is shown. This is only an example and the present invention is not limited to this. The pixel 3 outputs a first pixel signal having a reset level and a second pixel signal having a signal level.

The vertical selection unit 4 selects the pixel 3 disposed in the row direction in the array of the plurality of pixels 3. The vertical selection unit 4 controls an operation of the selected pixel 3. The vertical selection unit 4 outputs control signals for controlling the plurality of pixels 3 for each row in the array of the plurality of pixels 3. The control signals output from the vertical selection unit 4 include a transfer pulse φTx_i, a reset pulse φRst_i and a selection pulse φSel_i. The number i is one or two. In FIG. 10, the transfer pulse φTx_1, the reset pulse φRst_1, and the selection pulse φSel_1 are output to the pixels 3 of the first row. In FIG. 10, the transfer pulse φTx_2, the reset pulse φRst_2, and the selection pulse φSel_2 are output to the pixels 3 of the second row.

The column circuit unit 5 includes a plurality of column circuits 8. The column circuit 8 is disposed for each column in the array of the plurality of pixels 3. The column circuit 8 is connected to a vertical signal line 70 extending in the vertical direction, i.e., the column direction. The vertical signal line 70 is disposed for each column in the array of the plurality of pixels 3. The vertical signal line 70 is connected to the pixels 3 of each column. The column circuit 8 is electrically connected to the pixels 3 through the vertical signal line 70. The column circuit 8 generates a first signal that is based on the first pixel signal of the reset level output from the pixel 3 and generates a second signal that is based on the second pixel signal of the signal level output from the pixel 3.

The column circuit 8 is connected to a first horizontal signal line 71 and a second horizontal signal line 72 extending in the horizontal direction, i.e., the row direction. A selection pulse HSR[k] is output from the horizontal selection unit 6 to the column circuit 8 corresponding to a column k. The number k is any one of one, two, and three. The column circuit 8 selected on the basis of the selection pulse HSR[k] outputs the first signal to the first horizontal signal line 71 and outputs the second signal to the second horizontal signal line 72.

One column circuit 8 may be disposed for a plurality of columns in the array of the plurality of pixels 3 and one column circuit 8 may be used in the plurality of columns in a time-division manner. Accordingly, the column circuit 8 has only to be disposed so as to correspond to one or more columns in the array of the plurality of pixels 3.

The first horizontal signal line 71 and the second horizontal signal line 72 are connected to the output unit 7. A first current source 11 is connected to the first horizontal signal line 71 and a second current source 12 is connected to the second horizontal signal line 72. The horizontal selection unit 6 sequentially selects the column circuits 8 by using the selection pulses HSR[1] to HSR[3]. The first signal and the second signal output from the column circuit 8 selected by the horizontal selection unit 6 are transferred to the output unit 7.

The output unit 7 includes the AD conversion circuit 10 shown in FIG. 1. In the AD conversion circuit 10, the first terminal Tswp1 of the switch SWP is connected to the first horizontal signal line 71 and the first terminal Tswn1 of the switch SWN is connected to the second horizontal signal line 72. The AD conversion circuit 10 generates digital data DOUT on the basis of the first signal and the second signal. The output unit 7 outputs the digital data DOUT to a subsequent-stage circuit.

Figure 11:
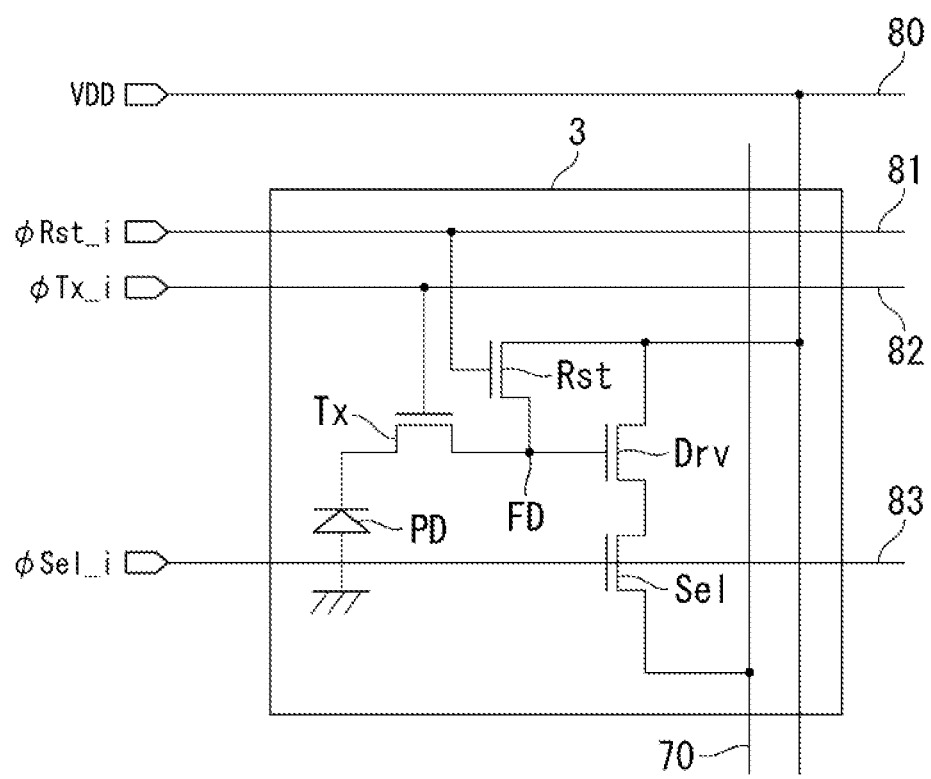
FIG. 11 is a circuit diagram showing a configuration of a pixel in the imaging device according to the fourth embodiment of the present invention.

FIG. 11 shows a configuration of the pixel 3. The pixel 3 shown in FIG. 11 includes a photoelectric conversion unit PD, a transfer transistor Tx, a charge storage portion FD, a reset transistor Rst, an amplification transistor Dry, and a selection transistor Sel. Each transistor shown in FIG. 11 is an NMOS transistor. Each transistor shown in FIG. 11 includes a gate terminal, a source terminal, and a drain terminal.

For example, the photoelectric conversion unit PD is a photodiode. The photoelectric conversion unit PD includes a first terminal and a second terminal. The first terminal of the photoelectric conversion unit PD is connected to the ground. The second terminal of the photoelectric conversion unit PD is connected to the transfer transistor Tx.

The source terminal of the transfer transistor Tx is connected to the second terminal of the photoelectric conversion unit PD. The drain terminal of the transfer transistor Tx is connected to the charge storage portion PD. The gate terminal of the transfer transistor Tx is connected to a control signal line 82. The control signal line 82 extends in the row direction in the array of the plurality of pixels 3 and is connected to the vertical selection unit 4. The control signal line 82 transmits the transfer pulse φTx_i.

The drain terminal of the reset transistor Rst is connected to a power source line 80. The power source line 80 is connected to a power source that outputs a power source voltage VDD. The source terminal of the reset transistor Rst is connected to the charge storage portion FD. The gate terminal of the reset transistor Rst is connected to a control signal line 81. The control signal line 81 extends in the row direction in the array of the plurality of pixels 3 and is connected to the vertical selection unit 4. The control signal line 81 transmits the reset pulse φRst_i.

The drain terminal of the amplification transistor Drv is connected to the power source line 80. The source terminal of the amplification transistor Dry is connected to the selection transistor Sel. The gate terminal of the amplification transistor Dry is connected to the charge storage portion FD.

The drain terminal of the selection transistor Sel is connected to the source terminal of the amplification transistor Drv. The source terminal of the selection transistor Sel is connected to the vertical signal line 70. The gate terminal of the selection transistor Sel is connected to a control signal line 83. The control signal line 83 extends in the row direction in the array of the plurality of pixels 3 and is connected to the vertical selection unit 4. The control signal line 83 transfers the selection pulse ɸSel_i.

The transfer transistor Tx is controlled on the basis of the transfer pulse ɸTx_i output from the vertical selection unit 4. The transfer transistor Tx of the pixel 3 of the first row is controlled on the basis of the transfer pulse ɸTx_1 and the transfer transistor Tx of the pixel 3 of the second row is controlled on the basis of the transfer pulse ɸTx_2. The reset transistor Rst is controlled on the basis of the reset pulse ɸRst_i output from the vertical selection unit 4. The reset transistor Rst of the pixel 3 of the first row is controlled on the basis of the reset pulse ɸRst_1 and the reset transistor Rst of the pixel 3 of the second row is controlled on the basis of the reset pulse ɸRst_2. The selection transistor Sel is controlled on the basis of the selection pulse Sel_i output from the vertical selection unit 4. The selection transistor Sel of the pixel 3 of the first row is controlled on the basis of the selection pulse ɸSel_1 and the selection transistor Sel of the pixel 3 of the second row is controlled on the basis of the selection pulse ɸSel_2.

The photoelectric conversion unit PD generates signal charge that is based on the amount of incident light. The transfer transistor Tx transfers the signal charge generated by the photoelectric conversion unit PD to the charge storage portion FD. For example, the charge storage portion FD is a floating diffusion. The charge storage portion FD stores the signal charge transferred by the transfer transistor Tx. The reset transistor Rst resets the charge storage portion FD to a predetermined voltage. The amplification transistor Dry generates a pixel signal by amplifying a signal that is based on the voltage of the charge storage portion FD. The selection transistor Sel outputs the pixel signal to the vertical signal line 70. The vertical signal line 70 is disposed for each column in the array of the plurality of pixels 3. The first pixel signal having the reset level and the second pixel signal having the signal level are output from the pixel 3. The signal level has a voltage that is based on the signal charge generated by the photoelectric conversion unit PD. The reset level has a voltage that is based on the voltage of the charge storage portion FD when the voltage of the charge storage portion F) is reset.

Figure 12:
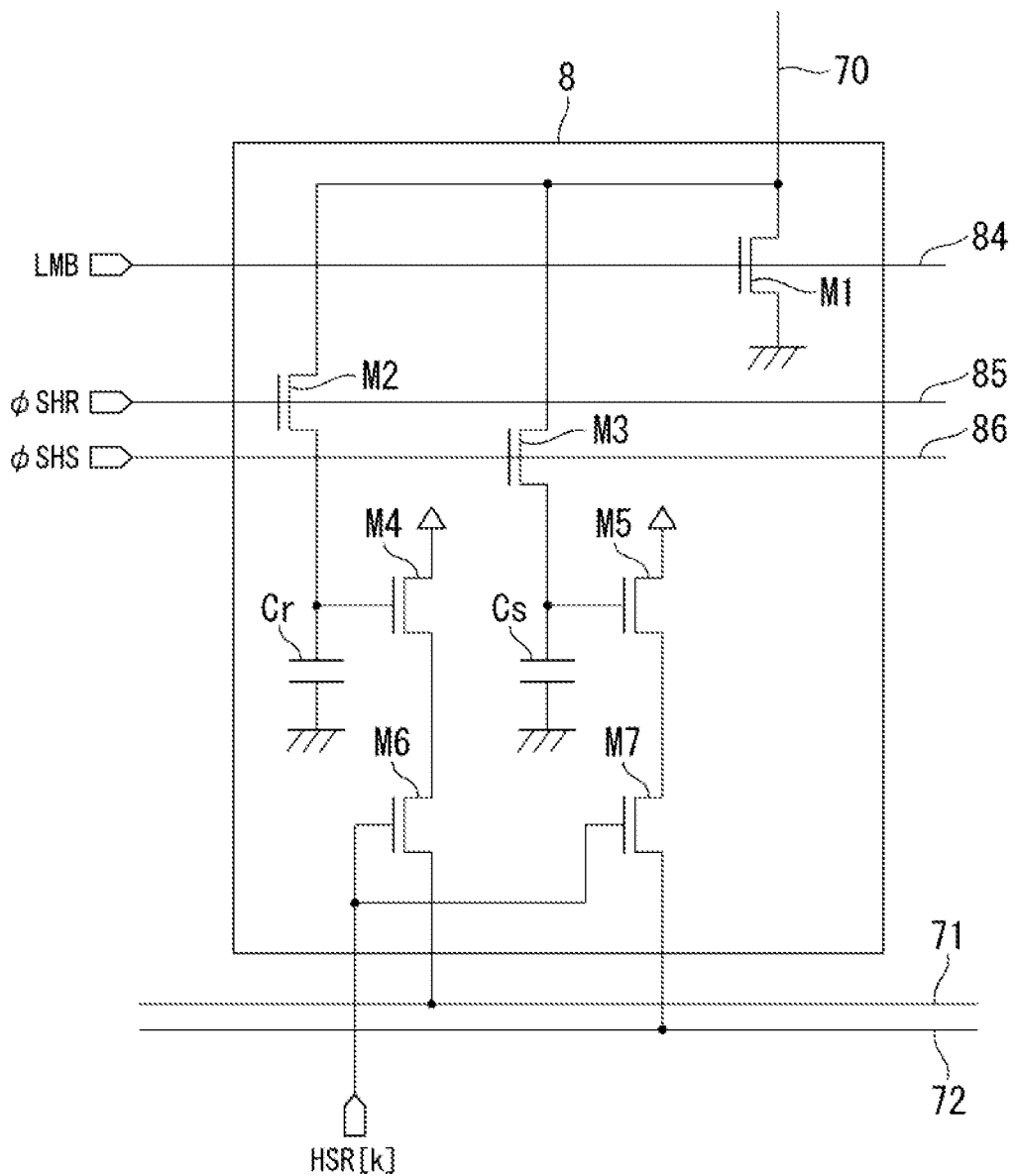
FIG. 12 is a circuit diagram showing a configuration of a column circuit in the imaging device according to the fourth embodiment of the present invention.

FIG. 12 shows a configuration of the column circuit 8. The column circuit 8 shown in FIG. 12 includes a transistor M L, a sample transistor M2, a sample transistor M3, an amplification transistor M4, an amplification transistor M5, a column selection transistor M6, a column selection transistor M7, a capacitance element Cr, and a capacitance element Cs. Each transistor shown in FIG. 12 is an NMOS transistor. Each transistor shown in FIG. 12 includes a gate terminal, a source terminal, and a drain terminal.

The drain terminal of the transistor M1 is connected to the vertical signal line 70. The source terminal of the transistor M1 is connected to the ground. The gate terminal of the transistor M1 is connected to a power source line 84. The power source line 84 is connected to a power source that outputs a predetermined voltage LMB.

The drain terminal of the sample transistor M2 is connected to the vertical signal line 70. The source terminal of the sample transistor M2 is connected to the capacitance element Cr. The gate terminal of the sample transistor M2 is connected to a control signal line 85. The control signal line 85 extends in the row direction in the array of the plurality of pixels 3. The control signal line 85 transfers a sample-and-hold pulse ɸSHR.

The drain terminal of the sample transistor M3 is connected to the vertical signal line 70. The source terminal of the sample transistor M3 is connected to the capacitance element Cs. The gate terminal of the sample transistor M3 is connected to a control signal line 86. The control signal line 86 extends in the row direction in the array of the plurality of pixels 3. The control signal line 86 transfers a sample-and-hold pulse ɸSHS.

Each of the capacitance element Cr and the capacitance element Cs includes a first terminal and a second terminal. The first terminal of the capacitance element Cr is connected to the source terminal of the sample transistor M2. The second terminal of the capacitance element Cr is connected to the ground. The first terminal of the capacitance element Cs is connected to the source terminal of the sample transistor M3. The second terminal of the capacitance element Cs is connected to the ground.

The power source voltage VDD is input to the drain terminal of the amplification transistor M4. The source terminal of the amplification transistor M4 is connected to the column selection transistor M6. The gate terminal of the amplification transistor M4 is connected to the first terminal of the capacitance element Cr.

The power source voltage VDD is input to the drain terminal of the amplification transistor M5. The source terminal of the amplification transistor M5 is connected to the column selection transistor M7. The gate terminal of the amplification transistor M5 is connected to the first terminal of the capacitance element Cs.

The drain terminal of the column selection transistor M6 is connected to the source terminal of the amplification transistor M4. The source terminal of the column selection transistor M6 is connected to the first horizontal signal line 71. The gate terminal of the column selection transistor M6 is connected to the horizontal selection unit 6.

The drain terminal of the column selection transistor M7 is connected to the source terminal of the amplification transistor M5. The source terminal of the column selection transistor M7 is connected to the second horizontal signal line 72. The gate terminal of the column selection transistor M7 is connected to the horizontal selection unit 6.

An operation of the sample transistor M2 is controlled on the basis of the sample-and-hold pulse ɸSHR. An operation of the sample transistor M3 is controlled on the basis of the sample-and-hold pulse ɸSHS. An operation of each of the column selection transistor M6 and the column selection transistor M7 is controlled on the basis of the selection pulse HSR[k] output from the horizontal selection unit 6. The number k is any one of one, two, and three.

The transistor M1 functions as a current source. The sample transistor M2 samples the first pixel signal of the reset level output from the pixel 3 to the vertical signal line 70. The sample transistor M3 samples the second pixel signal of the signal level output from the pixel 3 to the vertical signal line 70. The capacitance element Cr holds the first pixel signal of the reset level sampled by the sample transistor M2. The capacitance element Cs holds the second pixel signal of the signal level sampled by the sample transistor M3. The capacitance element Cr and the capacitance element Cs are sample capacitors.

The amplification transistor M4 generates the first signal by amplifying the first pixel signal of the reset level held in the capacitance element Cr. In other words, the amplification transistor M4 generates the first signal that is based on the first pixel signal of the reset level. The amplification transistor M5 generates the second signal by amplifying the second pixel signal of the signal level held in the capacitance element Cs. In other words, the amplification transistor M5 generates the second pixel signal that is based on the second pixel signal of the signal level. The column selection transistor M6 outputs the first signal generated by the amplification transistor M4 to the first horizontal signal line 71. The column selection transistor M7 outputs the second signal generated by the amplification transistor M5 to the second horizontal signal line 72. The column selection transistor M6 and the column selection transistor M7 of the first column are controlled on the basis of the selection pulse HSR[1]. The column selection transistor M6 and the column selection transistor M7 of the second column are controlled on the basis of the selection pulse HSR[2]. The column selection transistor M6 and the column selection transistor M7 of the third column are controlled on the basis of the selection pulse HSR[3].

Figure 13:
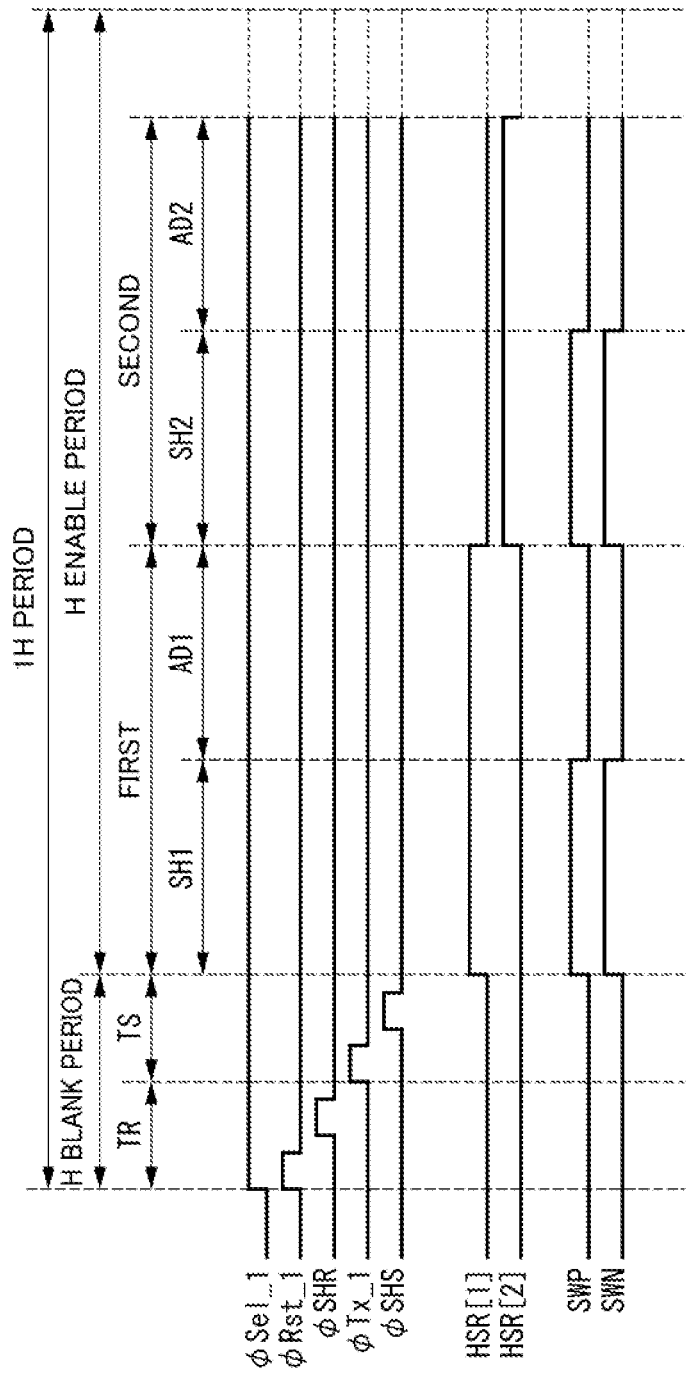
FIG. 13 is a timing chart showing an operation of the imaging device according to the fourth embodiment of the present invention.

An operation of the imaging device 1 will be described. FIG. 13 shows the operation of the imaging device 1. Hereinafter, an operation in which the imaging device 1 reads a pixel signal will be described. As a representative example, an operation in which the imaging device 1 reads the pixel signal from the pixel 3 of the first row in the array of the plurality of pixels 3 will be described.

In FIG. 13, waveforms of the selection pulse φSel_1, the reset pulse φRst_1, the sample-and-hold pulse φSHR, the transfer pulse φTx_1, the sample-and-hold pulse φSHS, the selection pulse HSR[1], and the selection pulse HSR[2] are shown. In FIG. 13, a waveform of a control signal of each of the switch SWP and the switch SWN is shown. The horizontal direction in FIG. 13 indicates time and the vertical direction in FIG. 13 indicates voltage.

A 1H period in which a pixel signal of one row is read includes an H blank period and an H enable period. The H blank period includes a first reading period TR in which the first pixel signal of the reset level is read and a second reading period TS in which the second pixel signal of the signal level is read. Before the 1H period is started, the voltage level of each of the selection pulse φSel_1, the reset pulse Rst_1, the sample-and-hold pulse SHR, the transfer pulse φTx_1, the sample-and-hold pulse SHS, the selection pulse HSR[1], and the selection pulse HSR[2] is the low level.

The H enable period includes a plurality of periods in which the AD conversion circuit 10 sequentially performs AD conversion a plurality of times. A period in which AD conversion of each time is performed includes a sample-and-hold period and an AD conversion period. Before the AD conversion of the first time is performed, the voltage level of the control signal of each of the switch SWP and the switch SWN is the low level.

When the H blank period is started, the voltage level of the selection pulse φSel_1 output from the vertical selection unit 4 to the pixel 3 of the first row changes front the low level to the high level. Therefore, the state of the selection transistor Sel becomes the ON state. In this way, the pixel 3 of the first row is selected in the first reading period TR.

(Reading of Reset Level)

The voltage level of the reset pulse φRst_1 output from the vertical selection unit 4 to the pixel 3 of the first row changes from the low level to the high level. Therefore, the state of the reset transistor Rst becomes the ON state. In this way, the charge storage portion FD is reset and the first pixel signal of the reset level is output to the vertical signal line 70. Thereafter, the voltage level of the reset pulse Rst_1 changes from the high level to the low level. Therefore, the state of the reset transistor Rst becomes the OFF state.

Thereafter, the voltage level of the sample-and-hold pulse SHR changes from the low level to the high level. In this way, the state of the sample transistor M2 becomes the ON state. Thereafter, the voltage level of the sample-and-hold pulse φSHR changes front the high level to the low level. In this way, the state of the sample transistor M2 becomes the OFF state. Therefore, the first pixel signal of the reset level is held in the capacitance element Cr.

(Reading of Signal Level)

The voltage level of the transfer pulse φTx_1 output from the vertical selection unit 4 to the pixel 3 of the first row changes from the low level to the high level in the second reading period TS. Therefore, the state of the transfer transistor Tx becomes the ON state. In this way, the signal charge of the photoelectric conversion unit PD is transferred to the charge storage portion FD and the second pixel signal of the signal level is output to the vertical signal line 70. Thereafter, the voltage level of the transfer pulse φTx_1 changes from the high level to the low level. Therefore, the state of the transfer transistor Tx becomes the OFF state.

Thereafter, the voltage level of the sample-and-hold pulse φSHS changes from the low level to the high level. Therefore, the state of the sample transistor M3 becomes the ON state. Thereafter, the voltage level of the sample-and-hold pulse φSHS changes from the high level to the low level. Therefore, the state of the sample transistor M3 becomes the OFF state. In this way, the second pixel signal of the signal level is held in the capacitance element Cs.

When the second reading period TS is completed, the H enable period is started and the AD conversion of the first time is started. At this time, the voltage level of the selection pulse HSR[1] output from the horizontal selection unit 6 to the column circuit 8 of the first column changes from the low level to the high level. Therefore, the state of each of the column selection transistor M6 and the column selection transistor M7 becomes the ON state. In this way, the first signal, which is based on the first pixel signal of the reset level of the pixel 3 in the first row and the first column, is output to the first horizontal signal line 71. At the same time, the second signal, which is based on the second pixel signal of the signal level of the pixel 3 in the first row and the first column, is output to the second horizontal signal line 72. Thereafter, the voltage level of the selection pulse HSR[I] changes from the high level to the low level. Therefore, the state of each of the column selection transistor M6 and the column selection transistor M7 becomes the OFF state. According to the above-described operation, the first signal, which is based on the first pixel signal of the pixel 3 in the first row and the first column, is read and the second signal, which is based on the second pixel signal of the pixel 3 in the first row and the first column, is read.

The period in which the AD conversion of the first time is performed includes a sample-and-hold period SH1 and an AD conversion period AD1. When the sample-and-hold period SH1 is started, the voltage level of the control signal of each of the switch SWP and the switch SWN becomes the high level. In this way, the state of each of the switch SWP and the switch SWN becomes the ON state. Since the state of each of the switch SWP and the switch SWN is the ON state, the first signal INP is sampled by the switch SWP and the second signal INN is sampled by the switch SWN.

When the sample-and-hold period SH1 is completed, the voltage level of the control signal of each of the switch SWP and the switch SWN becomes the low level. In this way, the state of each of the switch SWP and the switch SWN becomes the OFF state. Since the state of each of the switch SWP and the switch SWN becomes the OFF state, the first signal INP is held in the capacitance element C1 and the second signal INN is held in the plurality of capacitance elements of the DA conversion unit 30.

After the sample-and-hold period SH1 is completed, the AD conversion period AD1 is started. An operation of the AD conversion circuit 10 in the AD conversion period AD1 is similar to that shown in FIG. 2. The processing in Steps S4 to S8 shown in FIG. 2 may be executed in the H blank period (and a V blank period).

When the operation shown in FIG. 2 is completed, the AD conversion period AD1 is completed. After the AD conversion period AD) is completed, the AD conversion of the second time is performed. The period in which the AD conversion of the second time is performed includes a sample-and-hold period SH2 and an AD conversion period AD2. An operation in the sample-and-hold period SH2 is similar to that in the sample-and-hold period SH1. An operation in the AD conversion period AD2 is similar to that in the AD conversion period AD1. An operation after the AD conversion period AD2 is completed will not be described.

When the voltage level of the selection pulse HSR[1] changes from the high level to the low level, the AD conversion of the first time is completed and the AD conversion of the second time is started. At this time, the voltage level of the selection pulse HSR[2] changes from the low level to the high level. In this way, as with the above-described operation, the first signal, which is based on the first pixel signal of the pixel 3 in the first row and the second column, is read and the second signal, which is based on the second pixel signal of the pixel 3 in the first row and the second column, is read.

The period in which the AD conversion of the second time is performed includes a sample-and-hold period SH2 and an AD conversion period AD2. An operation of the AD conversion circuit 10 in the sample-and-hold period SH2 and the AD conversion period AD2 is similar to that of the AD conversion circuit 10 in the sample-and-hold period SH1 and the AD conversion period AD1.

When the voltage level of the selection pulse HSR[2] changes from the high level to the low level, the AD conversion of the second time is completed and the AD conversion of the third time is started. The AD conversion of the third time is not shown in FIG. 13.

After the AD conversion of the third time is completed, the voltage level of the selection pulse ϕSel_1 changes from the high level to the low level. Therefore, the state of the selection transistor Sel becomes the OFF state. In this way, the selection of the pixel 3 of the first row is canceled and the operation in which the pixel signal is read from the pixel 3 of the first row is completed. Following the operation shown in FIG. 13, the imaging device 1 reads the pixel signal from the pixel 3 of the second row. This operation is similar to that shown in FIG. 13.

The imaging device 1 according to the fourth embodiment includes the AD conversion circuit 10, the imaging unit 2, and the column circuit 8. The imaging unit 2 includes the plurality of pixels 3 disposed in a matrix shape. Each pixel 3 included in the plurality of pixels 3 outputs the first pixel signal having the reset level and the second pixel signal having the signal level. The column circuit 8 is disposed so as to correspond to one or more columns in the array of the plurality of pixels 3 and is electrically connected to the imaging unit 2. The column circuit 8 generates the first signal that is based on the first pixel signal and generates the second signal that is based on the second pixel signal.

The imaging device 1 may include any one of the AD conversion circuit 11 shown in FIG. 7 and the AD conversion circuit 12 shown in FIG. 8 instead of the A) conversion circuit 10.

The imaging device according to each aspect of the present invention does not need to include a configuration other than a configuration corresponding to each of the AD conversion circuit 10, the imaging unit 2, and the column circuit S.

The imaging device 1 according to the fourth embodiment includes the AD conversion circuit 10 that can improve the accuracy of the digital data. Therefore, the imaging device 1 can improve the accuracy of the digital data.

Fifth Embodiment

Figure 14:
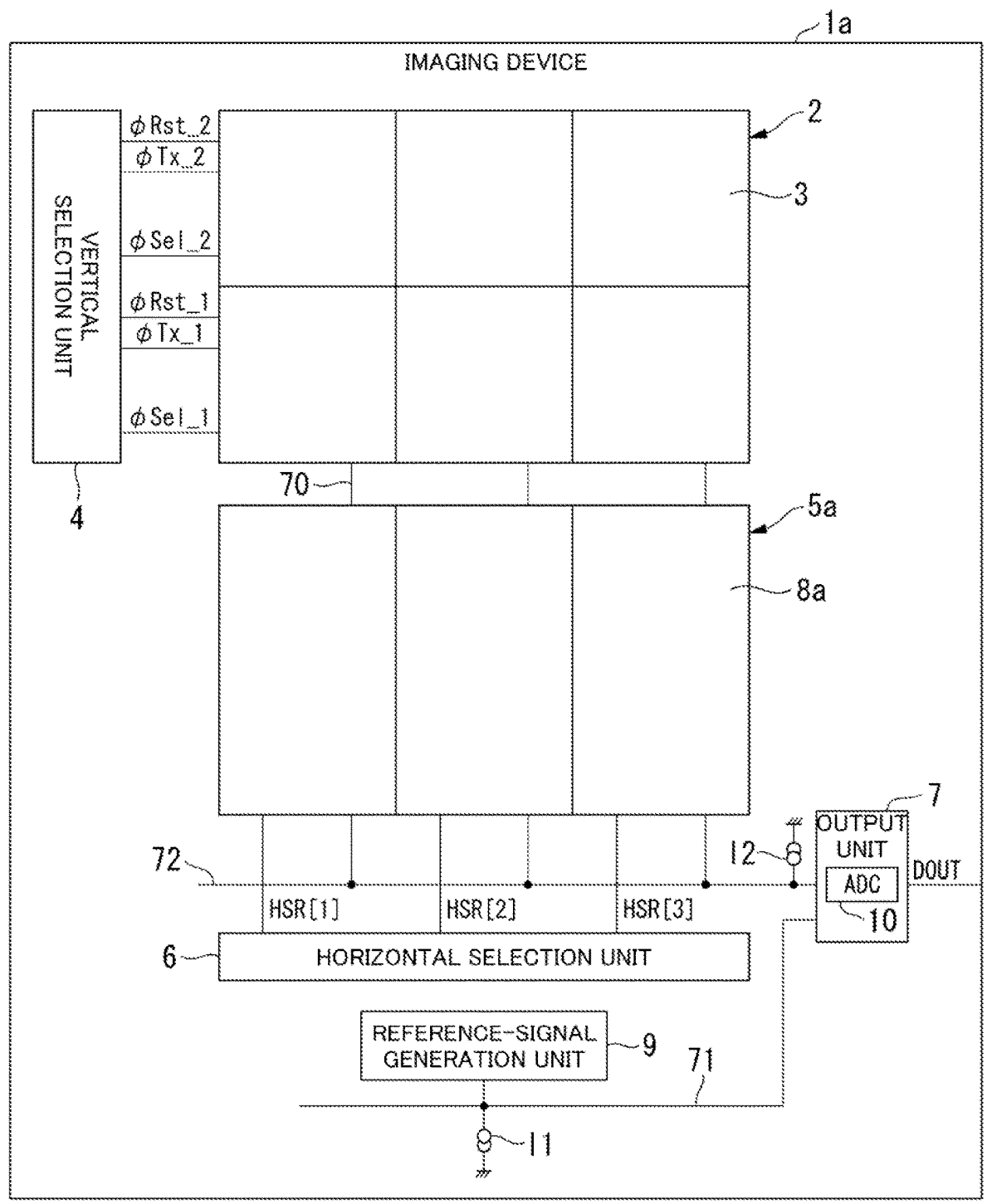
FIG. 14 is a block diagram showing a configuration of an imaging device according to a fifth embodiment of the present invention.

FIG. 14 shows a configuration of an imaging device 1a according to a fifth embodiment of the present invention. The same configuration as that shown in FIG. 10 will not be described.

The imaging device 1a includes a reference-signal generation unit 9 (signal generation circuit) in addition to the configuration shown in FIG. 10. In the imaging device 1a, the column circuit unit 5 shown in FIG. 10 is changed to a column circuit unit Sa. In the column circuit unit 5a, the column circuit 8 shown in FIG. 10 is changed to a column circuit 8a. The column circuit unit 5a includes a plurality of column circuits 8a. The column circuit 8a is disposed for each column in the array of the plurality of pixels 3. The column circuit 8a is connected to the vertical signal line 70. The column circuit 8a is electrically connected to the pixel 3 through the vertical signal line 70. The column circuit 8a generates a difference signal (second signal) that is based on the difference between the reset level and the signal level output from the pixel 3. The column circuit 8a is connected to the second horizontal signal line 72. A selection pulse HSR[k] is output from the horizontal selection unit 6 to the column circuit 8a corresponding to a column k. The number k is any one of one, two, and three. The column circuit 8a selected on the basis of the selection pulse HSR[k] outputs the second signal to the second horizontal signal line 72.

Figure 15:
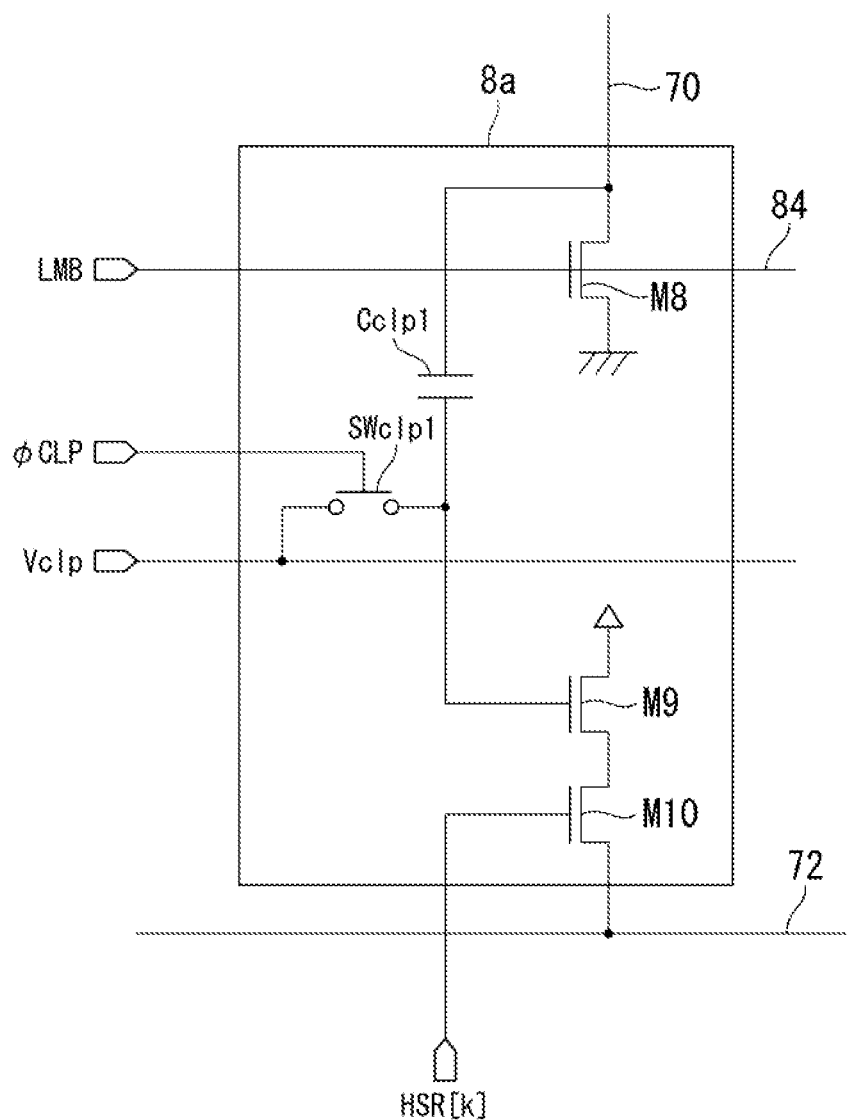
FIG. 15 is a circuit diagram showing a configuration of a column circuit in the imaging device according to the fifth embodiment of the present invention.

FIG. 15 shows a configuration of the column circuit 8a. The column circuit 8a shown in FIG. 15 includes a transistor M8, a capacitance element Cclp1, a clamp switch SWclp1, an amplification transistor M9, and a column selection transistor M0. Each transistor shown in Fi. 15 is an NMOS transistor. Each transistor shown in FIG. 15 includes a gate terminal, a source terminal, and a drain terminal.

The drain terminal of the transistor M8 is connected to the vertical signal line 70. The source terminal of the transistor M8 is connected to the ground. The gate terminal of the transistor M8 is connected to the power source line 84. The power source line 84 is connected to a power source that outputs a predetermined voltage LMB.

The capacitance element Cclp1 includes a first terminal and a second terminal. The first terminal of the capacitance element Cclp1 is connected to the vertical signal line 70. The second terminal of the capacitance element Cclp1 is connected to the clamp switch SWclp1 and the amplification transistor M9.

The clamp switch SWclp1 includes a first terminal and a second terminal. The first terminal of the clamp switch SWclp1 is connected to the second terminal of the capacitance element Cclp1. A clamp voltage Vclp is input to the second terminal of the clamp switch SWclp1.

The power source voltage VDD is input to the drain terminal of the amplification transistor M9. The source terminal of the amplification transistor M9 is connected to the column selection transistor M10. The gate terminal of the amplification transistor M9 is connected to the second terminal of the capacitance element Cclp1.

The drain terminal of the column selection transistor M10 is connected to the source terminal of the amplification transistor M9. The source terminal of the column selection transistor M10 is connected to the second horizontal signal line 72. The gate terminal of the column selection transistor M10 is connected to the horizontal selection unit 6.

An operation of the clamp switch SWclp1 is controlled on the basis of a clamp pulse ϕCLP. An operation of the column selection transistor M10 is controlled on the basis of a selection pulse HSR[k] output from the horizontal selection unit 6. The number k is any one of one, two, and three.

The transistor M8 functions as a current source. The state of the clamp switch SWclp1 becomes any one of an ON state and an OFF state. When the state of the clamp switch SWclp1 is the ON state, the capacitance element Cclp1 is clamped to the clamp voltage Vclp. After the capacitance element Cclp1 is clamped, the capacitance element Cclp1 holds the pixel signal that is based on the difference between the reset level and the signal level output from the pixel 3 to the vertical signal line 70. The capacitance element Cclp1 is a clamp capacitor. The amplification transistor M9 generates the difference signal (second signal) that is based on the difference between the reset level and the signal level by amplifying the pixel signal held in the capacitance element Cclp1. The column selection transistor M10 outputs the second signal generated by the amplification transistor M9 to the second horizontal signal line 72. The column selection transistor M10 of the first column is controlled on the basis of a selection pulse HSR[1]. The column selection transistor M10 of the second column is controlled on the basis of a selection pulse HSR[2]. The column selection transistor M10 of the third column is controlled on the basis of a selection pulse HSR[3].

Figure 16:
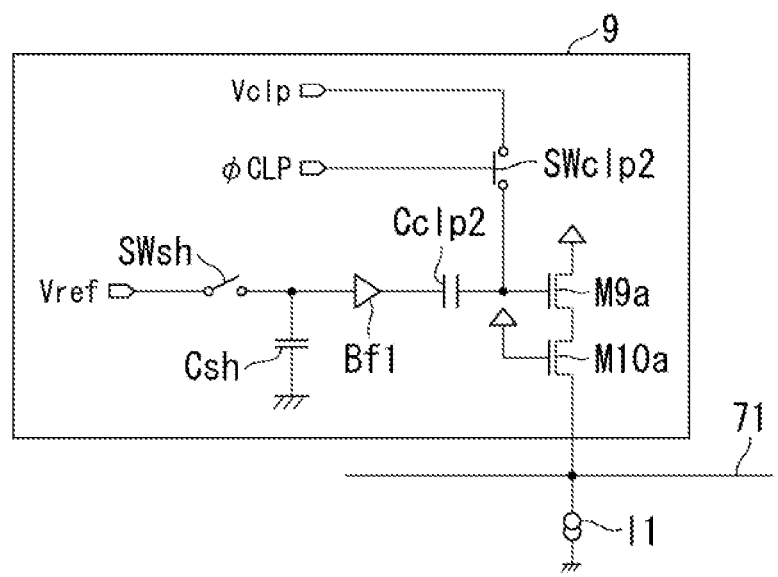
FIG. 16 is a circuit diagram showing a configuration of a reference-signal generation unit in the imaging device according to the fifth embodiment of the present invention.

FIG. 16 shows a configuration of the reference-signal generation unit 9. The reference-signal generation unit 9 shown in FIG. 16 includes a sample switch SWsh, a capacitance element Csh, a buffer Bf1, a capacitance element Cclp2, a clamp switch SWclp2, an amplification transistor M9a, and a selection transistor M10a.

The sample switch SWsh includes a first terminal and a second terminal. A reference voltage Vref is input to the first terminal of the sample switch SWsh. The reference voltage Vref is generated on the basis of the power source voltage VDD. The second terminal of the sample switch SWsh is connected to the capacitance element Csh.

The capacitance element Csh includes a first terminal and a second terminal. The first terminal of the capacitance element Csh is connected to the second terminal of the sample switch SWsh. The second terminal of the capacitance element Csh is connected to the ground.

The buffer Bf1 includes a first terminal and a second terminal. The first terminal of the buffer Bf1 is connected to the second terminal of the sample switch SWsh and the first terminal of the capacitance element Csh. The second terminal of the buffer Bf1 is connected to the capacitance element Cclp2.

The capacitance element Cclp2 includes a first terminal and a second terminal. The first terminal of the capacitance element Cclp2 is connected to the second terminal of the buffer Bf1. The second terminal of the capacitance element Cclp2 is connected to the clamp switch SWclp2 and the amplification transistor M9a.

The clamp switch SWclp2 includes a first terminal and a second terminal. The first terminal of the clamp switch SWclp2 is connected to the second terminal of the capacitance element Cclp2. The clamp voltage Vclp is input to the second terminal of the clamp switch SWclp2.

The amplification transistor M9a and the selection transistor M10a are NMOS transistors. Each of the amplification transistor M9a and the selection transistor M10a includes a gate terminal, a source terminal, and a drain terminal. The power source voltage VDD is input to the drain terminal of the amplification transistor M9a. The source terminal of the amplification transistor M9a is connected to the selection transistor M10a. The gate terminal of the amplification transistor M9a is connected to the second terminal of the capacitance element Cclp2.

The drain terminal of the selection transistor M10a is connected to the source terminal of the amplification transistor M9a. The source terminal of the selection transistor M10a is connected to the first horizontal signal line 71. The power source voltage VDD is input to the gate terminal of the selection transistor M10a.

The state of the sample switch SWsh becomes any one of an ON state and an OFF state. When the state of the sample switch SWsh is the ON state, the sample switch SWsh samples the reference voltage Vref. When the state of the sample switch SWsh changes from the ON state to the OFF state, the reference voltage Vref sampled by the sample switch SWsh is held in the capacitance element Cclp2 through the buffer Bf1.

The state of the clamp switch SWclp2 becomes any one of an ON state and an OFF state. When the state of the clamp switch SWclp2 is the ON state, the capacitance element Cclp2 is clamped to the clamp voltage Vclp. The operation of the clamp switch SWclp2 is controlled on the basis of the clamp pulse ϕCLP.

The capacitance element Cclp2 holds the voltage (Vclp) clamped by the clamp switch SWclp2. The capacitance element Cclp2 is a clamp capacitor. The amplification transistor M9a generates a reference signal by amplifying the voltage of the second terminal of the capacitance element Cclp2. In other words, the amplification transistor M9a generates the reference signal that is based on the voltage of the second terminal of the capacitance element Cclp2. The selection transistor M10a outputs the reference signal generated by the amplification transistor M9a to the first horizontal signal line 71. This reference signal is the first signal.

The capacitance element Cclp2, the clamp switch SWclp2, the amplification transistor M9a, and the selection transistor M10a in the reference-signal generation unit 9 are constituted similarly to the capacitance element Cclp1, the clamp switch SWclp1, the amplification transistor M9, and the column selection transistor M10 in the column circuit 8a, respectively.

Figure 17:
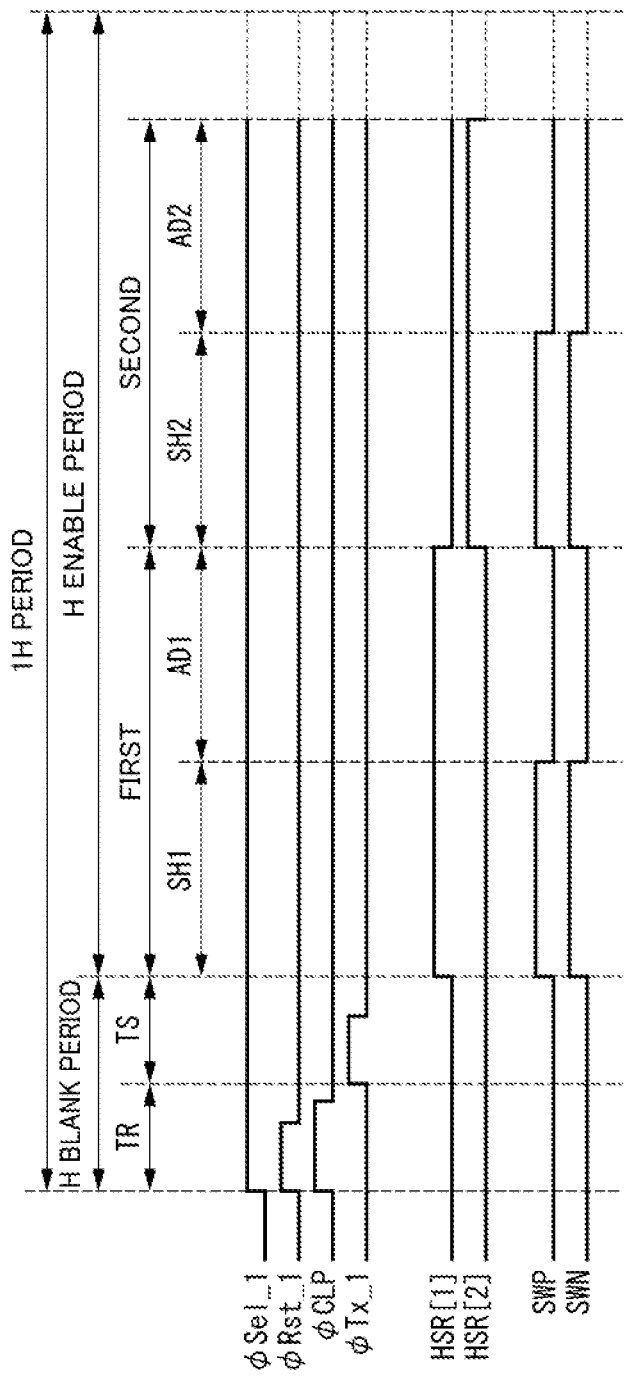
FIG. 17 is a timing chart showing an operation of the imaging device according to the fifth embodiment of the present invention.

An operation of the imaging device 1a will be described. FIG. 17 shows the operation of the imaging device 1a. Hereinafter, an operation in which the imaging device 1a reads a pixel signal will be described. As a representative example, an operation in which the imaging device 1a reads the pixel signal from the pixel 3 of the first row in the array of the plurality of pixels 3 will be described.

In FIG. 17, waveforms of the selection pulse φSel_1, the reset pulse φRst_1, the clamp pulse φCLP, the transfer pulse φTx_1, the selection pulse HSR[1], and the selection pulse HSR[2] are shown. In FIG. 17, a waveform of a control signal of each of the switch SWP and the switch SWN is shown. The horizontal direction in FIG. 17 indicates time and the vertical direction in FIG. 17 indicates voltage.

A 1H period in which a pixel signal of one row is read includes an H blank period and an H enable period. The H blank period includes a first reading period TR in which the first pixel signal of the reset level is read and a second reading period TS in which the second pixel signal of the signal level is read. Before the 1H period is started, the voltage level of each of the selection pulse φSel_1, the reset pulse φRst_1, the clamp pulse φCLP, the transfer pulse φTx_1, the selection pulse HSR[1], and the selection pulse HSR[2] is the low level.

The H enable period includes a plurality of periods in which the AD conversion circuit 10 sequentially performs AD conversion a plurality of times. A period in which AD conversion of each time is performed includes a sample-and-hold period and an AD conversion period. Before the AD conversion of the first time is performed, the voltage level of the control signal of each of the switch SWP and the switch SWN is the low level.

When the H blank period is started, the voltage level of the selection pulse φSel_1 output from the vertical selection unit 4 to the pixel 3 of the first row changes from the low level to the high level. Therefore, the state of the selection transistor Sel becomes the ON state. In this way, the pixel 3 of the first row is selected in the first reading period TR. At the same time, the voltage level of the sample-and-hold pulse φSWsh changes from the low level to the high level. Therefore, the state of the sample switch SWsh becomes the ON state. Thereafter, the voltage level of the sample-and-hold pulse φSWsh changes from the high level to the low level. Therefore, the state of the sample switch SWsh becomes the OFF state. In this way, the reference voltage Vref sampled by the sample switch SWsh is held in the capacitance element Cclp2 through the buffer Bf1

(Reading of Reset Level)

The voltage level of the reset pulse φRst_1 output from the vertical selection unit 4 to the pixel 3 of the first row changes from the low level to the high level. Therefore, the state of the reset transistor Rst becomes the ON state. In this way, the charge storage portion FD is reset and the first pixel signal of the reset level is output to the vertical signal line 70. Furthermore, the voltage level of the clamp pulse φCLP changes from the low level to the high level. Therefore, the state of each of the clamp switch SWclp1 and the clamp switch SWclp2 becomes the ON state. In this way, the capacitance element Cclp1 and the capacitance element Cclp2 are clamped to the clamp voltage Vclp.

Thereafter, the voltage level of the reset pulse φRst_1 changes from the high level to the low level. Therefore, the state of the reset transistor Rst becomes the OFF state. Thereafter, the voltage level of the clamp pulse φCLP changes from the high level to the low level. Therefore, the state of each of the clamp switch SWclp1 and the clamp switch SWclp2 becomes the OFF state. In this way, the clamp voltage Vclp is held in the capacitance element Cclp1 and the capacitance element Cclp2.

(Reading of Signal Level)

The voltage level of the transfer pulse φTx_1 output from the vertical selection unit 4 to the pixel 3 of the first row changes from the low level to the high level in the second reading period TS. Therefore, the state of the transfer transistor Tx becomes the ON state. In this way, the signal charge of the photoelectric conversion unit PD is transferred to the charge storage portion FD and the second pixel signal of the signal level is output to the vertical signal line 70. Thereafter, the voltage level of the transfer pulse φTx_1 changes from the high level to the low level. Therefore, the state of the transfer transistor Tx becomes the OFF state. In this way, the difference signal, which is based on the difference between the reset level and the signal level, is held in the capacitance element Cclp1.

When the second reading period TS is completed, the H enable period is started and the AD conversion of the first time is started. At this time, the voltage level of the selection pulse HSR[1] output from the horizontal selection unit 6 to the column circuit 8a of the first column changes from the low level to the high level. Therefore, the state of the column selection transistor M10 becomes the ON state. In this way, the difference signal (second signal) that is based on the difference between the reset level and the signal level of the pixel 3 in the first row and the first column is output to the second horizontal signal line 72. Thereafter, the voltage level of the selection pulse HSR[1] changes from the high level to the low level. Therefore, the state of the column selection transistor M10 becomes the OFF state. According to the above-described operation, the second signal, which is based on the difference between the reset level and the signal level of the pixel 3 in the first row and the first column, is read.

The period in which the AD conversion of the first time is performed includes a sample-and-hold period SH1 and an AD conversion period AD1. An operation of the AD conversion circuit 10 in the sample-and-hold period SH1 and the AD conversion period AD1 is similar to that shown in FIG. 13.

When the voltage level of the selection pulse HSR[1] changes from the high level to the low level, the AD conversion of the first time is completed and the AD conversion of the second time is started. At this time, the voltage level of the selection pulse HSR[2] changes from the low level to the high level. In this way, as with the above-described operation, the second signal, which is based on the difference between the reset level and the signal level of the pixel 3 in the first row and the second column, is read.

The period in which the AD conversion of the second time is performed includes a sample-and-hold period SH2 and an AD conversion period AD2. An operation of the AD conversion circuit 10 in the sample-and-hold period SH2 and the AD conversion period AD2 is similar to that of the AD conversion circuit 10 in the sample-and-hold period SH1 and the AD conversion period AD1.

When the voltage level of the selection pulse HSR[2] changes from the high level to the low level, the AD conversion of the second time is completed and the AD conversion of the third time is started. The AD conversion of the third time is not shown in FIG. 17.

After the AD conversion of the third time is completed, the voltage level of the selection pulse φSel_1 changes from the high level to the low level. Therefore, the state of the selection transistor Sel becomes the OFF state. In this way, the selection of the pixel 3 of the first row is canceled and the operation in which the pixel signal is read from the pixel 3 of the first row is completed. Following the operation shown in FIG. 17, the imaging device 1a reads the pixel signal from the pixel 3 of the second row. This operation is similar to that shown in FIG. 17.

The imaging device 1a according to the fifth embodiment includes the Ai) conversion circuit 10, the imaging unit 2, the column circuit 8a, and the reference-signal generation unit 9. The imaging unit 2 includes the plurality of pixels 3 disposed in a matrix shape. Each pixel 3 included in the plurality of pixels 3 outputs the first pixel signal having the reset level and the second pixel signal having the signal level. The column circuit 8a is disposed so as to correspond to one or more columns in the array of the plurality of pixels 3 and is electrically connected to the imaging unit 2. The column circuit 8a generates the second signal on the basis of the difference between the reset level and the signal level. The reference-signal generation unit 9 generates the reference signal (first signal) having a predetermined level.

The imaging device 1a may include any one of the AD conversion circuit 11 shown in FIG. 7 and the AD conversion circuit 12 shown in FIG. 8 instead of the AD conversion circuit 10.

The imaging device according to each aspect of the present invention does not need to include a configuration other than a configuration corresponding to each of the AD conversion circuit 10, the imaging unit 2, the column circuit 8a, and the reference-signal generation unit 9.

The imaging device 1a according to the fifth embodiment includes the AD conversion circuit 10 that can improve the accuracy of the digital data. Therefore, the imaging device 1a can improve the accuracy of the digital data.

Sixth Embodiment

Figure 18:
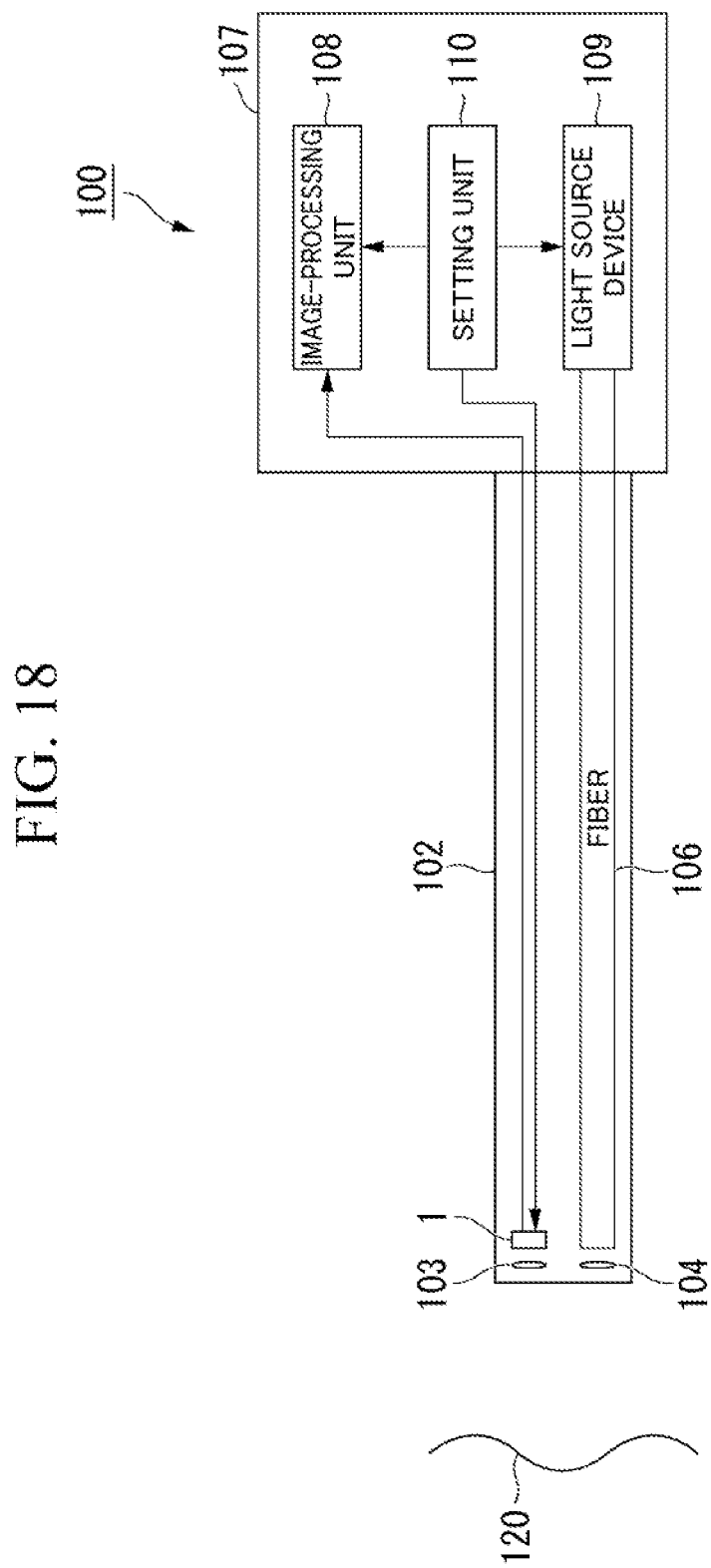
FIG. 18 is a block diagram showing a configuration of an endoscope system according to a sixth embodiment of the present invention.

FIG. 18 shows a configuration of an endoscope system 100 according to a sixth embodiment of the present invention. The endoscope system 100 includes the imaging device 1 according to the fourth embodiment. The endoscope system 100 shown in FIG. 18 includes a scope 102 and a housing 107. The scope 102 includes the imaging device 1, a lens 103, a lens 104, and a fiber 106. The imaging device 1, the lens 103, and the lens 104 are disposed at the tip end part of the scope 102. The housing 107 includes an image-processing unit 108, alight source device 109, and a setting unit 110. The image-processing unit 108 may be constituted by at least one of a processor and a logic circuit. For example, the processor is at least one of a central processing unit (CPU), a digital signal processor (DSP), and a graphics-processing unit (GPU). For example, the logic circuit is at least one of an application-specific integrated circuit (ASIC) and a field-programmable gate array (FPGA).

The lens 103 forms an image of reflected light from a subject 120 on the imaging device 1. The fiber 106 transfers illumination light with which the subject 120 is irradiated. The lens 104 irradiates the subject 120 with the illumination light transferred by the fiber 106. The light source device 109 includes a light source that generates the illumination light with which the subject 120 is irradiated. The image-processing unit 108 generates a captured image by performing predetermined processing on a signal output from the imaging device 1. Here, the image-processing unit 108 may have the function of the correction device. In this case, the A) conversion circuit 10 in the imaging device 1 transmits the first digital data, the second digital data, and the third digital data described above to the image-processing unit 108 via a signal transmission path in the scope 102. The image-processing unit 108 can receive the first digital data, the second digital data, and the third digital data and can correct the first digital data described above. The setting unit 110 controls an imaging mode of the endoscope system 100.

The configuration of the endoscope system 100 is not limited to the above-described configuration. The endoscope system according to each aspect of the present invention does not need to include a configuration corresponding to at least one of the lens 103, the lens 104, the fiber 106, the image-processing unit 108 the light source device 109, and the setting unit 110.

Instead of the imaging device 1, the imaging device 1a shown in FIG. 14 may be used.

The endoscope system 100 according to the sixth embodiment includes the imaging device 1 that can improve the accuracy of the digital data. Therefore, the endoscope system 100 can improve the accuracy of the digital data.

While preferred embodiments of the invention have been described and shown above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An AD conversion device configured to generate digital data on the basis of a difference between a voltage level of a first signal and a voltage level of a second signal, the AD conversion device comprising:
   a comparison circuit that includes a first terminal and a second terminal and is configured to compare a first voltage level of a signal input to the first terminal with a second voltage level of a signal input to the second terminal;
   an upper-level DA conversion circuit including a plurality of capacitance elements electrically connected to the second terminal;
      wherein capacitive values of the plurality of capacitance elements are weighted by binary numbers;
   a level shift circuit including one or more capacitance elements electrically connected to the second terminal;
   a lower-level DA conversion circuit including a plurality of capacitance elements electrically connected to the second terminal; and
   a correction device,
   wherein the comparison circuit is configured to perform a successive approximation operation after the first signal is input to the first terminal and the second signal is held in the plurality of capacitance elements of the upper-level DA conversion circuit,
   the level shift circuit is configured to perform first level shift by shifting a voltage level of the second signal held in the plurality of capacitance elements of the upper-level DA conversion circuit to a first level after the successive approximation operation is performed,
   a signal having a voltage level that is based on a digital ramp signal is held in the plurality of capacitance elements of the upper-level DA conversion circuit and the plurality of capacitance elements of the lower-level DA conversion circuit and the comparison circuit is configured to perform a first comparison operation by comparing the first voltage level with the second voltage level after the first level shift is performed,
   the level shift circuit is configured to perform second level shift by shifting a voltage level of a third signal held in the plurality of capacitance elements of the upper-level DA conversion circuit to a second level after the third signal is input to the first terminal and is held in the plurality of capacitance elements of the upper-level DA conversion circuit, a signal having a voltage level that is based on the digital ramp signal is held in the plurality of capacitance elements of the upper-level DA conversion circuit and the plurality of capacitance elements of the lower-level DA conversion circuit and the comparison circuit is configured to perform a second comparison operation by comparing the first voltage level with the second voltage level after the second level shift is performed, the level shift circuit is configured to perform third level shift by shifting a voltage level of a signal held in the plurality of capacitance elements of the upper-level DA conversion circuit to a third level different from the second level after the second comparison operation is performed, a signal having a voltage level that is based on the digital ramp signal is held in the plurality of capacitance elements of the upper-level DA conversion circuit and the plurality of capacitance elements of the lower-level DA conversion circuit and the comparison circuit is configured to perform a third comparison operation by comparing the first voltage level with the second voltage level after the third level shift is performed, and the correction device is configured to correct first digital data generated through the first comparison operation on the basis of second digital data generated through the second comparison operation and third digital data generated through the third comparison operation.

2. The AD conversion device according to claim 1, wherein the one or more capacitance elements of the level shift circuit include a first capacitance element and a second capacitance element, the level shift circuit is configured to perform the second level shift by changing a voltage level of the first capacitance element, and the level shift circuit is configured to perform the third level shift by changing a voltage level of the second capacitance element.

3. The AD conversion device according to claim 2, wherein upper-level data included in the digital data are generated when the successive approximation operation is performed, the upper-level data including data of multiple bits, lower-level data included in the digital data are generated when the first comparison operation is performed, the lower-level data including data of multiple bits, a capacitance value of the second capacitance element is almost the same as a capacitance value of the third capacitance element included in the plurality of capacitance elements of the upper-level DA conversion circuit, and the third capacitance element is used for generating data of the lowest-level bit of the upper-level data.

4. The AD conversion device according to claim 2, wherein upper-level data included in the digital data are generated when the successive approximation operation is performed, the upper-level data including data of multiple bits, lower-level data included in the digital data are generated when the first comparison operation is performed, the lower-level data including data of multiple bits, the second capacitance element is a third capacitance element included in the plurality of capacitance elements of the upper-level DA conversion circuit, and the third capacitance element is used for generating data of the lowest-level bit of the upper-level data.

5. The AD conversion device according to claim 2, wherein upper-level data included in the digital data are generated when the successive approximation operation is performed, the upper-level data including data of multiple bits, lower-level data included in the digital data are generated when the first comparison operation is performed, the lower-level data including data of multiple bits, and a capacitance value of the first capacitance element is almost the same as a capacitance value of a fourth capacitance element included in the plurality of capacitance elements of the upper-level DA conversion circuit.

6. The AD conversion device according to claim 2, wherein upper-level data included in the digital data are generated when the successive approximation operation is performed, the upper-level data including data of multiple bits, lower-level data included in the digital data are generated when the first comparison operation is performed, the lower-level data including data of multiple bits, and the first capacitance element is a fourth capacitance element included in the plurality of capacitance elements of the upper-level DA conversion circuit.

7. The AD conversion device according to claim 1, wherein the second level is the minimum value of a range in which the first level varies, and the third level is the maximum value of the range.

8. The AD conversion device according to claim 1, wherein the second level is the maximum value of a range in which the first level varies, and the third level is the minimum value of the range.

9. The AD conversion device according to claim 1, wherein the level shift circuit is configured to perform the second level shift and the third level shift without the successive approximation operation being performed after the third signal is input to the first terminal and is held in the plurality of capacitance elements of the upper-level DA conversion circuit.

10. The AD conversion device according to claim 1, wherein the correction device is configured to correct the first digital data on the basis of a position of the first digital data in a range specified by the second digital data and the third digital data.

11. An imaging device, comprising:
the AD conversion device according to claim 1;
an imaging unit including a plurality of pixels disposed in a matrix shape, each pixel included in the plurality of pixels being configured to output a first pixel signal having a reset level and a second pixel signal having a signal level; and
a column circuit that is disposed so as to correspond to one or more columns in an array of the plurality of pixels, is electrically connected to the imaging unit, and is configured to generate the first signal that is based on the first pixel signal and generate the second signal that is based on the second pixel signal.

12. An imaging device, comprising:
the AD conversion device according to claim 1;
an imaging unit including a plurality of pixels disposed in a matrix shape, each pixel included in the plurality of pixels being configured to output a first pixel signal having a reset level and a second pixel signal having a signal level;

a column circuit that is disposed so as to correspond to one or more columns in an array of the plurality of pixels, is electrically connected to the imaging unit, and is configured to generate the second signal that is based on a difference between the reset level and the signal level; and a signal generation circuit configured to generate the first signal having a predetermined voltage level.

13. The imaging device according to claim 11, wherein the level shift circuit is configured to perform the second level shift in a blanking period that is different from a period in which the first pixel signal is output from the imaging unit and is different from a period in which the second pixel signal is output from the imaging unit, the comparison circuit is configured to perform the second comparison operation in the blanking period, the level shift circuit is configured to perform the third level shift in the blanking period, and the comparison circuit is configured to perform the third comparison operation in the blanking period.

14. The imaging device according to claim 12, wherein the level shift circuit is configured to perform the second level shift in a blanking period that is different from a period in which the first pixel signal is output from the imaging unit and is different from a period in which the second pixel signal is output from the imaging unit, the comparison circuit is configured to perform the second comparison operation in the blanking period, the level shift circuit is configured to perform the third level shift in the blanking period, and the comparison circuit is configured to perform the third comparison operation in the blanking period.

15. An endoscope system comprising the imaging device according to claim 11.

16. An AD conversion method executed by an AD conversion device configured to generate digital data on the basis of a difference between a voltage level of a first signal and a voltage level of a second signal, the AD conversion method comprising a first step, a second step, a third step, a fourth step, a fifth step, a sixth step, a seventh step, and an eighth step, wherein the AD conversion device includes:
 a comparison circuit that includes a first terminal and a second terminal and is configured to compare a first voltage level of a signal input to the first terminal with a second voltage level of a signal input to the second terminal;
 an upper-level DA conversion circuit including a plurality of capacitance elements electrically connected to the second terminal,
  wherein capacitive values of the plurality of capacitance elements are weighted by binary numbers;
 a level shift circuit including one or more capacitance elements electrically connected to the second terminal;
 a lower-level DA conversion circuit including a plurality of capacitance elements electrically connected to the second terminal; and
 a correction device, the comparison circuit performs a successive approximation operation in the first step after the first signal is input to the first terminal and the second signal is held in the plurality of capacitance elements of the upper-level DA conversion circuit, the level shift circuit performs first level shift by shifting a voltage level of the second signal held in the plurality of capacitance elements of the upper-level DA conversion circuit to a first level in the second step after the successive approximation operation is performed, a signal having a voltage level that is based on a digital ramp signal is held in the plurality of capacitance elements of the upper-level DA conversion circuit and the plurality of capacitance elements of the lower-level DA conversion circuit and the comparison circuit performs a first comparison operation by comparing the first voltage level with the second voltage level in the third step after the first level shift is performed, the level shift circuit performs second level shift by shifting a voltage level of a third signal held in the plurality of capacitance elements of the upper-level DA conversion circuit to a second level in the fourth step after the third signal is input to the first terminal and is held in the plurality of capacitance elements of the upper-level DA conversion circuit, a signal having a voltage level that is based on the digital ramp signal is held in the plurality of capacitance elements of the upper-level DA conversion circuit and the plurality of capacitance elements of the lower-level DA conversion circuit and the comparison circuit performs a second comparison operation by comparing the first voltage level with the second voltage level in the fifth step after the second level shift is performed, the level shift circuit performs third level shift by shifting a voltage level of a signal held in the plurality of capacitance elements of the upper-level DA conversion circuit to a third level different from the second level in the sixth step after the second comparison operation is performed, a signal having a voltage level that is based on the digital ramp signal is held in the plurality of capacitance elements of the upper-level DA conversion circuit and the plurality of capacitance elements of the lower-level DA conversion circuit and the comparison circuit performs a third comparison operation by comparing the first voltage level with the second voltage level in the seventh step after the third level shift is performed, and the correction device corrects first digital data generated through the first comparison operation in the eighth step on the basis of second digital data generated through the second comparison operation and third digital data generated through the third comparison operation.

* * * * *